(12) United States Patent
Chang et al.

(10) Patent No.: US 12,391,879 B2
(45) Date of Patent: Aug. 19, 2025

(54) QUANTUM DOT-CONTAINING COMPLEX, INK COMPOSITION INCLUDING THE SAME, LIGHT-EMITTING DEVICE INCLUDING THE SAME, AND ELECTRONIC APPARATUS INCLUDING THE SAME

(71) Applicant: Samsung Display Co., Ltd., Yongin-si (KR)

(72) Inventors: Jaebok Chang, Yongin-si (KR); Kyungsig Lee, Yongin-si (KR); Seunghee Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 374 days.

(21) Appl. No.: 17/988,630

(22) Filed: Nov. 16, 2022

(65) Prior Publication Data

US 2023/0193129 A1 Jun. 22, 2023

(30) Foreign Application Priority Data

Dec. 16, 2021 (KR) .......................... 10-2021-0181030

(51) Int. Cl.
| | |
|---|---|
| *C09K 11/88* | (2006.01) |
| *B82Y 20/00* | (2011.01) |
| *C09D 5/22* | (2006.01) |
| *C09K 11/02* | (2006.01) |
| *H10H 20/851* | (2025.01) |
| *H10K 50/115* | (2023.01) |

(52) U.S. Cl.
CPC .............. *C09K 11/883* (2013.01); *C09D 5/22* (2013.01); *C09K 11/02* (2013.01); *H10H 20/8512* (2025.01); *H10K 50/115* (2023.02); *B82Y 20/00* (2013.01)

(58) Field of Classification Search
CPC .. C09K 11/02; C09K 11/883; H10H 20/8512; C09D 5/22; H10K 50/115
See application file for complete search history.

(56) References Cited

U.S. PATENT DOCUMENTS

| 10,688,125 B2 | 6/2020 | Golding et al. |
| 11,041,071 B2 | 6/2021 | Tangirala et al. |
| 2021/0066631 A1 | 3/2021 | Choi et al. |

FOREIGN PATENT DOCUMENTS

| CN | 111849483 A | 10/2020 |
| KR | 10-2020-0041937 A | 4/2020 |
| KR | 10-2021-0027604 A | 3/2021 |

OTHER PUBLICATIONS

Takaaki Tomai et al., "Solvent accommodation effect on dispersibility of metal oxide nanoparticle with chemisorbed organic shell", Journal of Colloid and Interface Science, Apr. 2021, pp. 574-580, vol. 587, Elsevier Inc.

*Primary Examiner* — C Melissa Koslow
(74) *Attorney, Agent, or Firm* — Womble Bond Dickinson (US) LLP

(57) ABSTRACT

A quantum-dot containing complex includes: a first ligand, which is a hydrocarbon compound including a hydrophilic moiety and a lipophilic moiety and has an aspect ratio of 5 or more; and a second ligand, which is a hydrocarbon compound including a hydrophilic moiety and a lipophilic moiety and has an aspect ratio of 4 or less, wherein the hydrophile-lipophile balances (HLBs) of the first ligand and the second ligand are each independently 7 or more.

20 Claims, 2 Drawing Sheets

QUANTUM DOT-CONTAINING COMPLEX, INK COMPOSITION INCLUDING THE SAME, LIGHT-EMITTING DEVICE INCLUDING THE SAME, AND ELECTRONIC APPARATUS INCLUDING THE SAME

CROSS-REFERENCE TO RELATED APPLICATION

This application claims priority to and the benefit of Korean Patent Application No. 10-2021-0181030, filed on Dec. 16, 2021, in the Korean Intellectual Property Office, the disclosure of which is incorporated by reference herein in its entirety.

BACKGROUND

1. Field

One or more embodiments relate to a quantum dot-containing complex, an ink composition including the same, a light-emitting device including the same, and an electronic apparatus including the same.

2. Description of the Related Art

Quantum dots are nanocrystals of semiconductor materials and exhibit a quantum confinement effect. When quantum dots receive light from an excitation source and reach an energy excited state, they emit energy corresponding to their own energy band gap. In this regard, even in substantially the same material, the wavelength varies according to the particle size, and accordingly, by adjusting the size of quantum dots, light of a desirable or suitable wavelength range may be obtained, and excellent or suitable color purity and high luminescence efficiency may be obtained. Thus, quantum dots may be applied to one or more suitable devices.

By adjusting the particle size of quantum dots, the quantum dots may realize (e.g., emit) one or more suitable colors and have excellent or suitable luminescence characteristics due to the quantum confinement effect.

In addition, a quantum dot can be utilized as a material that performs one or more suitable optical functions (for example, a photo-conversion function) in optical members. Quantum dots, as nano-sized semiconductor nanocrystals, may have different energy band gaps by adjusting the size and/or composition of the nanocrystals, and thus may emit light of one or more suitable emission wavelengths.

Optical members including such quantum dots may have the form of a thin-film, for example, a thin film patterned according to subpixels. Such optical members may be utilized as a color conversion member of a device including one or more suitable light sources.

Quantum dot ink as a photoluminescent material may be prepared by, for example, directly dispersing quantum dots, which are light-converting materials, in a monomer, and in this case, dispersibility may become a problem.

SUMMARY

Aspects according to one or more embodiments are directed toward a quantum dot-containing complex with an improved absorption rate and improved light conversion efficiency, an ink composition including the same, a light-emitting device including the same, and an electronic apparatus including the same.

Additional aspects will be set forth in part in the description which follows and, in part, will be apparent from the description, or may be learned by practice of the presented embodiments of the disclosure.

According to one or more embodiments,
a quantum dot-containing complex includes a quantum dot, and
a first ligand and a second ligand, each coordinate (e.g., bound to) a surface of the quantum dot,
wherein the first ligand is a hydrocarbon compound including a hydrophilic moiety and a lipophilic moiety and has an aspect ratio of 5 or greater,
the second ligand is a hydrocarbon compound including a hydrophilic moiety and a lipophilic moiety and has an aspect ratio of 4 or less, and
a hydrophile-lipophile balance (HLB) of the first ligand and an HLB of the second ligand may each independently be 7 or greater.

Aspect ratio=ligand length/ligand width
Davies' Equation $$HLB = 7 + \sum_{i=1}^{m} H_i - n \times 0.475$$

In the Davies' Equation above,
m=number of hydrophilic moieties in a ligand molecule,
$H_i$=coefficient of $i^{th}$ hydrophilic moiety, and
n=number of lipophilic moieties in the ligand molecule.

According to one or more embodiments, an ink composition includes the quantum dot-containing complex, a monomer, a scatterer, and an initiator.

According to one or more embodiments,
a light-emitting device includes a first electrode,
a second electrode facing the first electrode, and
an interlayer between the first electrode and the second electrode and including an emission layer,
the emission layer includes the quantum dot-containing complex.

According to one or more embodiments,
an electronic apparatus includes the quantum dot-containing complex.

BRIEF DESCRIPTION OF THE DRAWINGS

The above and other aspects, features, and enhancements of certain embodiments of the disclosure will be more apparent from the following description taken in conjunction with the accompanying drawings, in which.

DETAILED DESCRIPTION

Figure 1:
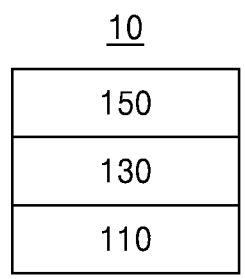
FIG. 1 is a schematic cross-sectional view of a structure of a light-emitting device according to an embodiment.

Reference will now be made in more detail to embodiments, examples of which are illustrated in the accompanying drawings, wherein like reference numerals refer to like elements throughout the specification, and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Throughout the disclosure, the expression "at least one of a, b or c" indicates only a, only b, only c, both (e.g., simultaneously) a and b, both (e.g., simultaneously) a and c, both (e.g., simultaneously) b and c, all of a, b, and c, or variation(s) thereof.

Quantum Dot-Containing Complex

A quantum dot-containing complex according to one or more embodiments includes:
  a quantum dot; and
  a first ligand and a second ligand, each coordinate (e.g., bound to) a surface of the quantum dot,
    wherein the first ligand, as a hydrocarbon compound including a hydrophilic moiety and a lipophilic moiety, may have an aspect ratio (defined below) of 5 or greater,
    the second ligand, as a hydrocarbon compound including a hydrophilic moiety and a lipophilic moiety, may have an aspect ratio of 4 or less, and
    hydrophile-lipophile balances (HLBs) (defined below by Davies' Equation) of the first ligand and the second ligand may each independently be 7 or greater.

Aspect ratio=ligand length/ligand width

Davies' Equation $$HLB = 7 + \sum_{i=1}^{m} H_i - n \times 0.475$$

wherein in Davies' Equation above,
m=number of hydrophilic moieties in a ligand molecule
$H_i$=coefficient of $i^{th}$ hydrophilic moiety
n=number of lipophilic moieties in the ligand molecule.

The first ligand has a more rod-like shape than the second ligand, and when expressed numerically, may have an aspect ratio of 5 or greater. In an embodiment, the aspect ratio of the first ligand may be in a range of 5 to 20.

The second ligand has a more sphere-like shape than the first ligand, and when expressed numerically, may have an aspect ratio of 4 or less. In an embodiment, the aspect ratio of the second ligand may be in a range of 1 to 4.

The first ligand and the second ligand, as hydrocarbon compounds, each include carbon and hydrogen, but may further include a hydrophilic moiety and a lipophilic moiety that include elements other than carbon and hydrogen. Therefore, the first ligand and the second ligand are hydrocarbon compounds, and may each further include, for example, oxygen, nitrogen, sulfur, etc. in addition to carbon and hydrogen.

The first ligand and the second ligand coordinate (e.g., bound to) a surface of the quantum dot, and the quantum dot-containing complex according to an embodiment of the disclosure, which is coordinated with the first and second ligands having the respective aspect ratios, has improved dispersibility.

Davies (in Davies' Equation) has defined an HLB value as 7 plus total sum of coefficients of all hydrophilic moiety (H coefficients) minus total sum of coefficients of all lipophilic moiety (H coefficients).

In an embodiment, the hydrophilic moiety may include —$SO_4^-Na^+$, —$COO^-K^+$, —$COO^-Na^+$, tertiary amine, —COOH, —OH, —O—, =O, or any combination thereof.

A coefficient of the hydrophilic moiety, —$SO_4^-Na^+$, is 38.7, a coefficient of the hydrophilic moiety, —$COO^-K^+$, is 21.1, a coefficient of the hydrophilic moiety, —$COO^-Na^+$, is 19.1, a coefficient of the hydrophilic moiety, tertiary amine, is 9.4, a coefficient of the hydrophilic moiety, —COOH, is 2.1, a coefficient of the hydrophilic moiety, —OH, is 1.9, and a coefficient of each of the hydrophilic moieties, —O— and =O, is 1.3.

In an embodiment, the lipophilic moiety may include
[[—CH—]]

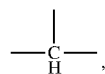

—$CH_2$—, $CH_3$—, =CH—, =$CH_2$, or any combination thereof.

A coefficient of each of the lipophilic moieties,
[[—CH—]]

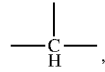

—$CH_2$—, $CH_3$—, =CH—, and =$CH_2$, is 0.475.

In a case where HLB values of the first ligand and the second ligand are each independently 7 or greater, for example, when the quantum dot-containing complex is dispersed in a hydrophilic monomer, dispersibility is good or suitable. In an embodiment, HLB values of the first ligand and the second ligand may each independently be in a range of 7 to 18.

In an embodiment, a COOH moiety may be included in the first ligand at a terminus (e.g., terminal end) of the first ligand, and a COOH moiety may be included in the second ligand at a terminus (e.g., terminal end) of the second ligand. In an embodiment, the first ligand and the second ligand may be coordinated to the quantum dot via the COOH group at each of the termini (e.g., terminal end) thereof.

In an embodiment, the first ligand may include two or more ethylene glycol moieties ($OCH_2CH_2O$). When the first ligand includes, for example, two or more ethylene glycol moieties ($OCH_2CH_2O$), the first ligand may have an aspect ratio of 5 or greater and an HLB of 7 or greater.

In an embodiment, the first ligand may be 2,5,8,11,14-pentaoxaheptadecan-17-oic acid.

In an embodiment, the second ligand may be mono-2-(acryloyloxy)ethyl succinate.

In an embodiment, a ratio of a weight of the first ligand to a weight of the second ligand (e.g., a weight ratio between the first ligand and the second ligand) may be in a range of 5:4 to 1:8. When the first ligand increases in weight (e.g., when an amount of the first ligand in weight is increased), resulting in the ratio of the first ligand to the second ligand to be greater than the ratio of 5:4 (for example, a weight ratio of the first ligand to the second ligand is 6:4), light conversion efficiency of the quantum dot-containing complex may be greatly reduced. When the second ligand increases in weight (e.g., when an amount of the second ligand in weight is increased), resulting in the ratio of the first ligand to the second ligand to be lower than the ratio of 1:8 (for example, a ratio of the first ligand to the second ligand is 1:8.5), an absorption rate and light conversion efficiency of the quantum-dot containing complex is reduced.

In an embodiment, a ratio of a weight of the quantum dot to a total weight of the first ligand and the second ligand may be in a range of 10:1 to 10:4. When the total weight of the first ligand and the second ligand decreases, resulting in the ratio of the weight of the quantum dot to the total weight of the first ligand and the second ligand to be greater than the ratio of 10:1 (for example, a ratio of the weight of the quantum dot to the total weight of the first ligand and the second ligand is 10:0.5), the quantum dot may not be sufficiently coordinated by the ligands, resulting in a decrease in an absorption rate and light conversion efficiency of the quantum dot-containing complex. When the total weight of the first ligand and the second ligand increases, resulting in the ratio of the weight of the quantum dot to the total weight of the first ligand and the second ligand to be lower than the ratio of 10:4 (for example, a ratio of the weight of the quantum dot to the total weight of the first ligand and the second ligand is 10:5), a ligand (e.g., an excess ligand) that has not coordinated (e.g., bound to) the quantum dot may bring undesirable or bad effects, and as a result, an absorption rate and light conversion efficiency of the quantum dot-containing complex may be reduced.

A quantum dot is a spherical or substantially spherical semiconductor nanomaterial having a size of several to several hundreds of nm, and may include a core including a material having a small band gap and a shell around (e.g., surrounding) the core.

In an embodiment, the quantum dot may have a core-shell structure or may be a perovskite compound. The core-shell structure may include: a core including a crystal of a first semiconductor; and a shell including a crystal of a second semiconductor.

In an embodiment, the first semiconductor and the second semiconductor may each independently include a Group 12-Group 16-based compound, a Group 13-Group 15-based compound, a Group 14-Group 16-based compound, a Group 14-based compound, a Group 11-Group 13-Group 16-based compound, a Group 11-Group 12-Group 13-Group 16-based compound, or any combination thereof. As used herein, the term "Group" followed by a number such as in "Group 12" refers to the Group with that number in the periodic table of elements (e.g., Group 12 in the periodic table of elements).

In an embodiment, the first semiconductor and the second semiconductor may each independently include:

CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe, CdZnSeS, CdZn-SeTe, CdZnSTe, CdHgSeS, CdHgSeTe, CdHgSTe, HgZnSeS, HgZnSeTe, or HgZnSTe;

GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, GaAl-NAs, GaAlNSb, GaAlPAs, GaAlPSb, GaInNP, GaIn-NAs, GaInNSb, GaInPAs, GaInPSb, InAlNP, InAlNAs, InAlNSb, InAlPAs, InAlPSb, or InZnP;

SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, or SnPbSTe;

Si, Ge, SiC, or SiGe;

AgInS, AgInS$_2$, CuInS, CuInS$_2$, CuGaO$_2$, AgGaO$_2$, or AgAlO$_2$;

or any combination thereof.

In an embodiment, the first semiconductor may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP GaAlNAs, GaAlNSb, GaAl-PAs, GaAlPSb, GaInNP, GaInNAs, GaInNSb, GaInPAs, GaInPSb, InAlNP, InAlNAs, InAlNSb, InAlPAs, InAlPSb, or any combination thereof, and the second semiconductor may include CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe, CdZnSeS, CdZnSeTe, CdZn-STe, CdHgSeS, CdHgSeTe, CdHgSTe, HgZnSeS, HgZn-SeTe, HgZnSTe, or any combination thereof.

The perovskite compound is a material having a three-dimensional crystal structure associated with the crystal structure of CaTiO$_3$.

In an embodiment, the perovskite compound may be represented by Formula 4:

$$[A][B_m][X]_3 \quad \text{Formula 4}$$

wherein, in Formula 4,

A is a monovalent organic-cation, a monovalent inorganic-cation, or any combination thereof, B is at least one divalent inorganic-cation, m is a real number satisfying 0<m≤1, and X is at least one monovalent anion.

An average particle diameter (D50) of the quantum dot may be in a range of about 2 nm to about 10 nm.

An average particle diameter (D50) of the quantum dot-containing complex may be in a range of about 40 nm to about 1,000 nm, for example, about 50 nm to about 1,000 nm, about 100 nm to about 500 nm, or about 100 nm to about 200 nm. When the average particle diameter of the quantum dot-containing complex satisfies the range described above, the quantum dot-containing complex may have an excellent or suitable dispersion degree while including a relatively large amount of quantum dots. That is, when the average particle diameter of the quantum dot-containing complex satisfies the range described above, a large quantity of quantum dots may be dispersed as the quantum dot-containing complex. The average particle diameter may be measured by, for example, a laser diffraction method. Because the laser diffraction method is well known, a description thereof will not be provided.

Description of FIG. 1

FIG. 1 is a schematic cross-sectional view of a light-emitting device 10 according to an embodiment of the disclosure. The light-emitting device 10 includes a first electrode 110, an interlayer 130, and a second electrode 150.

Hereinafter, the structure of the light-emitting device 10 according to an embodiment and a method of manufacturing the light-emitting device 10 will be described in connection with FIG. 1.

First Electrode 110

In FIG. 1, a substrate may be additionally located under the first electrode 110 and/or above the second electrode 150. As the substrate, a glass substrate or a plastic substrate may be utilized. In an embodiment, the substrate may be a flexible substrate, and may include plastics with excellent or suitable heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or one or more combinations thereof. In an embodiment, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or one or more combinations thereof may be utilized as a material for forming the first electrode 110.

The first electrode 110 may have a single-layered structure consisting of a single layer or a multilayer structure including a plurality of layers. In an embodiment, the first electrode 110 may have a three-layered structure of ITO/Ag/ITO.

Interlayer 130

The interlayer 130 may be located on the first electrode 110. The interlayer 130 may include an emission layer.

The interlayer 130 may further include a hole transport region between the first electrode 110 and the emission layer and an electron transport region between the emission layer and the second electrode 150.

The interlayer 130 may further include metal-containing compounds such as organometallic compounds, inorganic materials such as quantum dots, and/or the like, in addition to one or more suitable organic materials.

In one or more embodiments, the interlayer 130 may include, i) two or more emitting units sequentially stacked between the first electrode 110 and the second electrode 150, and ii) a charge generation layer located between two emitting units. When the interlayer 130 includes two or more emitting units and the charge generation layer as described above, the light-emitting device 10 may be a tandem light-emitting device.

Hole Transport Region in Interlayer 130

The hole transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, the constituting layers of each structure being stacked sequentially from the first electrode 110 in the respective stated order.

The hole transport region may include a compound represented by Formula 201, a compound represented by Formula 202, or any combination thereof:

$$R_{201}\text{——}(L_{201})_{xa1}\text{—}N\begin{subarray}{l}(L_{202})_{xa2}\text{-}R_{203}\\ (L_{203})_{xa3}\text{-}R_{203}\end{subarray}$$

Formula 201

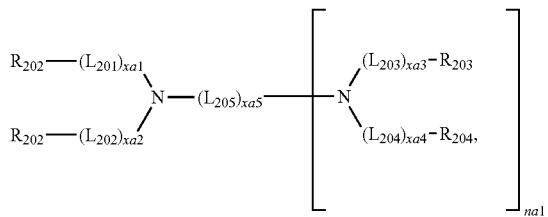

Formula 202 wherein, in Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (for example, Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, each of Formulae 201 and 202 may include at least one of the groups represented by Formulae CY201 to CY217.

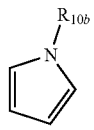

CY201

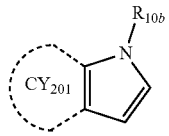

CY202

CY203

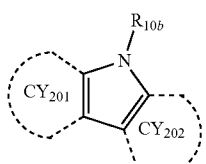

CY212

CY204

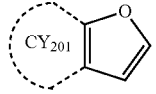

CY213

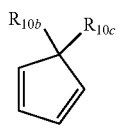

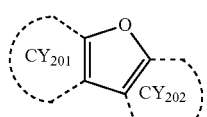

CY214

CY205

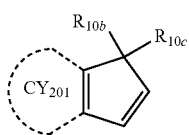

CY215

CY206

CY216

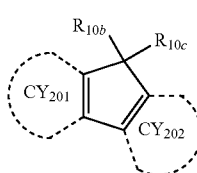

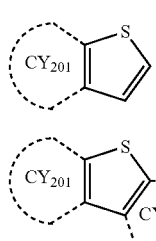

CY217

CY207

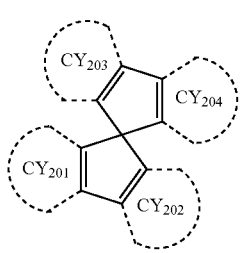

CY208

$R_{10b}$ and $R_{10c}$ in Formulae CY201 to CY217 may each independently be the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formulae CY201 to CY217 may be unsubstituted or substituted with $R_{10a}$ as described above.

In an embodiment, ring CY201 to ring CY204 in Formulae CY201 to CY217 may each independently be a benzene group, a naphthalene group, a phenanthrene group, or an anthracene group.

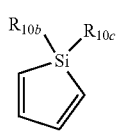

CY209

In an embodiment, each of Formulae 201 and 202 may include at least one of the groups represented by Formulae CY201 to CY203.

In an embodiment, Formula 201 may include at least one of the groups represented by Formulae CY201 to CY203 and at least one of the groups represented by Formulae CY204 to CY217.

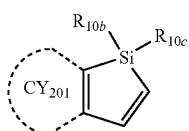

CY210

In an embodiment, xa1 in Formula 201 may be 1, $R_{201}$ may be a group represented by one of Formulae CY201 to CY203, xa2 may be 0, and $R_{202}$ may be a group represented by one of Formulae CY204 to CY207.

In an embodiment, each of Formulae 201 and 202 may not include (e.g., may exclude) any of the groups represented by Formulae CY201 to CY203.

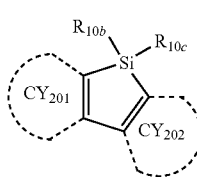

CY211

In an embodiment, each of Formulae 201 and 202 may not include (e.g., may exclude) any of the groups represented by Formulae CY201 to CY203, and may include at least one of the groups represented by Formulae CY204 to CY217.

In an embodiment, each of Formulae 201 and 202 may not include (e.g., may exclude) any of the groups represented by Formulae CY201 to CY217.

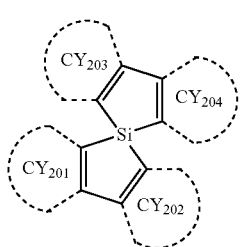

In an embodiment, the hole transport region may include at least one of compounds HT1 to HT46, m-MTDATA, TDATA, 2-TNATA, NPB(NPD), p-NPB, TPD, Spiro-TPD, Spiro-NPB, methylated NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:
HT1
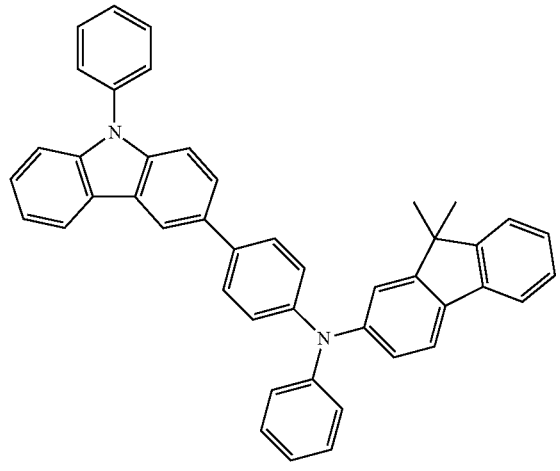
HT2
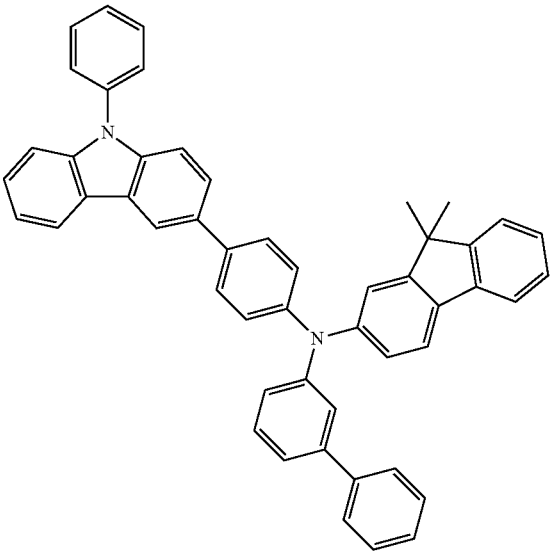
HT3
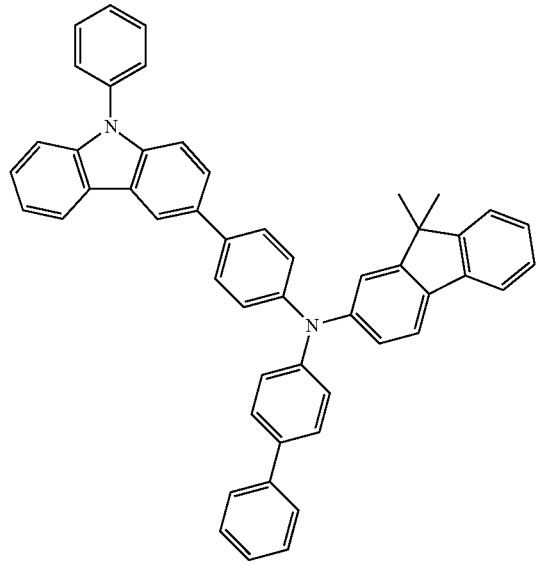
HT4
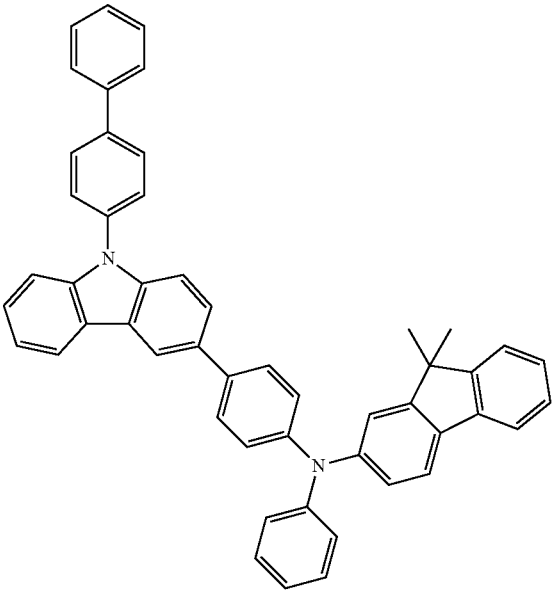

-continued
HT5
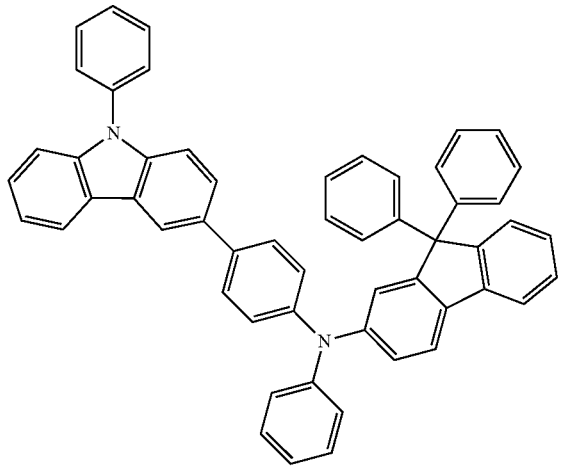
HT6
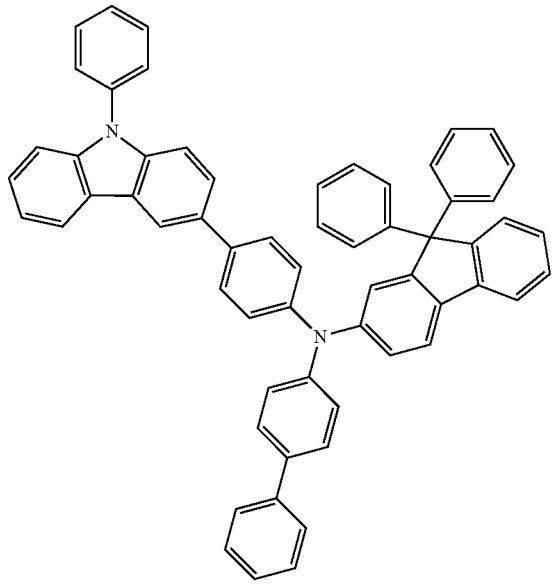
HT7
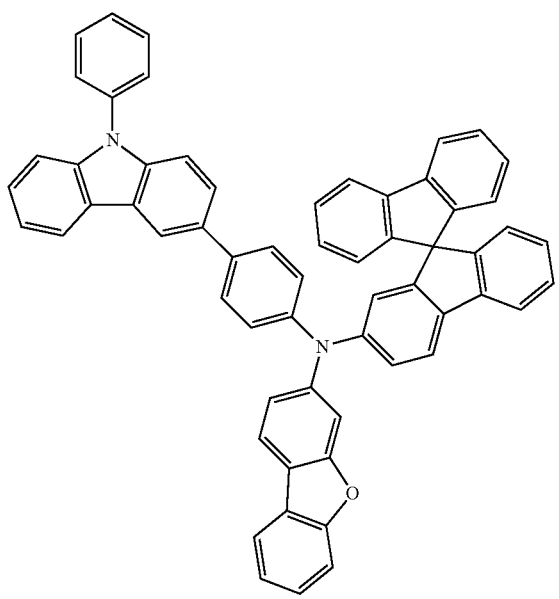
HT8
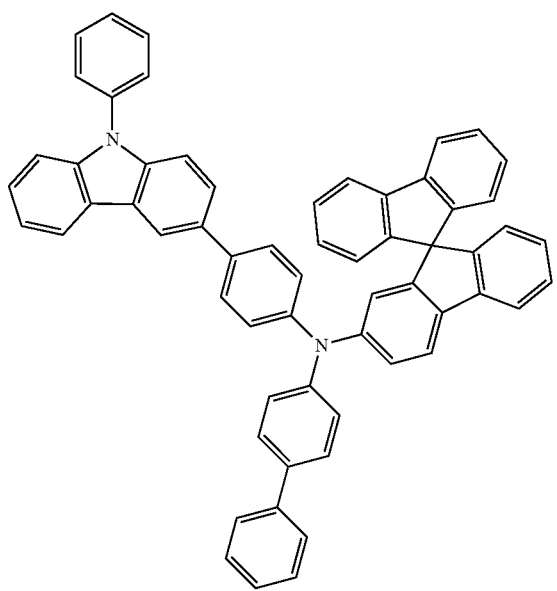

-continued
HT9
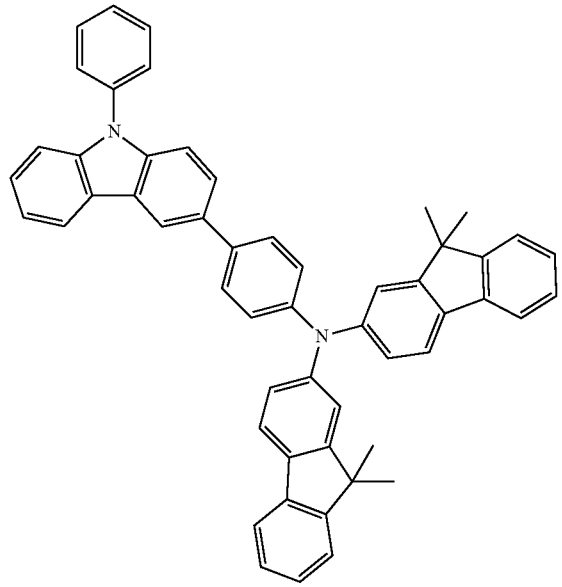
HT10
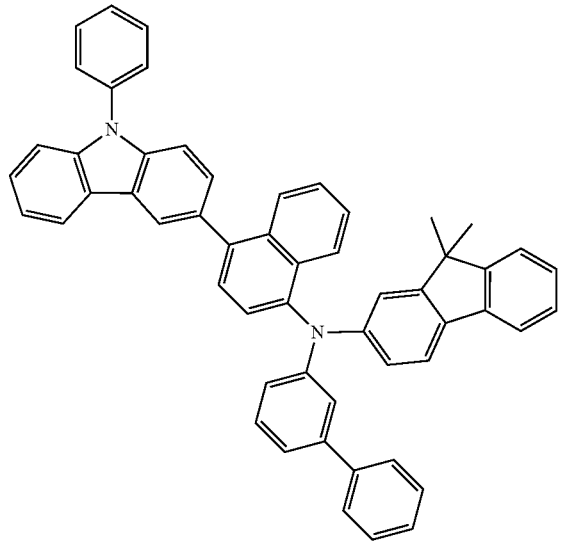
HT11
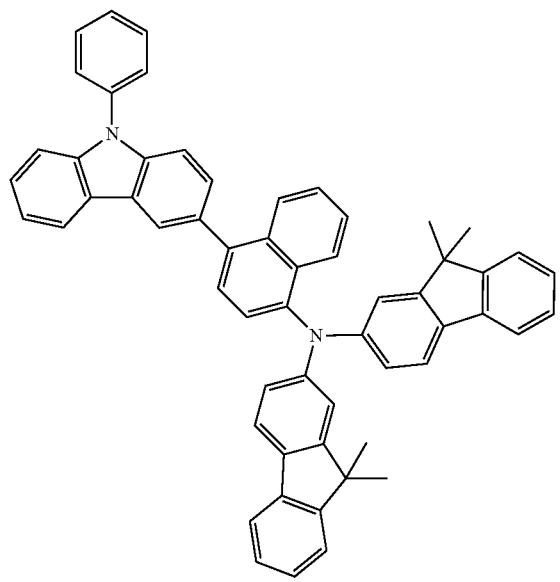
HT12
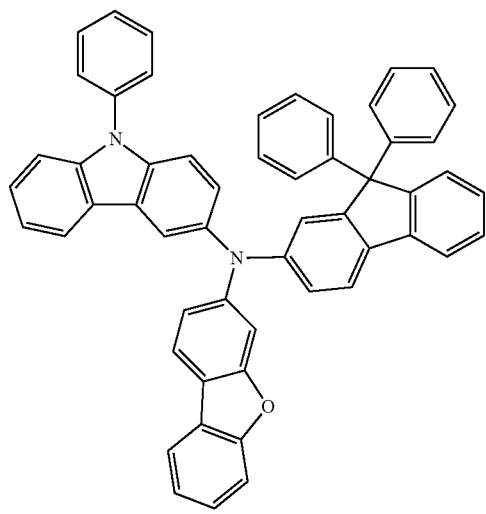

-continued
HT13
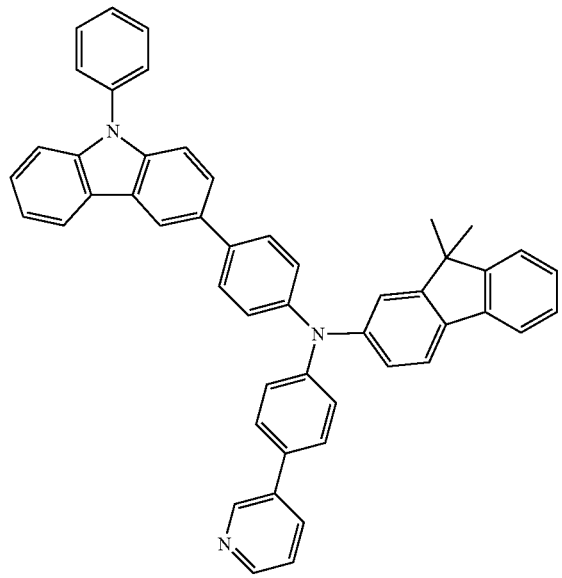
HT14
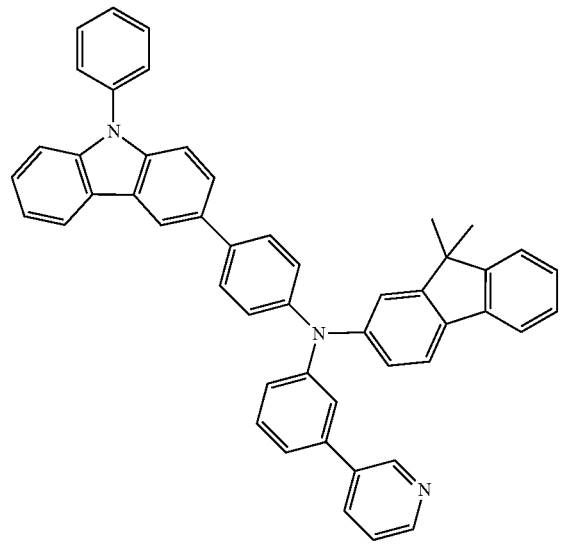
HT15
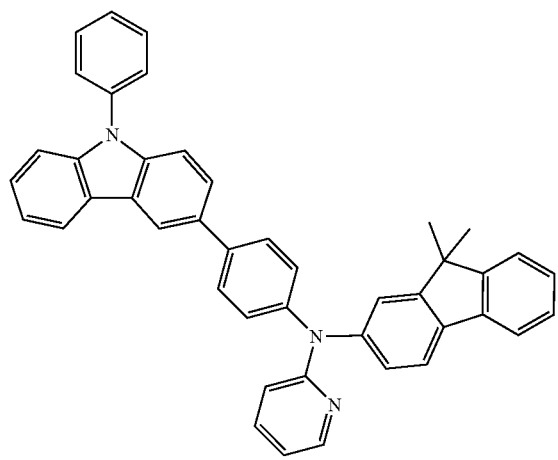
HT16
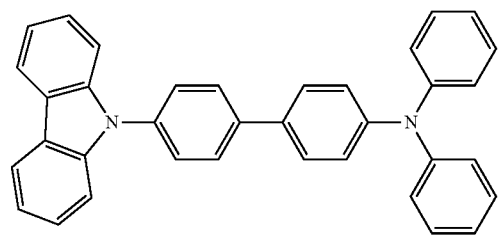
HT17
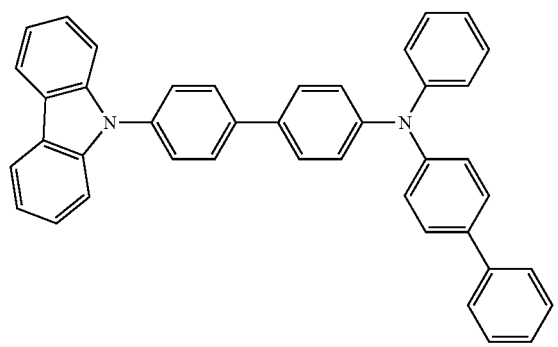
HT18
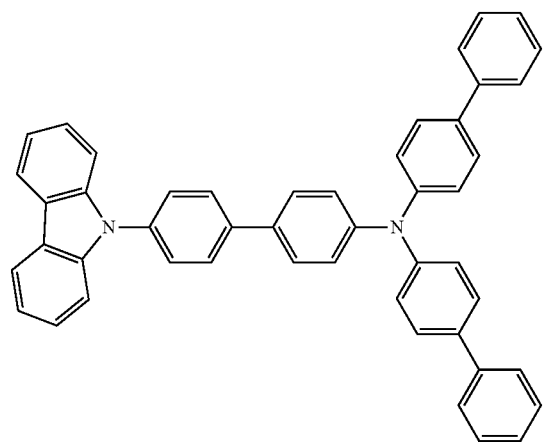

HT19
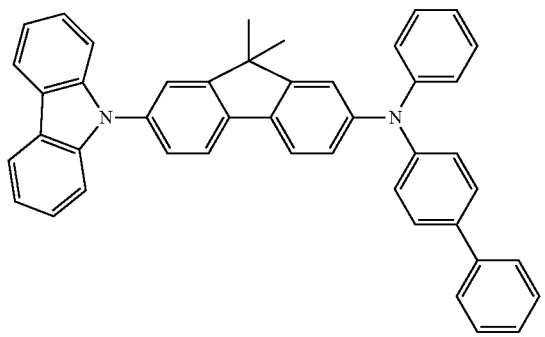
HT20
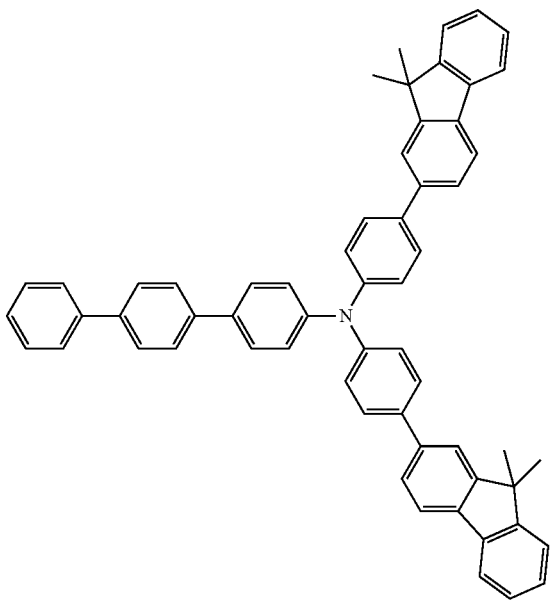
HT21
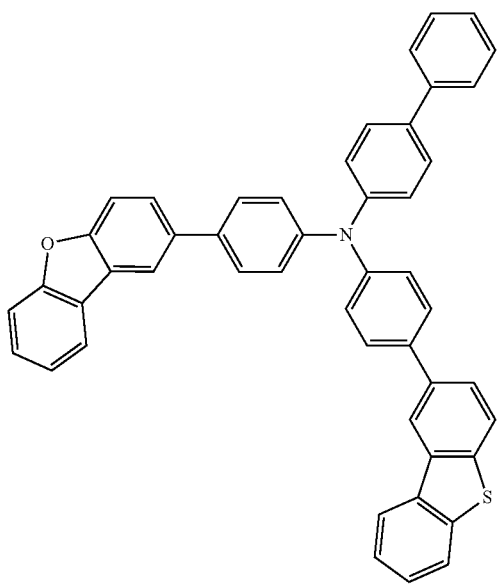
HT22
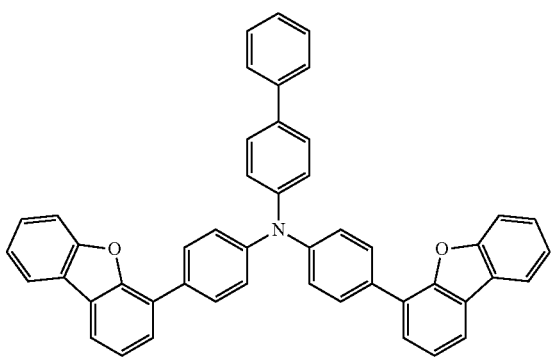

HT23
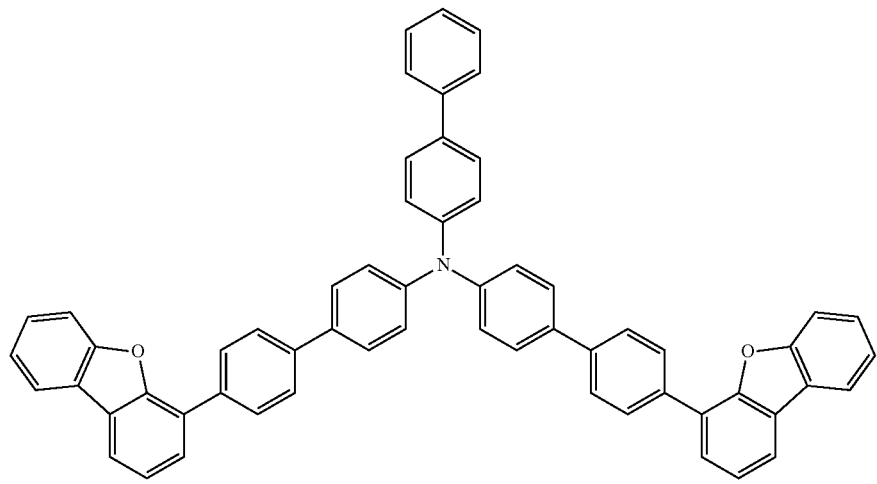
HT24
HT25
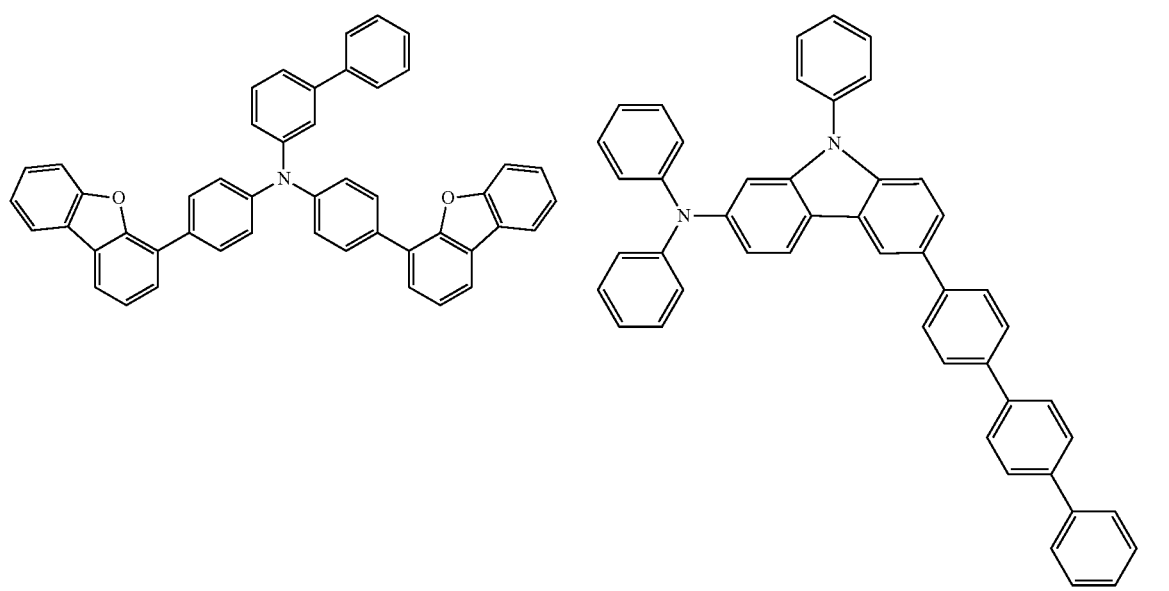
HT26
HT27
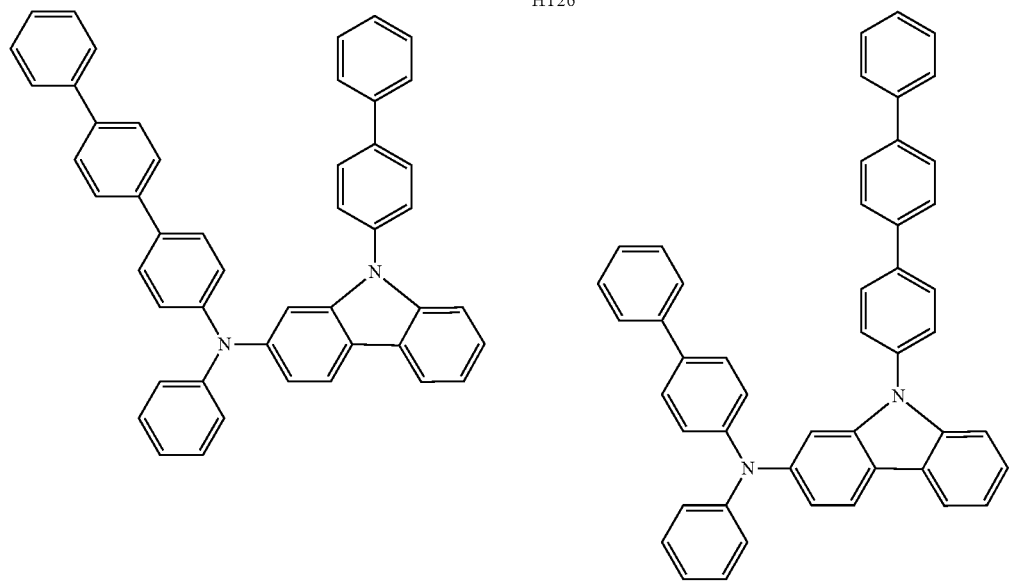

-continued
HT28
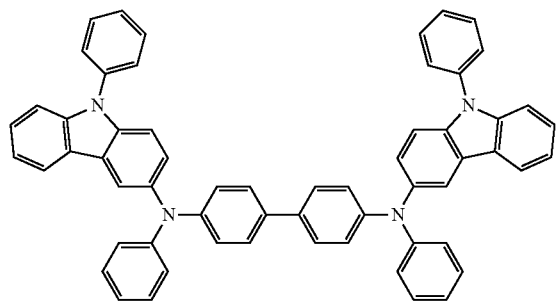
HT29
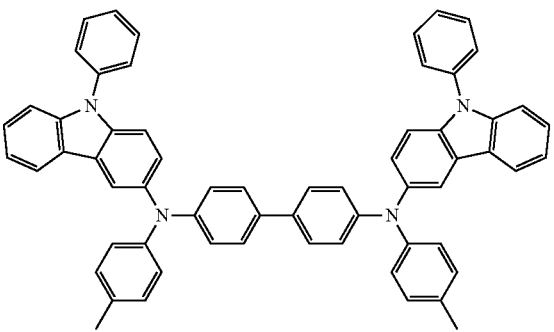
HT30
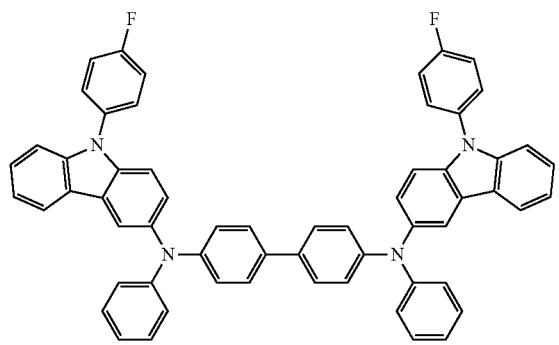
HT31
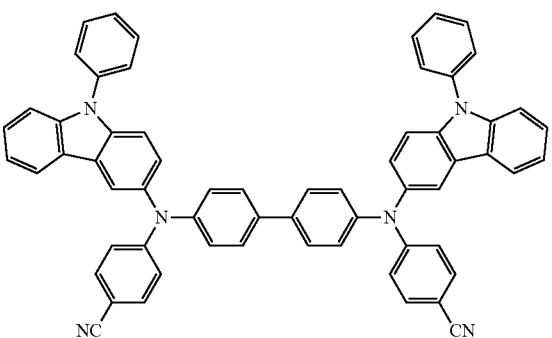
HT32
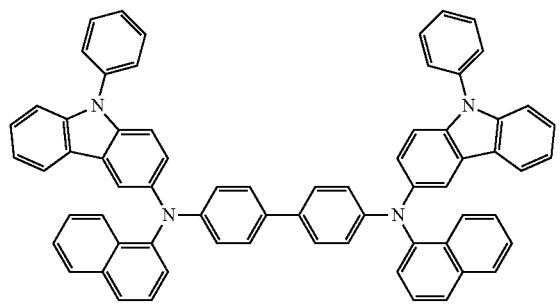
HT33
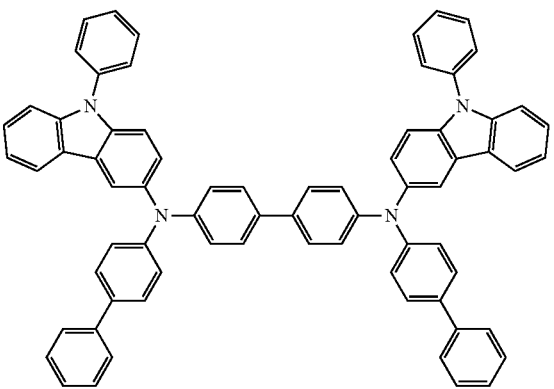

-continued
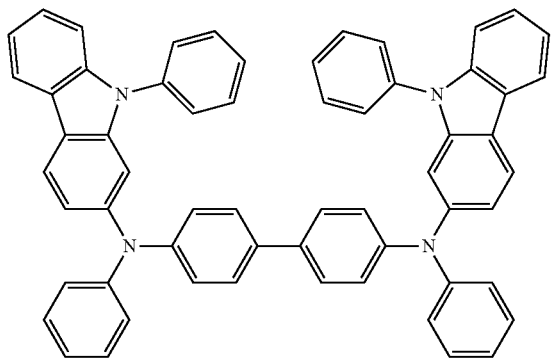
HT34
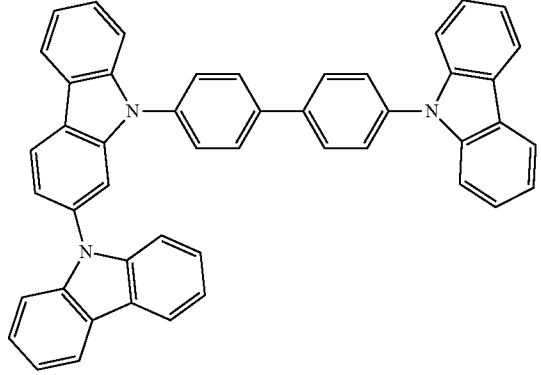
HT35
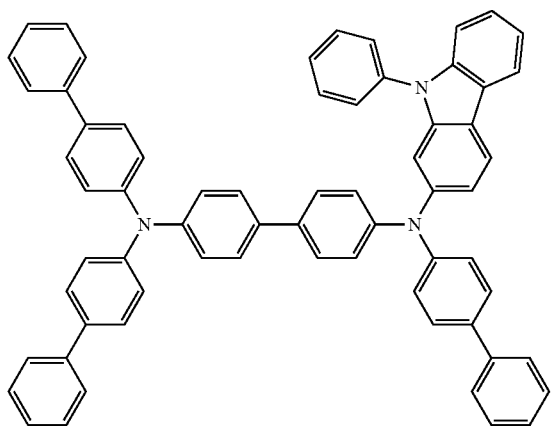
HT36
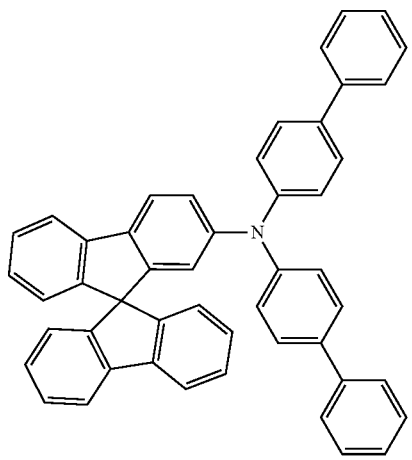
HT37
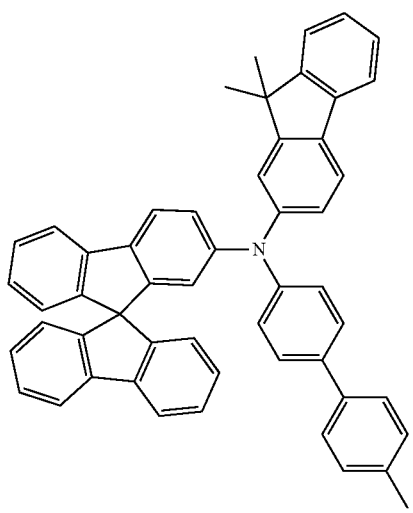
HT38
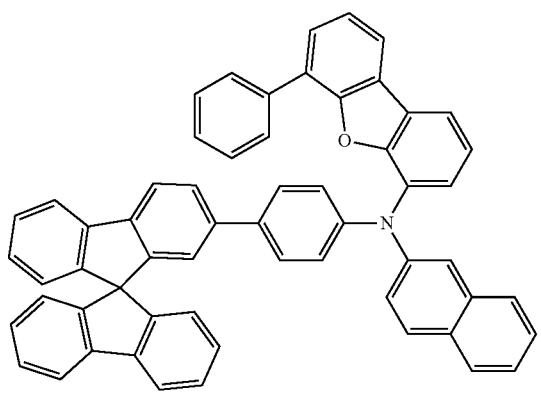
HT39

-continued
HT40
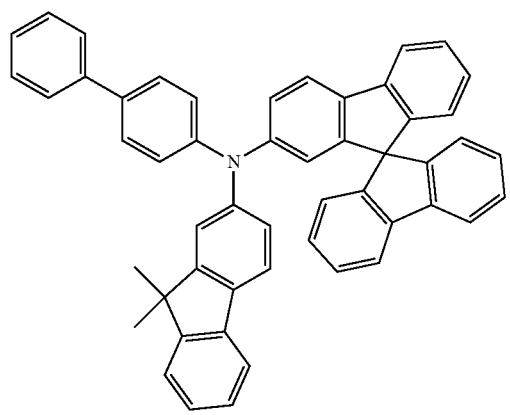
HT41
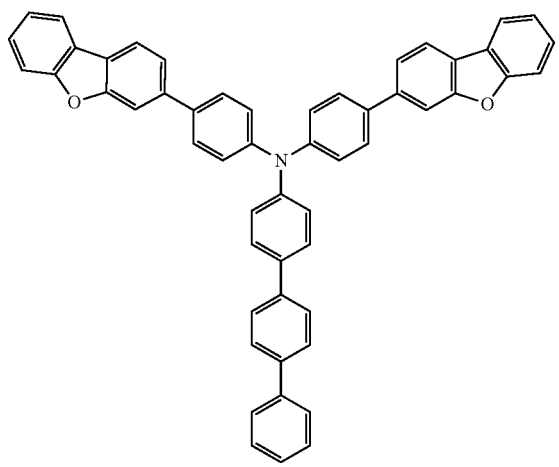
HT42
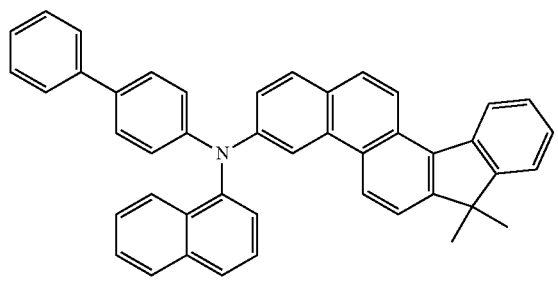
HT43
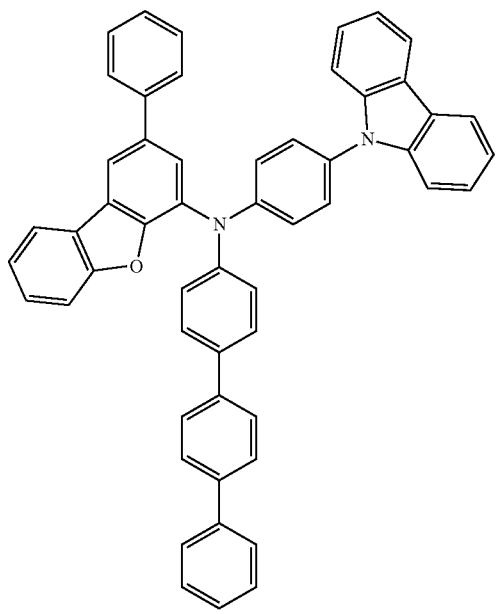
HT44
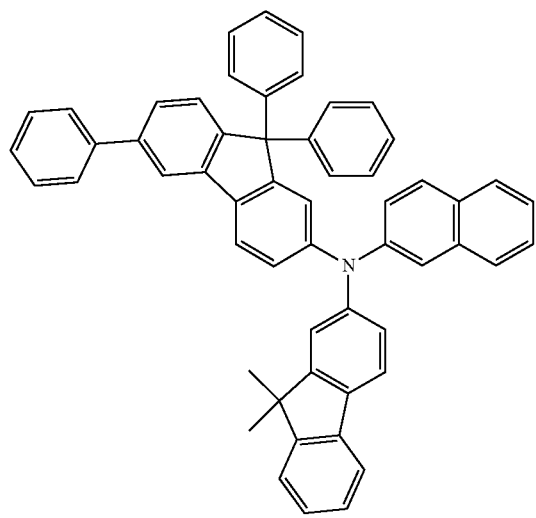
HT45
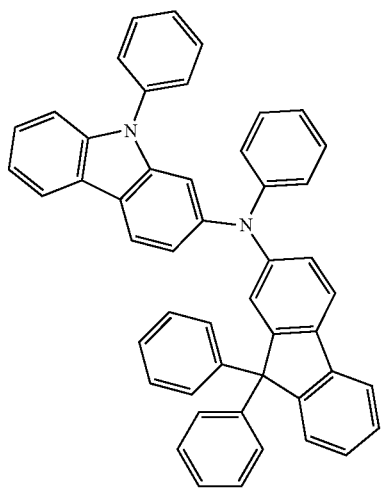

-continued
HT46
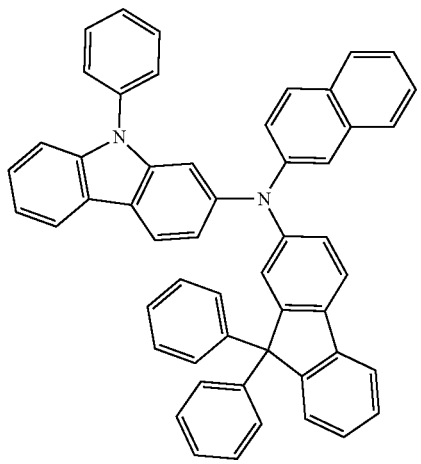
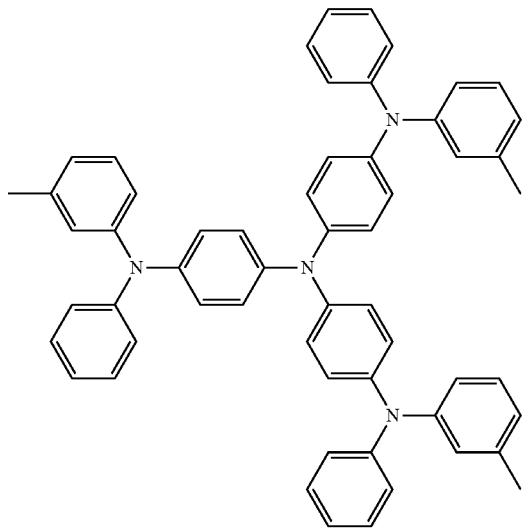
m-MTDATA
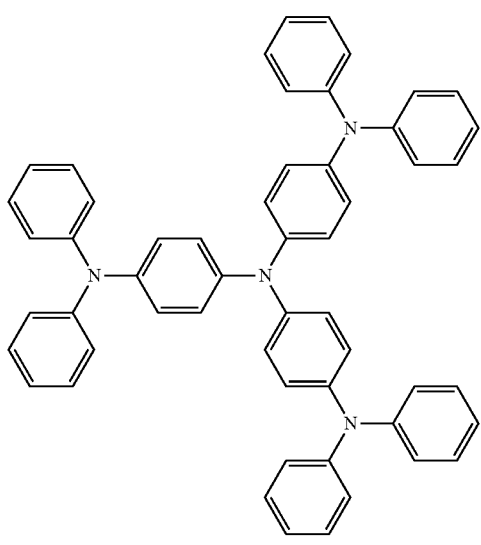
TDATA
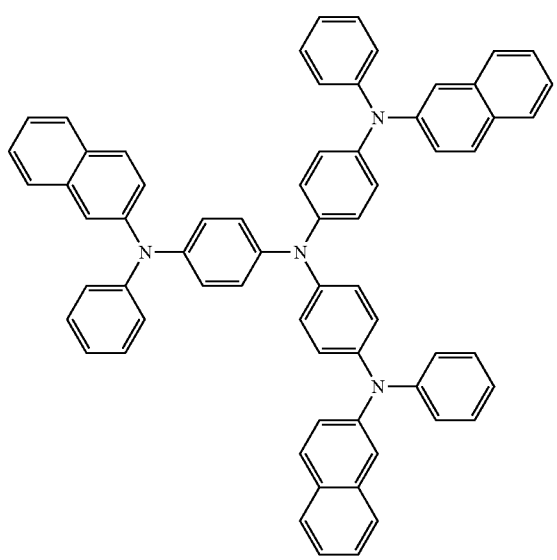
2-TNATA
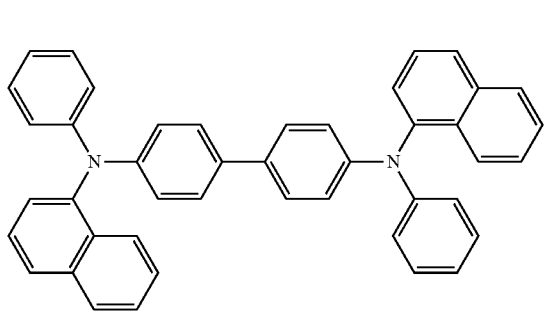
NPB
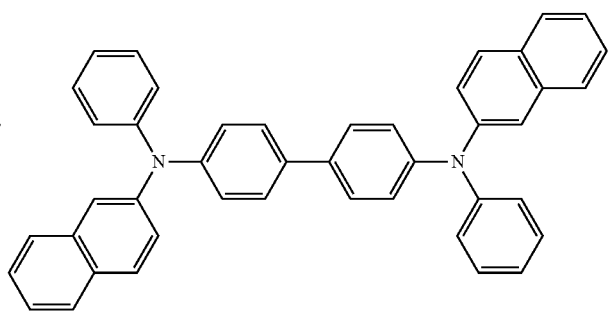
β-NPB

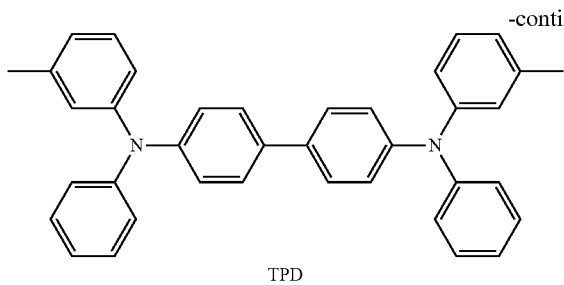

TPD

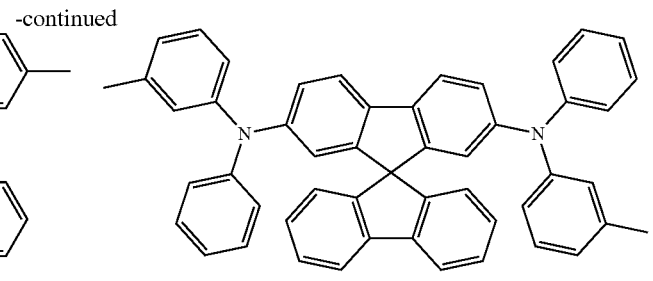

Spiro-TPD

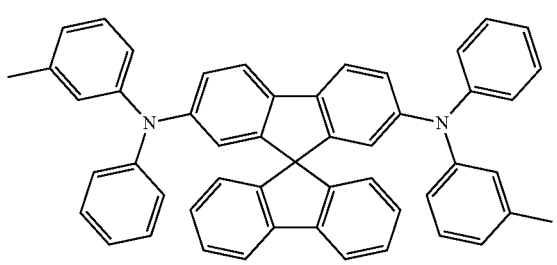

Spiro-NPB

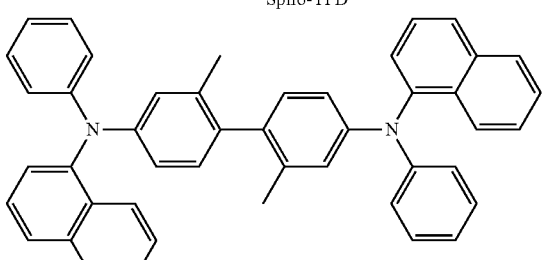

methylated-NPB

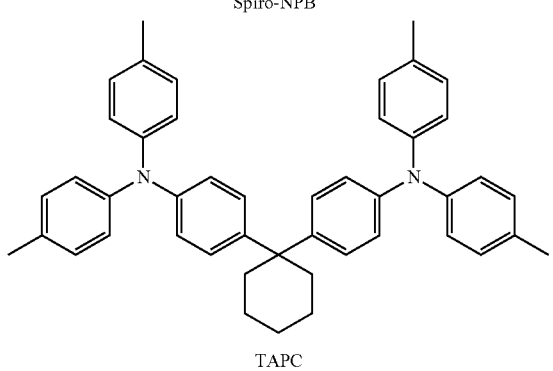

TAPC

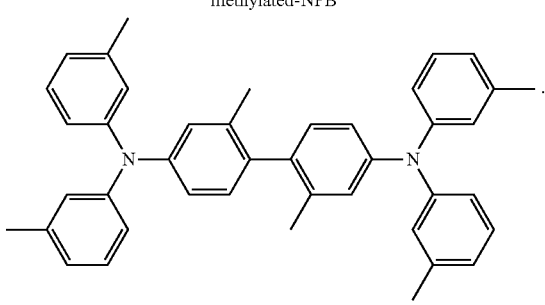

HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within their respective ranges, satisfactory hole-transporting characteristics may be obtained without a substantial increase in driving voltage.

The emission auxiliary layer may increase light-emission efficiency by compensating for an optical resonance distance according to the wavelength of light emitted from the emission layer, and the electron blocking layer may block or reduce the leakage of electrons from the emission layer to the hole transport region. Materials that may be included in the hole transport region may be included in the emission auxiliary layer and the electron blocking layer.

p-Dopant

The hole transport region may further include, in addition to the materials described above, a charge-generation material for the improvement of conductive properties. The charge-generation material may be uniformly or non-uniformly dispersed in the hole transport region (for example, in the form of a single layer consisting of a charge-generation material).

The charge-generation material may be, for example, a p-dopant.

In an embodiment, a lowest unoccupied molecular orbital (LUMO) energy level of the p-dopant may be about −3.5 eV or less.

In an embodiment, the p-dopant may include a quinone derivative, a cyano group-containing compound, a compound containing element EL1 and element EL2, or any combination thereof.

Examples of the quinone derivative may include TCNQ, F4-TCNQ, and/or the like.

Examples of the cyano group-containing compound may include HAT-CN, a compound represented by Formula 221 below, and/or the like.

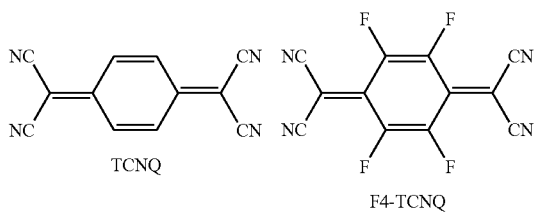

TCNQ

F4-TCNQ

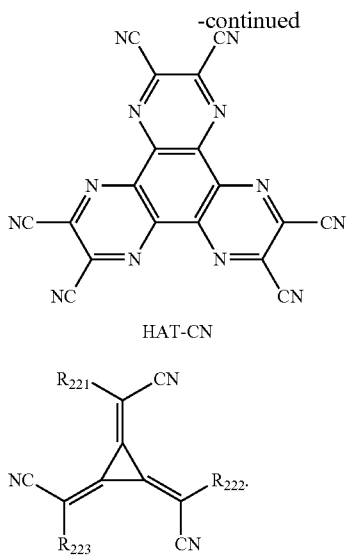

HAT-CN

Formula 221

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be a metal, a metalloid, or a combination thereof, and element EL2 may be a non-metal, a metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid may include silicon (Si), antimony (Sb), and tellurium (Te).

Examples of the non-metal may include oxygen (O) and halogen (for example, F, Cl, Br, I, etc.).

In an embodiment, examples of the compound containing element EL1 and element EL2 may include a metal oxide, a metal halide (for example, a metal fluoride, a metal chloride, a metal bromide, and/or a metal iodide), a metalloid halide (for example, a metalloid fluoride, a metalloid chloride, a metalloid bromide, and/or a metalloid iodide), a metal telluride, or any combination thereof.

Examples of the metal oxide may include tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide may include an alkali metal halide, an alkaline earth metal halide, a transition metal halide, a post-transition metal halide, and a lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$), $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide may include zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3$, $SmBr_3$, YbI, $YbI_2$, $YbI_3$, and $SmI_3$.

Examples of the metalloid halide may include antimony halide (for example, $SbCl_5$, etc.).

Examples of the metal telluride may include an alkali metal telluride (for example, $Li_2Te$, $Na_2Te$, $K_2Te$, $Rb_2Te$, $Cs_2Te$, etc.), an alkaline earth metal telluride (for example, BeTe, MgTe, CaTe, SrTe, BaTe, etc.), a transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), a post-transition metal telluride (for example, ZnTe, etc.), and a lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layer in Interlayer 130

When the light-emitting device 10 is a full-color light-emitting device, the emission layer may be patterned into a red emission layer, a green emission layer, and/or a blue emission layer, according to a sub-pixel. In an embodiment, the emission layer may have a stacked structure of two or more layers selected from a red emission layer, a green emission layer, and a blue emission layer, in which the two or more layers contact each other or are separated from each other. In one or more embodiments, the emission layer may include two or more materials selected from a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

An amount of the dopant in the emission layer may be from about 0.01 parts by weight to about 15 parts by weight based on 100 parts by weight of the host.

In an embodiment, the emission layer may include a delayed fluorescence material. The delayed fluorescence material may act (e.g., serve) as a host or a dopant in the emission layer.

In some embodiments, the emission layer may include the quantum dot-containing complex (hereinafter, also referred to as a "quantum dot").

Quantum dots are dispersed in a naturally coordinated form in a dispersion medium such as an organic solvent and/or polymer resin, and the dispersion medium may be any suitable transparent medium that does not affect the wavelength conversion performance of the quantum dots, does not change by light or reflect light, and does not cause absorption of light. In an embodiment, the organic solvent may include at least one selected from toluene, chloroform, and ethanol, and the polymer resin may include at least one selected from epoxy, silicone, polystyrene, and acrylate.

Unlike a larger (e.g., bulky) material, quantum dots have a discontinuous band gap energy due to the quantum confinement effect. In addition, in a quantum dot, a gap between energy bands varies according to the size of the quantum dot, and even when the same quantum dot (e.g., quantum dot with the same material composition) is utilized, light with different wavelengths may be emitted when the size thereof is different. The smaller the size of the quantum dot, the greater the band gap energy, accordingly, the shorter the wavelength of light that is emitted by the quantum dot. Utilizing these characteristics, the size of the quantum dot may be adjusted by appropriately changing the growth condition of the nanocrystal to obtain light of the desired or suitable wavelength range. Therefore, by introducing such a quantum dot into a light-emitting device, a light-emitting device having high light efficiency and color purity may be implemented (obtained).

When the emission layer includes a host and a dopant and does not include a quantum dot, a color conversion layer may include a quantum dot-containing complex.

A thickness of the emission layer may be in a range of about 100 Å to about 1,000 Å, for example, about 200 Å to about 600 Å. When the thickness of the emission layer is within these ranges, excellent or suitable light-emission characteristics may be obtained without a substantial increase in driving voltage.

Host

The host may include a compound represented by Formula 301 below:

$$[Ar_{301}]_{xb11}-[(L_{301})_{xb1}-R_{301}]_{xb21} \qquad \text{Formula 301}$$

wherein, in Formula 301, $Ar_{301}$ and $L_{301}$ may each independently be a $C_3$-$C_{60}$ carbocyclic group that is unsubstituted or substituted with at least one $R_{10a}$ or a $C_1$-$C_6$ heterocyclic group that is unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ may each independently be the same as described in connection with $Q_1$.

In an embodiment, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination thereof:

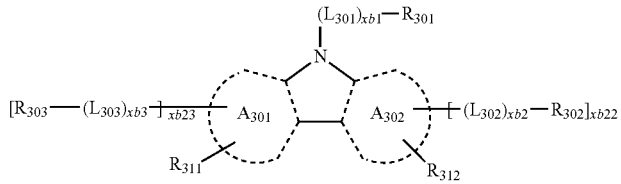

Formula 301-1

-continued

Formula 301-2

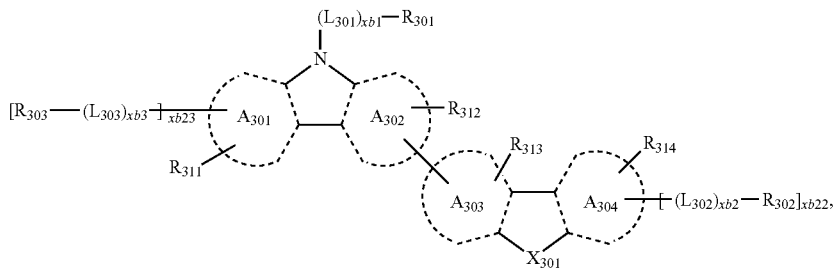

wherein, in Formulae 301-1 and 301-2,
ring $A_{301}$ to ring $A_{304}$ may each independently be a $C_3$-$C_{60}$ carbocyclic group that is unsubstituted or substituted with at least one $R_{10a}$ or a $C_1$-$C_{60}$ heterocyclic group that is unsubstituted or substituted with at least one $R_{10a}$,
$X_{301}$ may be O, S, N-[$(L_{304})_{xb4}$-$R_{304}$], C($R_{304}$)($R_{305}$), or Si($R_{304}$)($R_{305}$),
xb22 and xb23 may each independently be 0, 1, or 2,
$L_{301}$, xb1, and $R_{301}$ may respectively be the same as described in the present specification,
$L_{302}$ to $L_{304}$ may each independently be the same as described in connection with $L_{301}$,
xb2 to xb4 may each independently be the same as described in connection with xb1, and $R_{302}$ to $R_{305}$ and $R_{311}$ to $R_{314}$ may each independently be the same as described in connection with $R_{301}$.

In an embodiment, the host may include an alkali earth metal complex, a post-transition metal complex, or a combination thereof. In an embodiment, the host may include a Be complex (for example, Compound H55), an Mg complex, a Zn complex, or a combination thereof.

In an embodiment, the host may include at least one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolylbenzene (mCP), 1,3,5-tri(carbazol-9-yl)benzene (TCP), or any combination thereof:

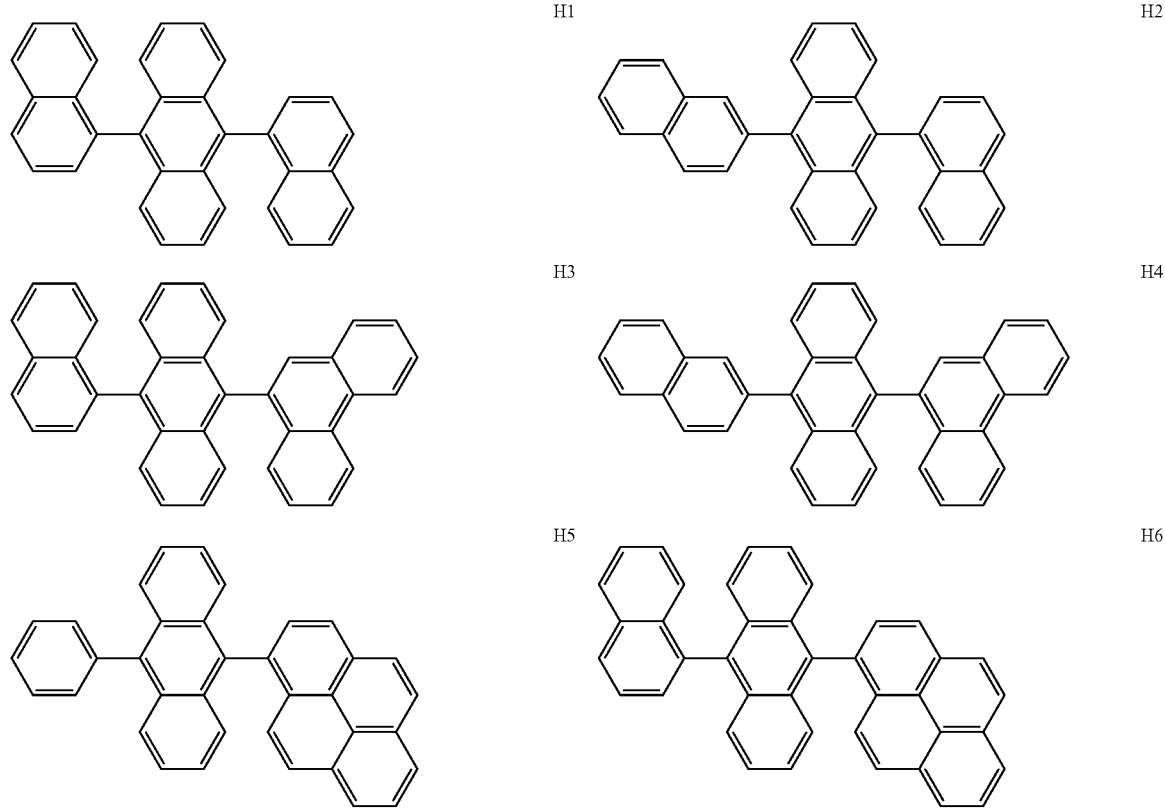

H7
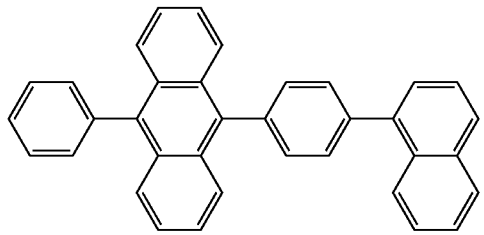
H8
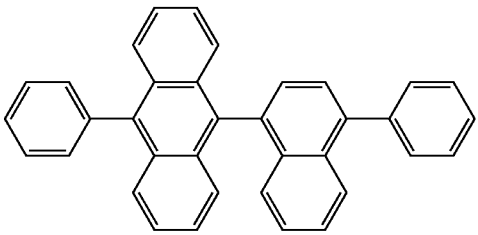
H9
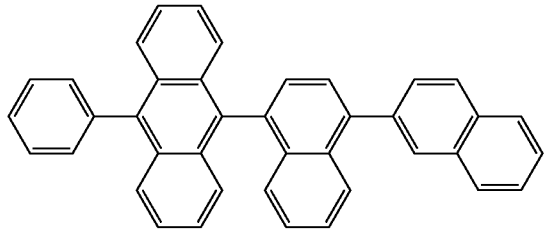
H10
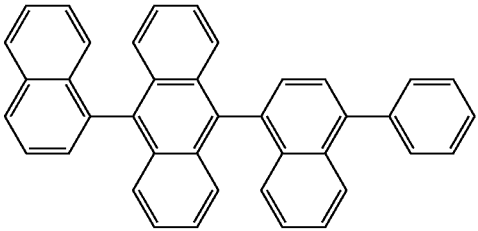
H11
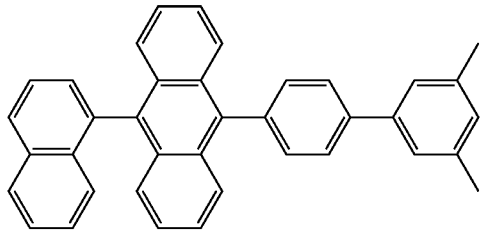
H12
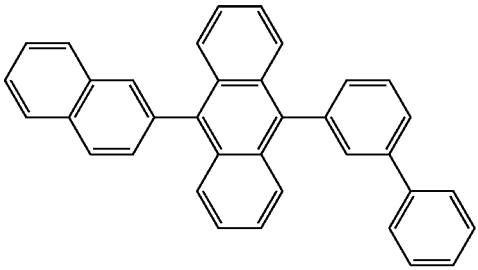
H13
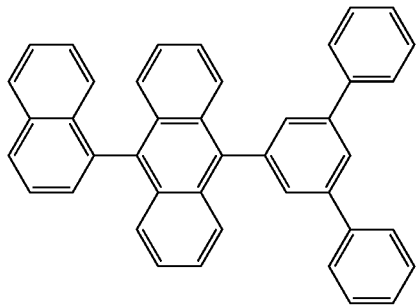
H14
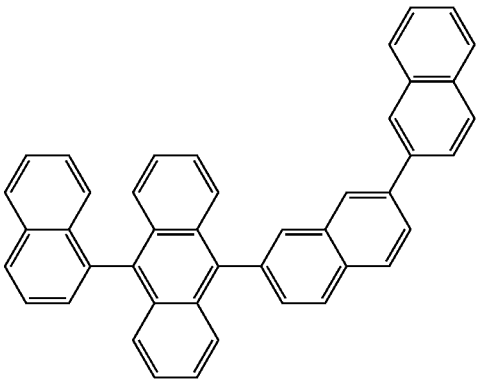
H15
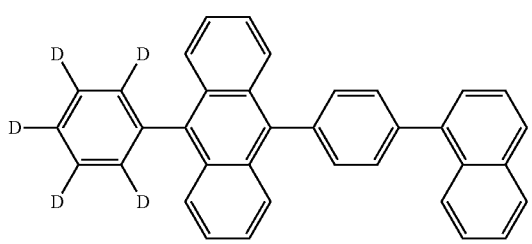
H16
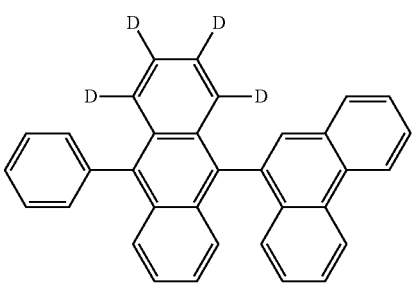

-continued
H17
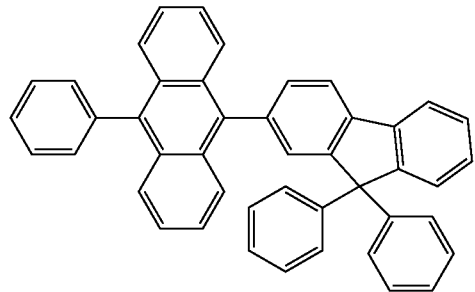
H18
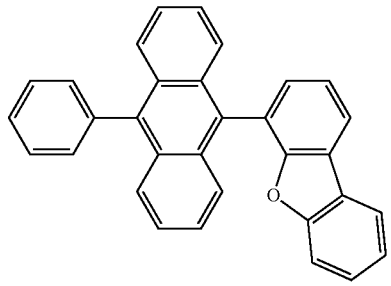
H19
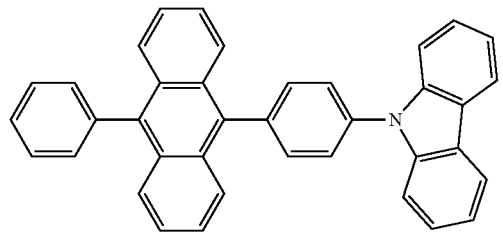
H20
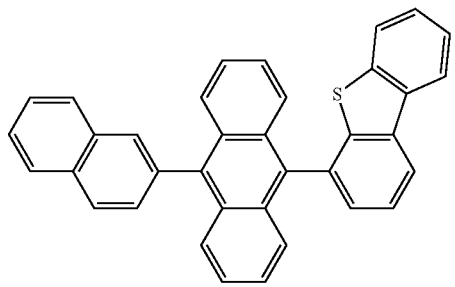
H21
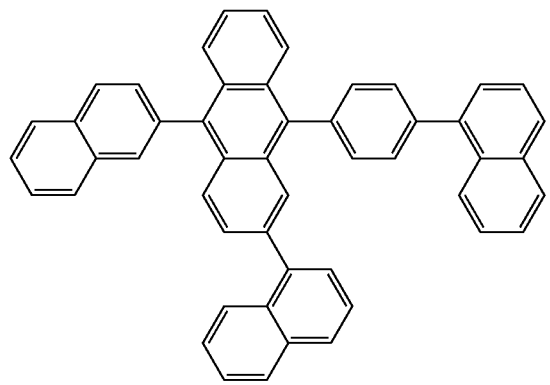
H22
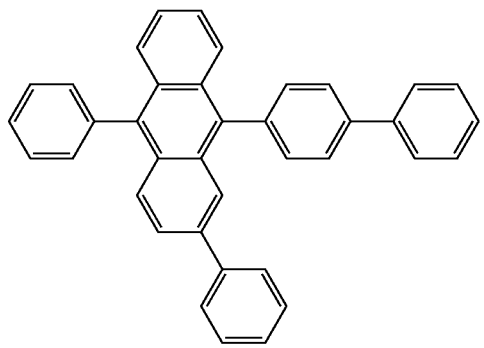
H23
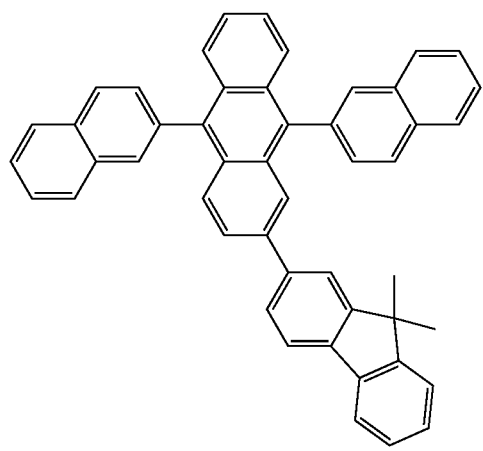
H24
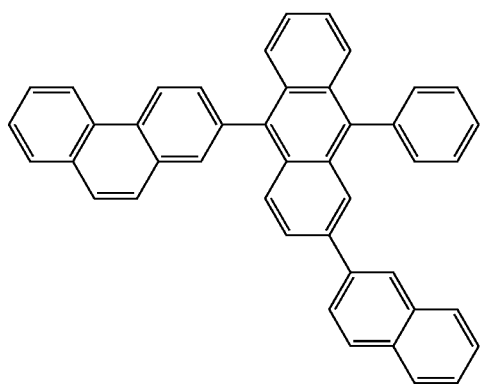

-continued
H25
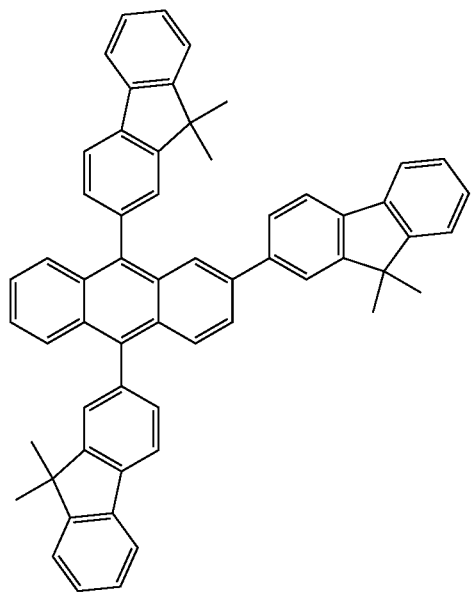
H26
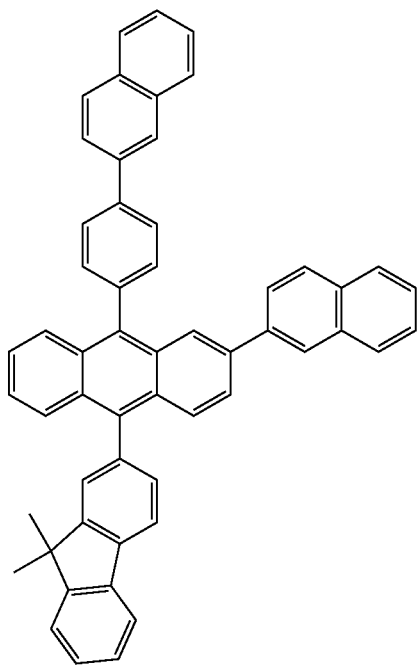
H27
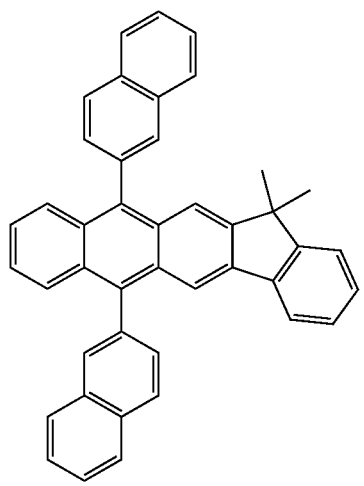
H28
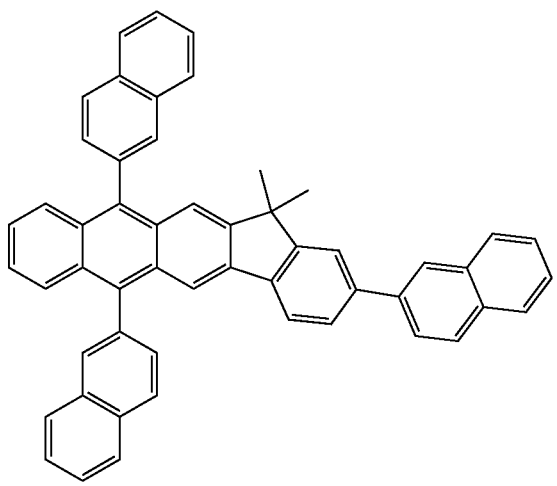
H29
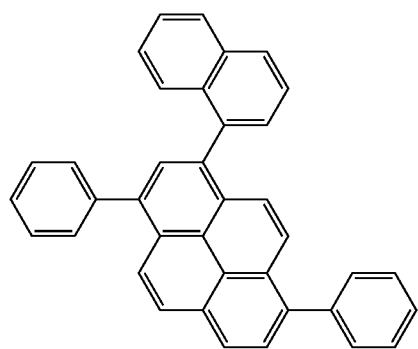
H30
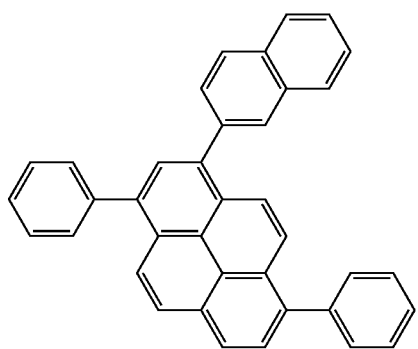

-continued
H31
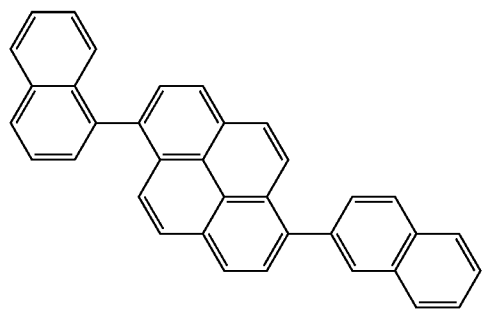
H32
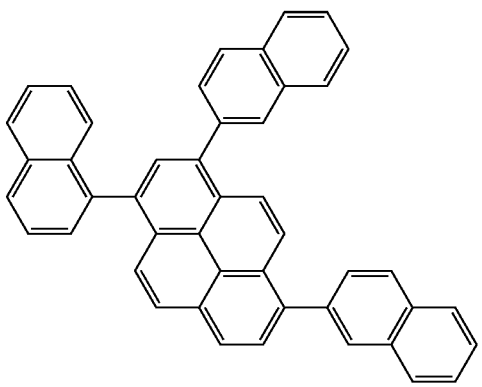
H33
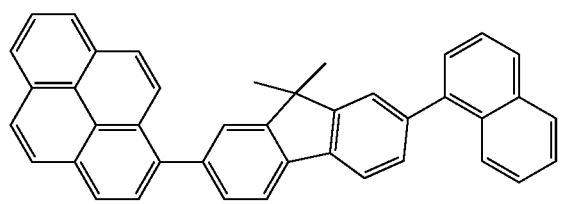
H34
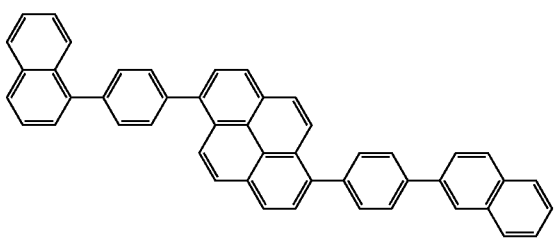
H35
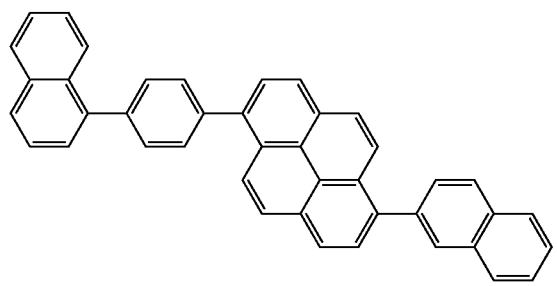
H36
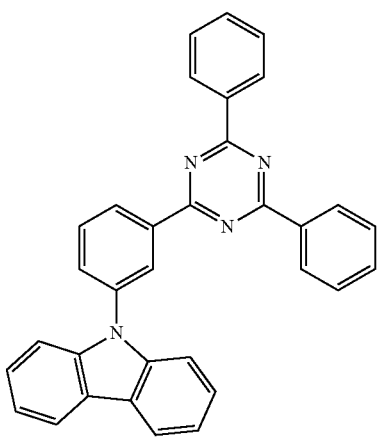
H37
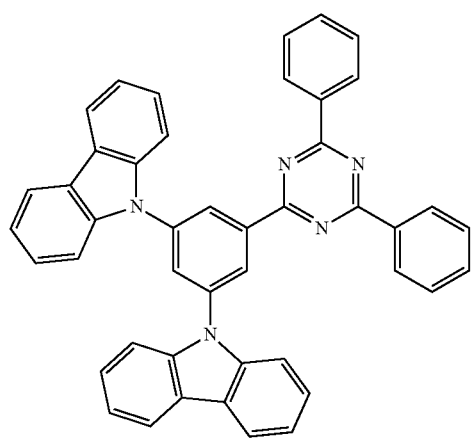
H38
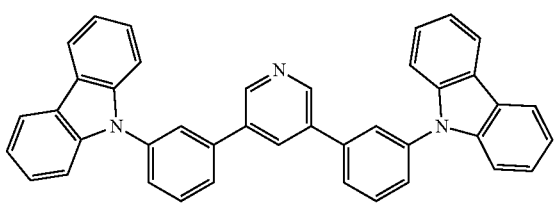

-continued
H39
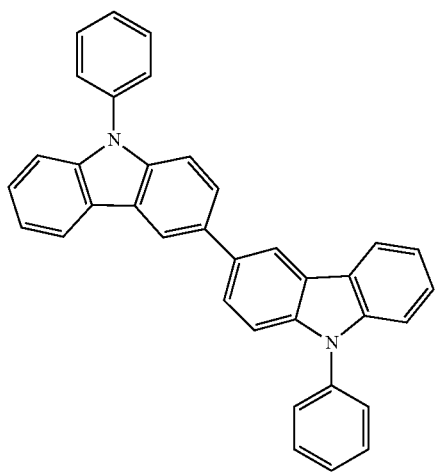
H40
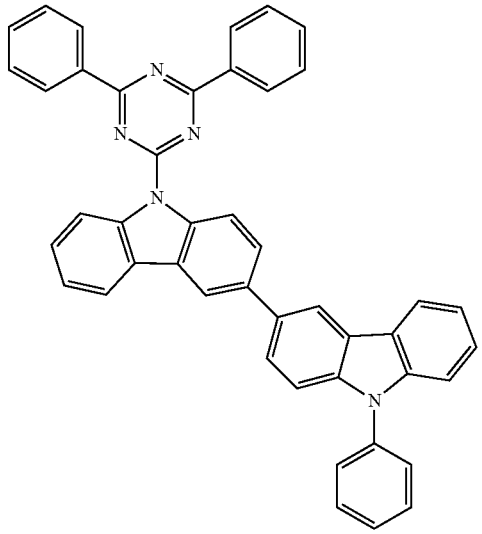
H41
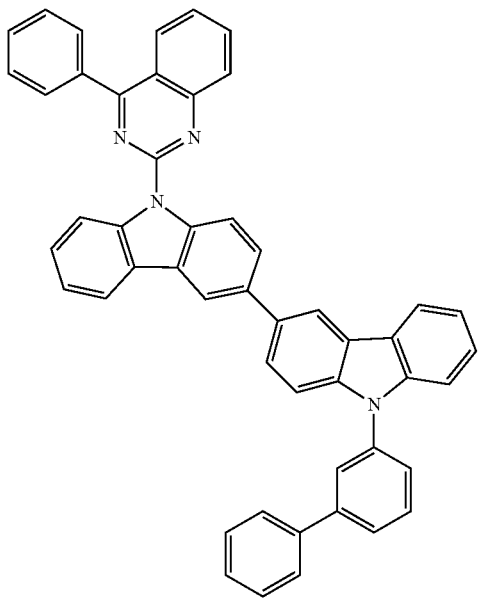
H42
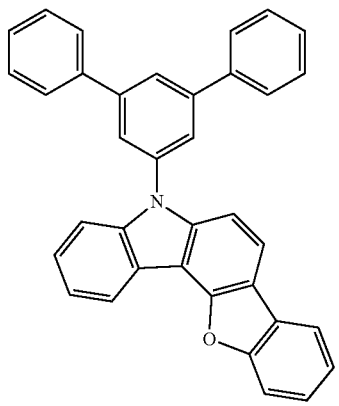
H43
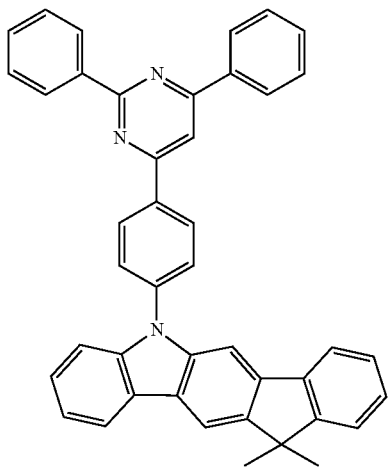
H44
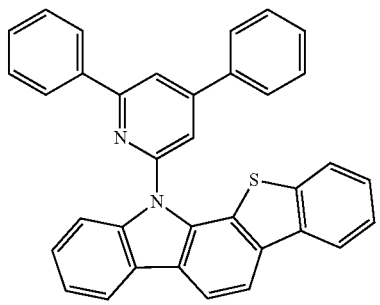

-continued
H45
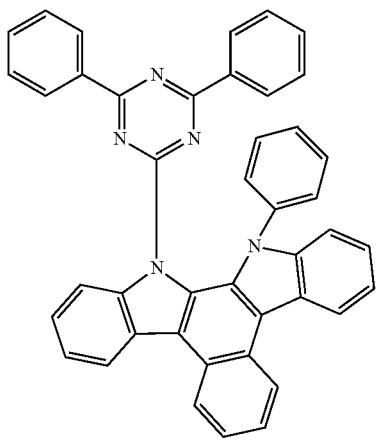
H46
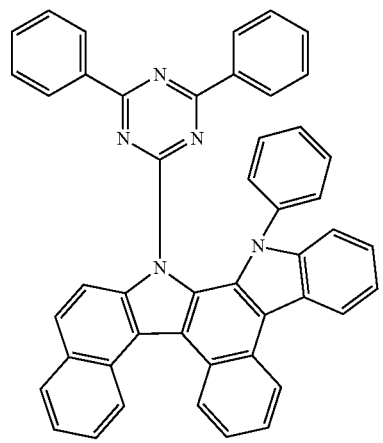
H47
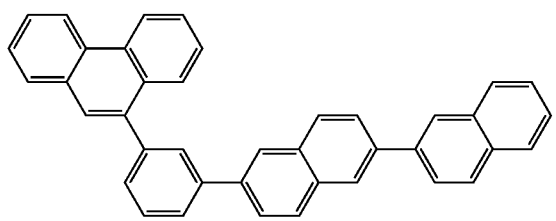
H48
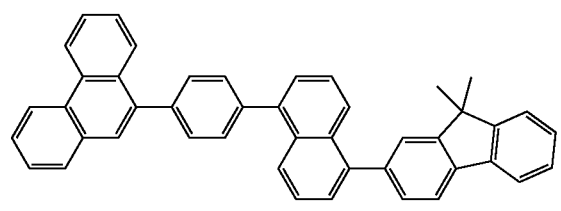
H49
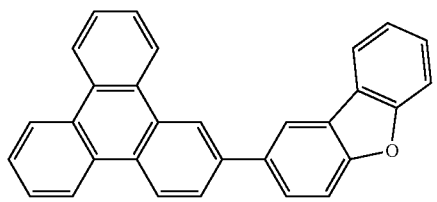
H50
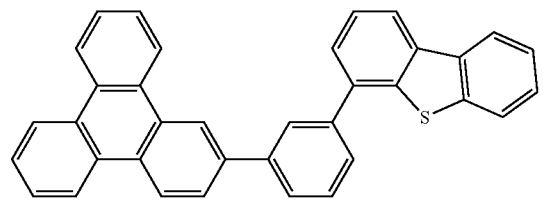
H51
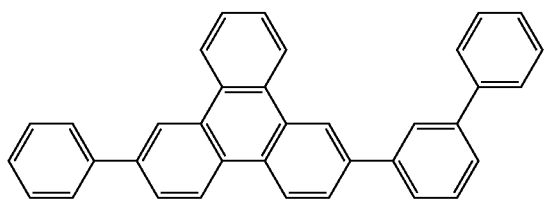
H52
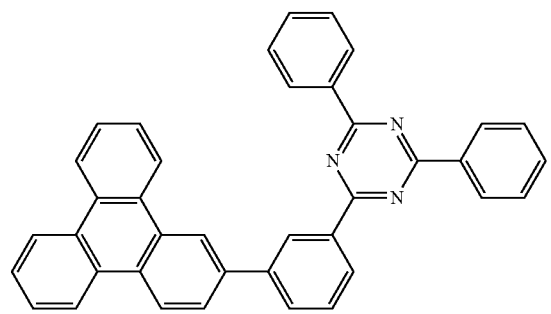
H53
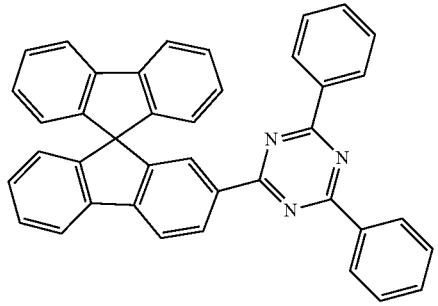
H54
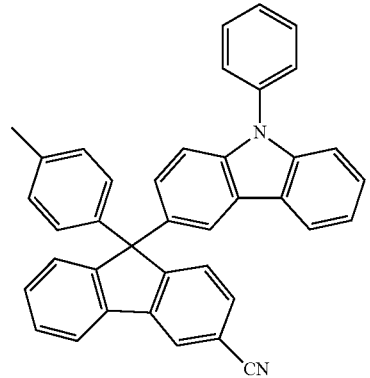

-continued
H55
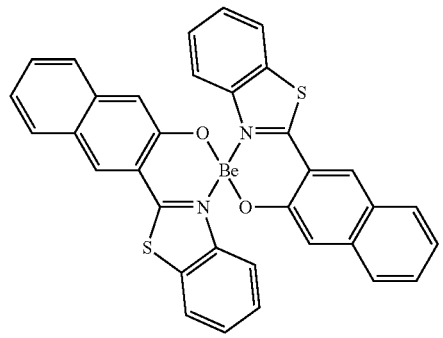
H56
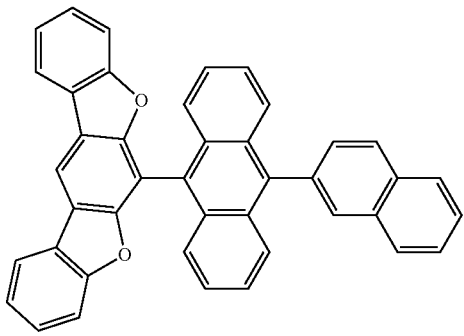
H57
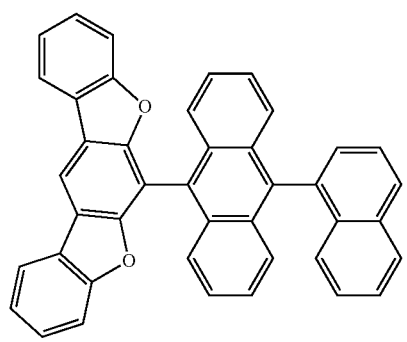
H58
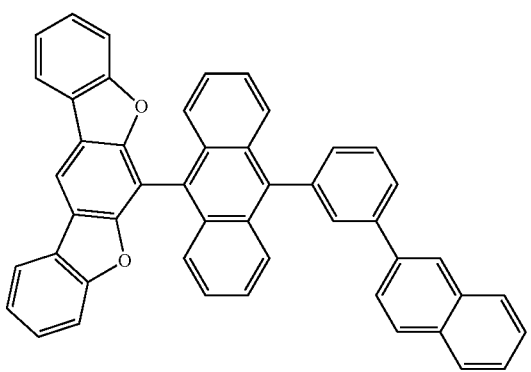
H59
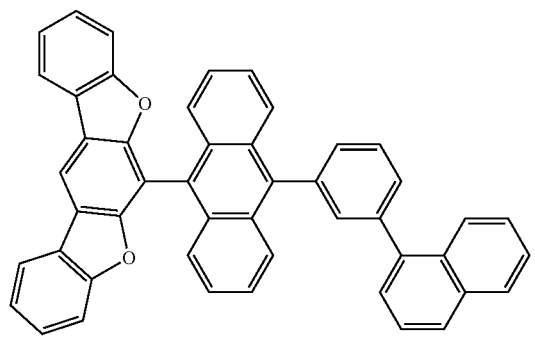
H60
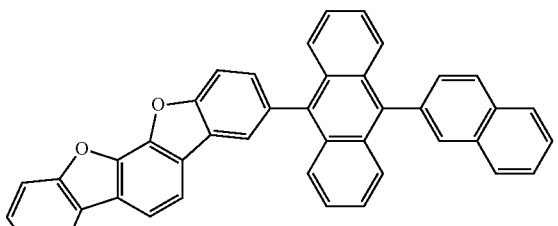
H61
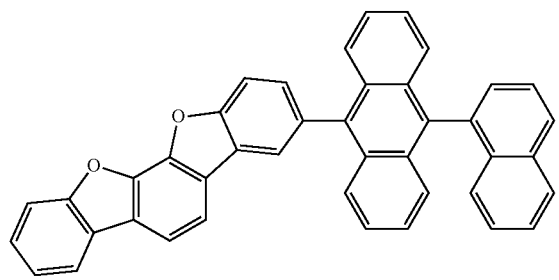
H62
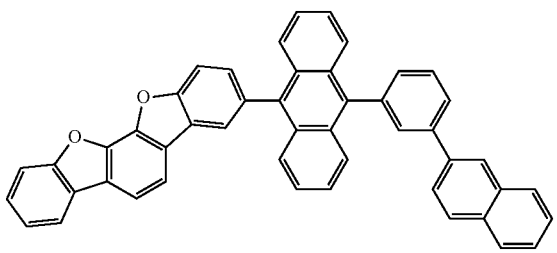

-continued
H63
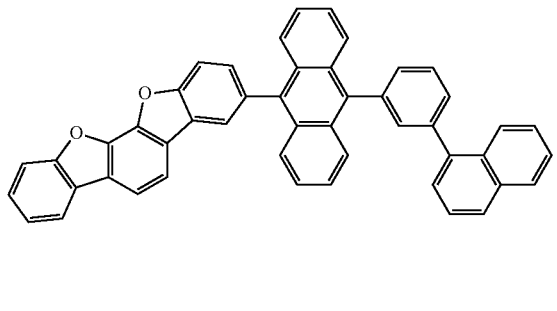
H64
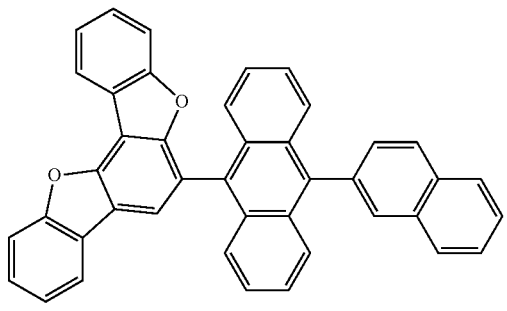
H65
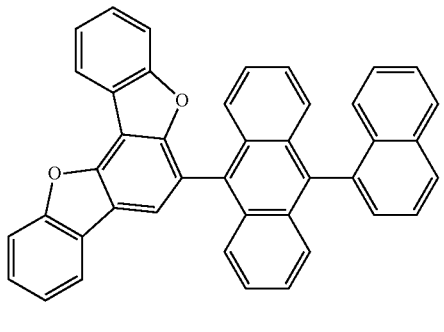
H66
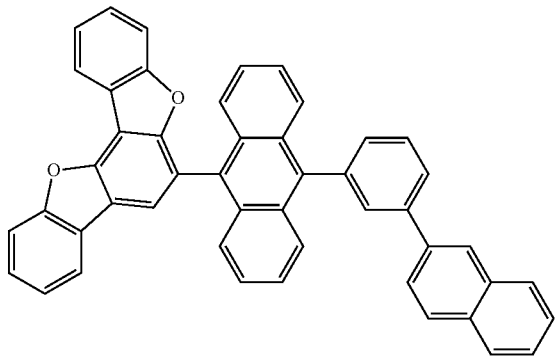
H67
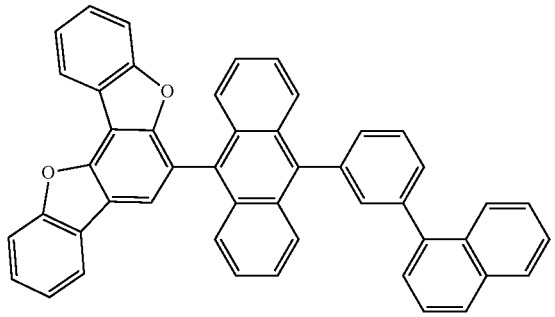
H68
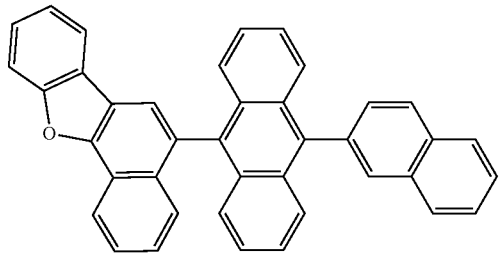
H69
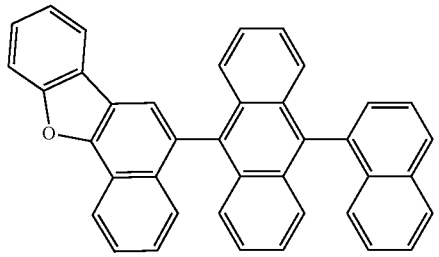
H70
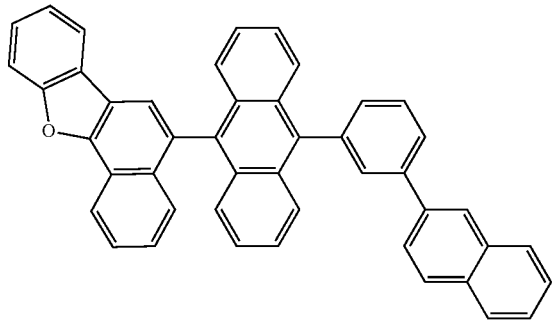

-continued
H71
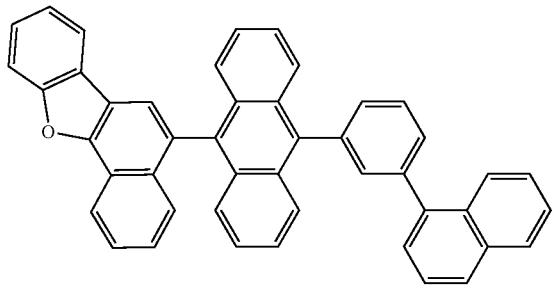
H72
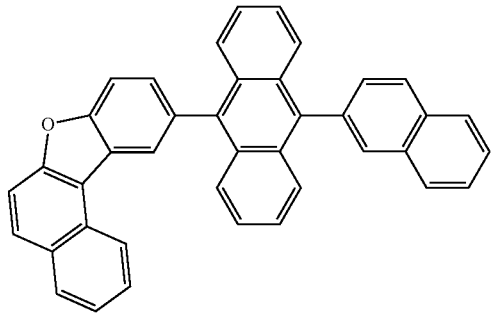
H73
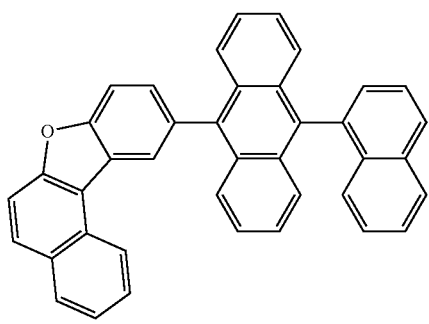
H74
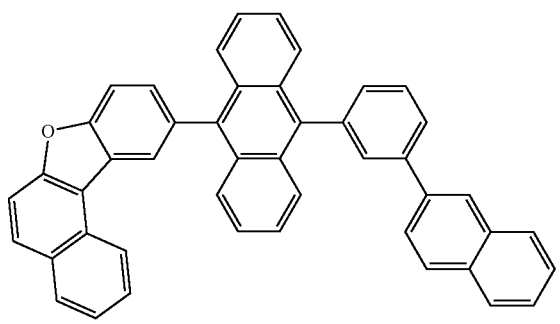
H75
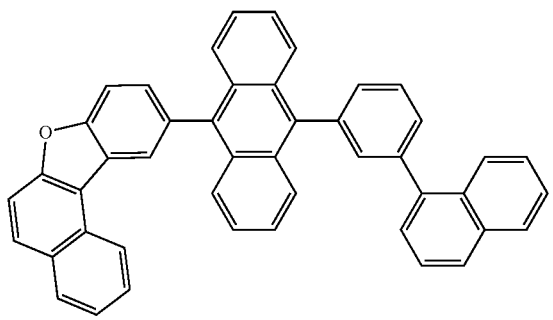
H76
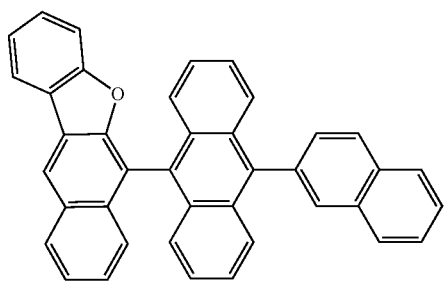
H77
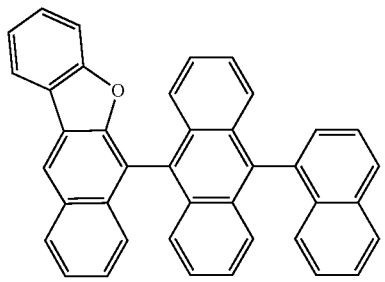
H78
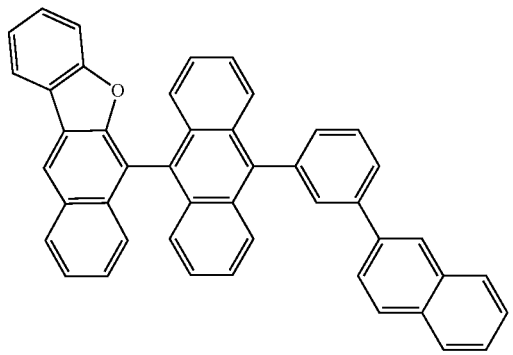

-continued
H79
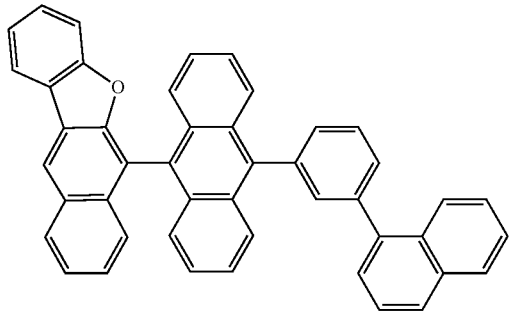
H80
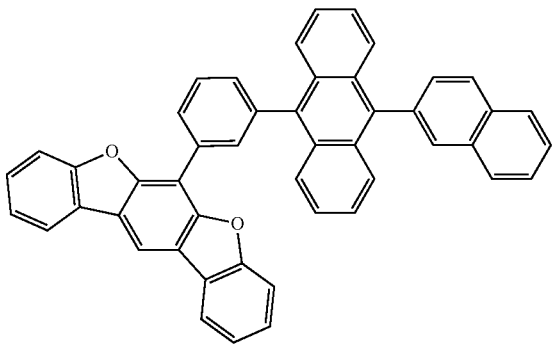
H81
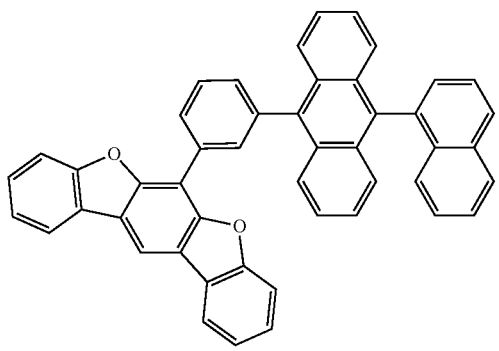
H82
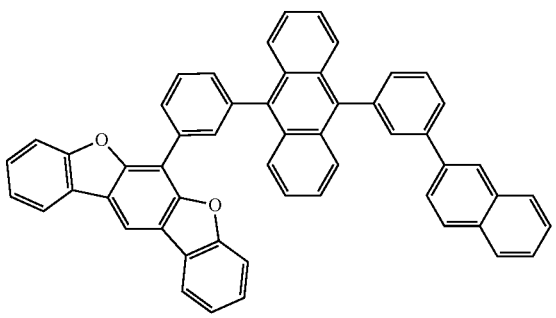
H83
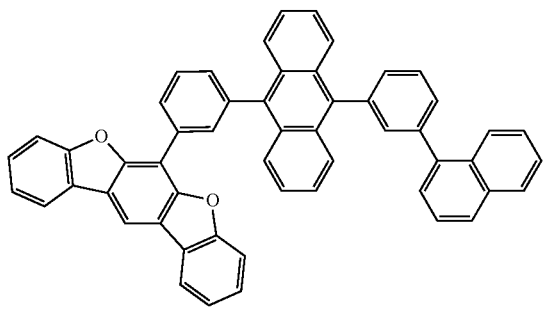
H84
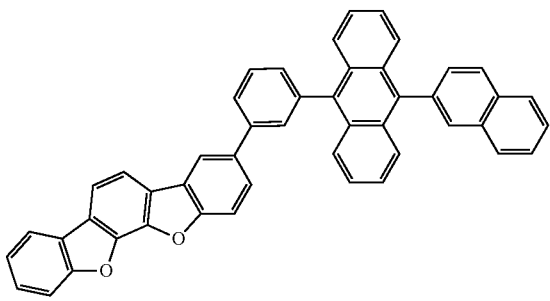
H85
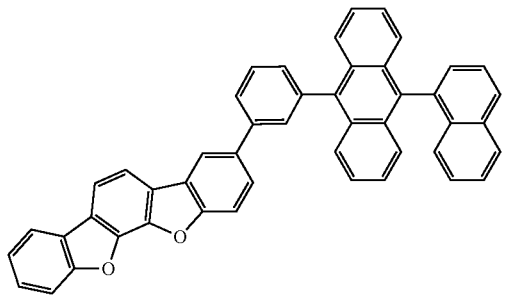
H86
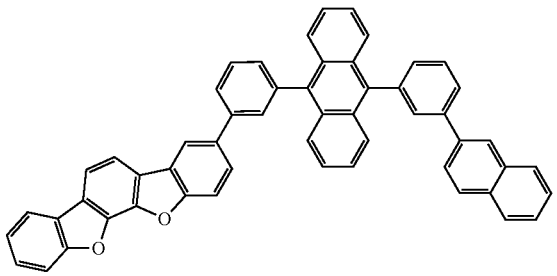

-continued
H87
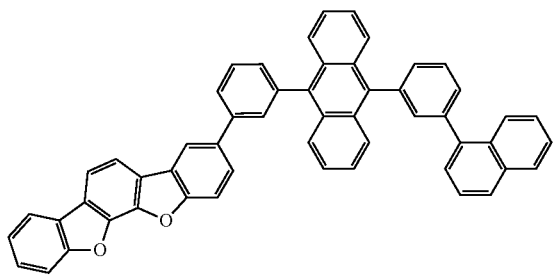
H88
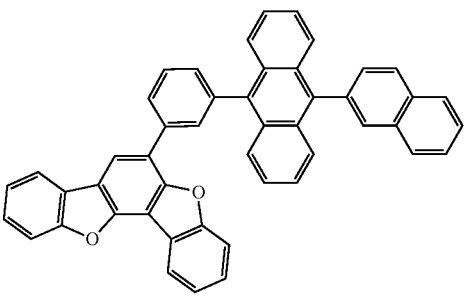
H89
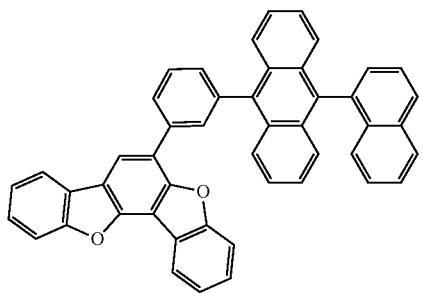
H90
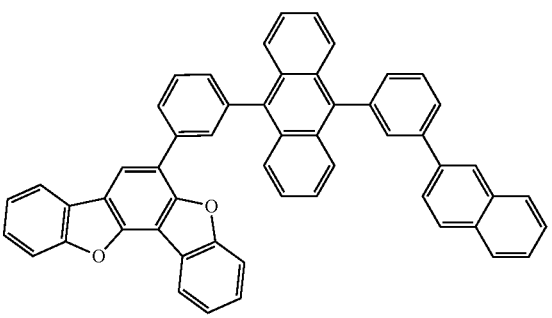
H91
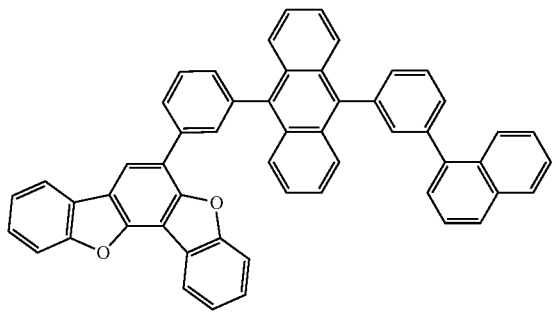
H92
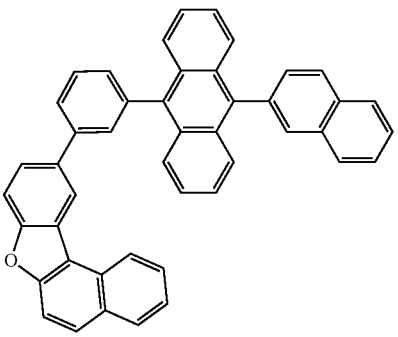
H93
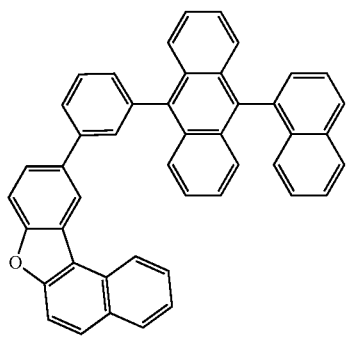
H94
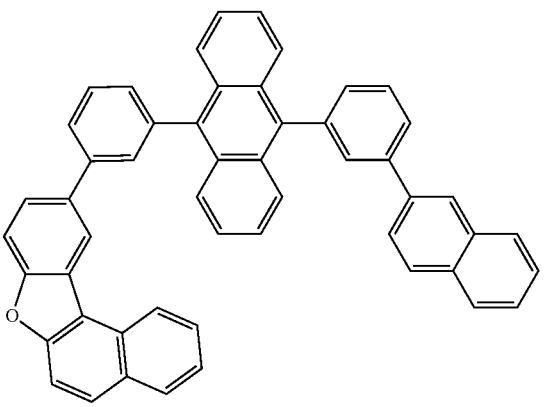

-continued
H95
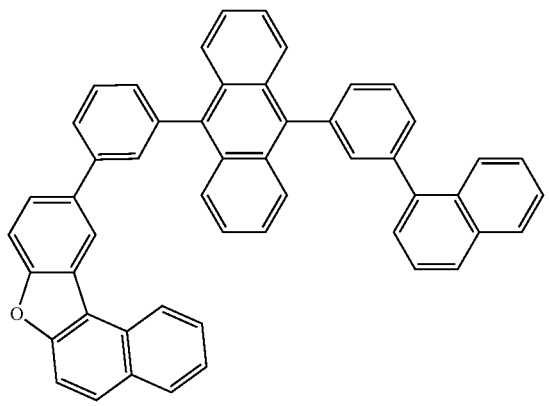
H96
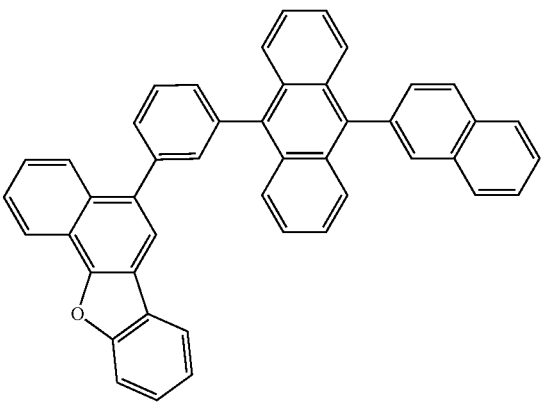
H97
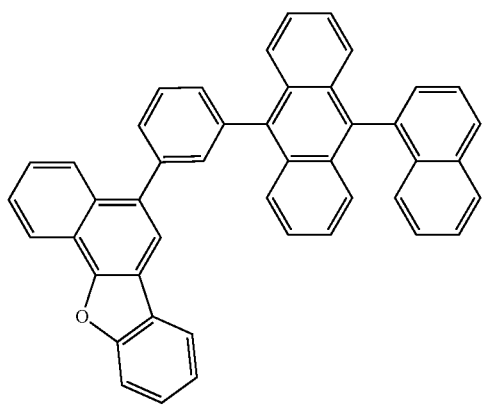
H98
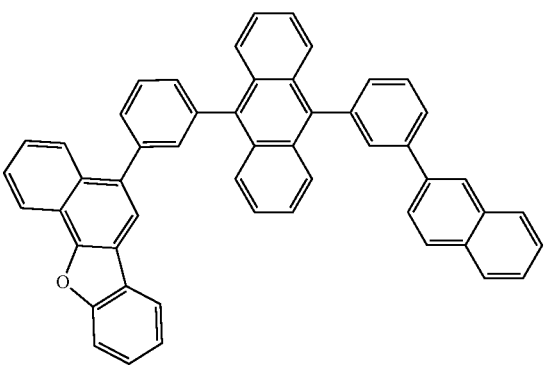
H99
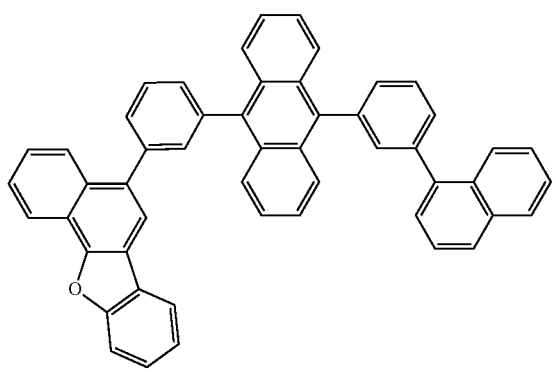
H100
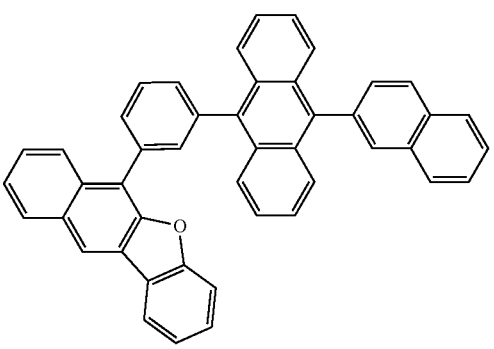
H101
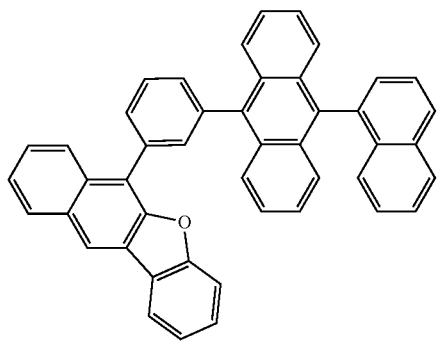
H102
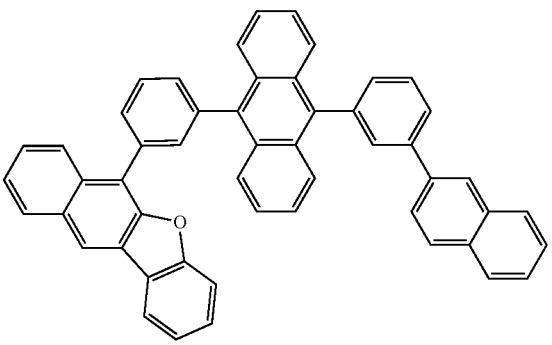

-continued
H103
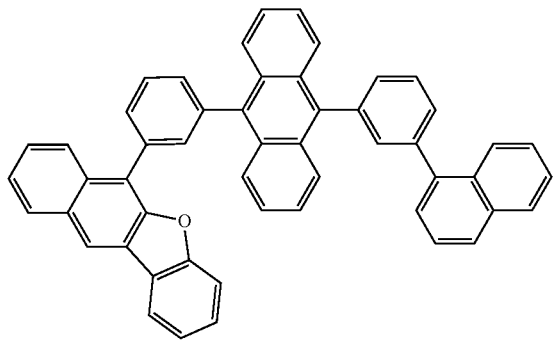
H104
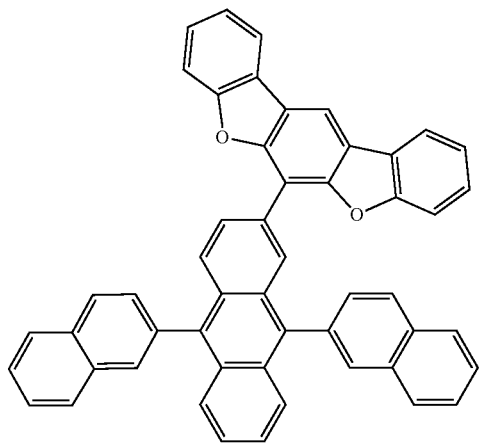
H105
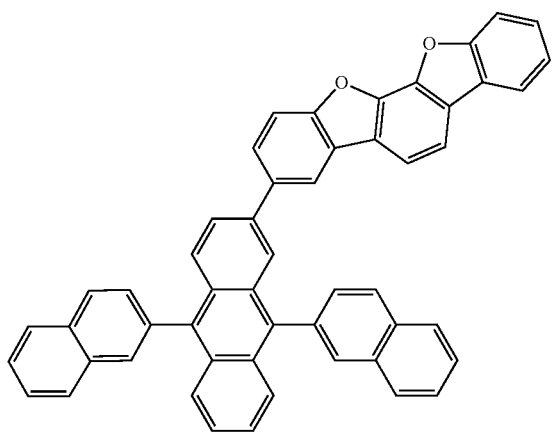
H106
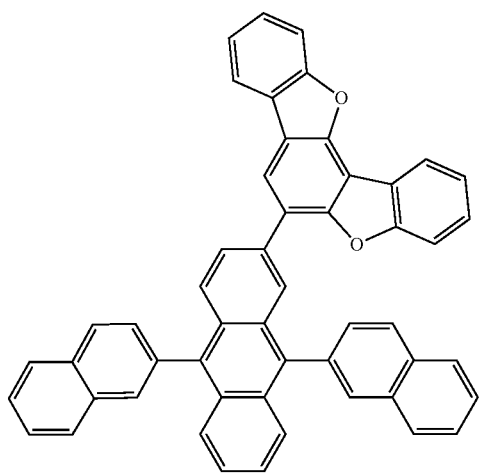
H107
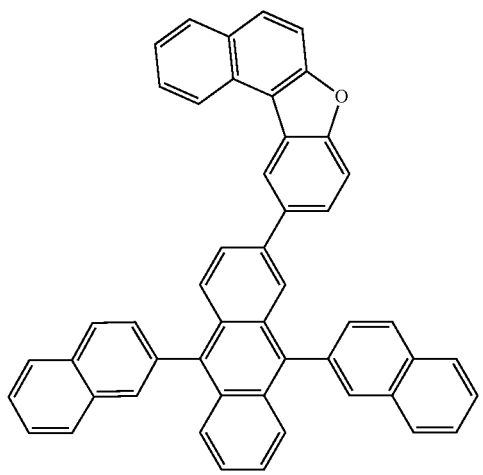
H108
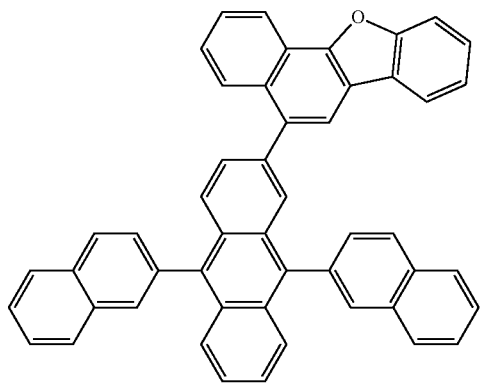

H109
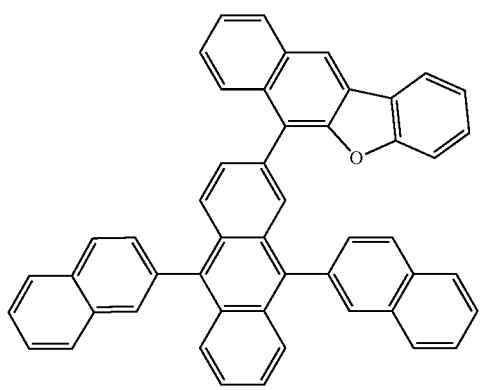
H110
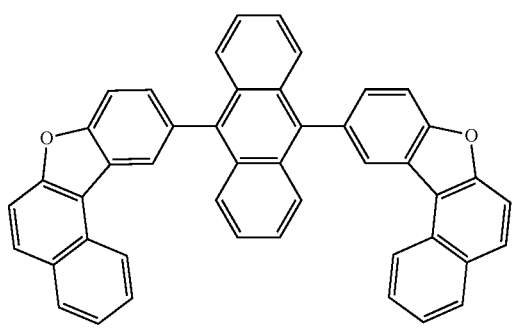
H111
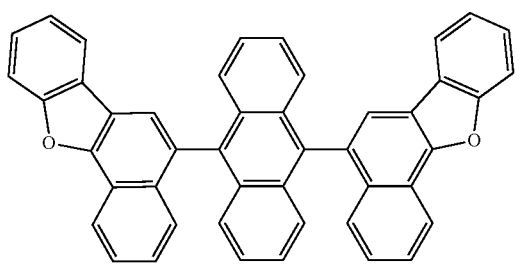
H112
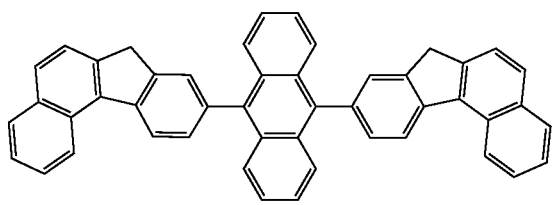
H113
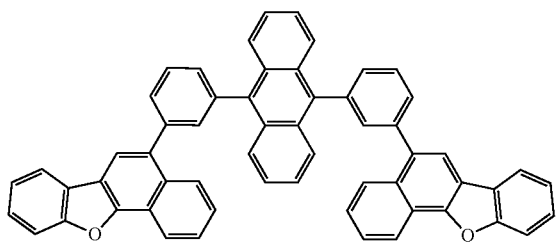
H114
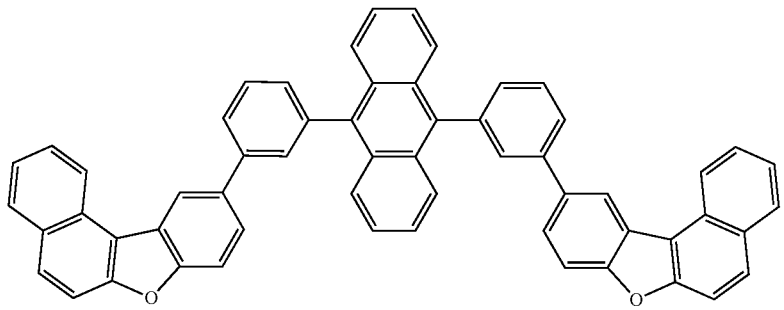
H115
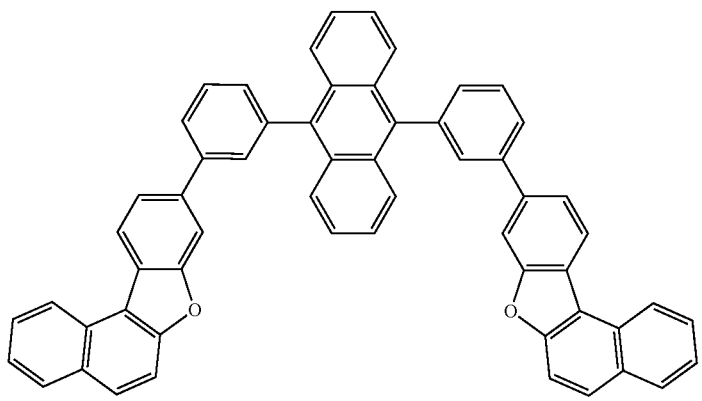

-continued
H116
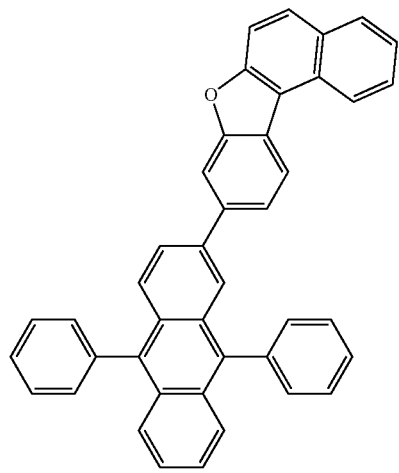
H117
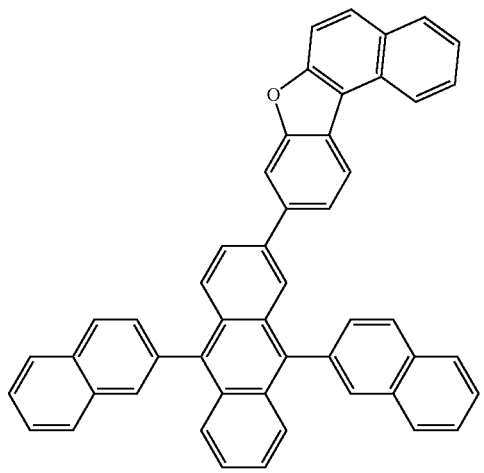
H118
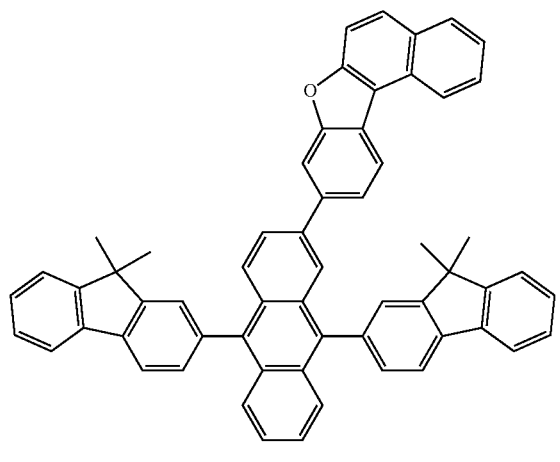
H119
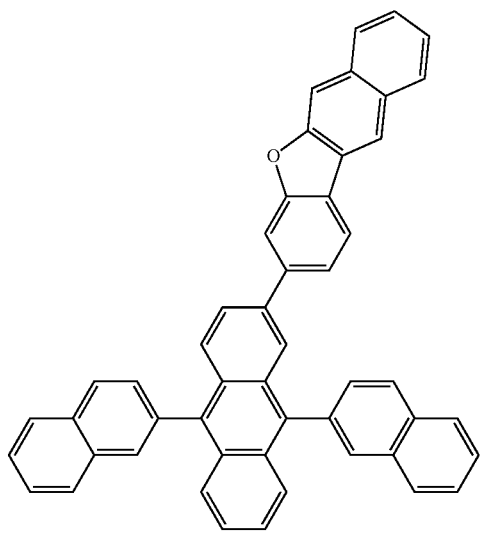
H120
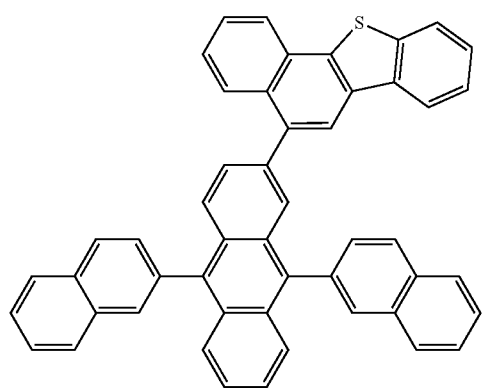

-continued
H121
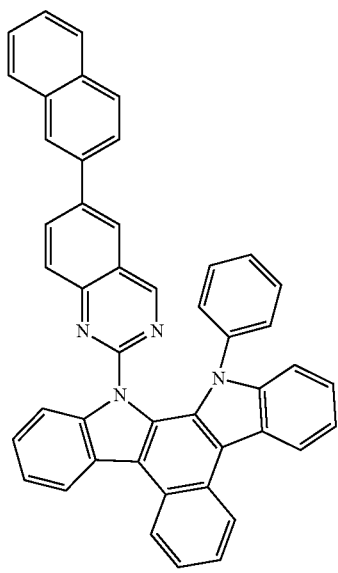
H122
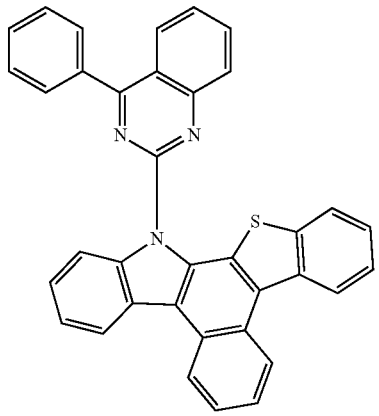
H123
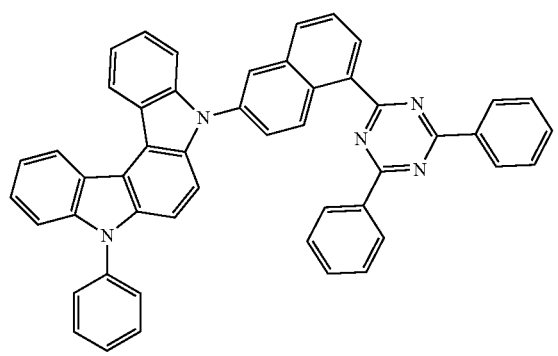
H124
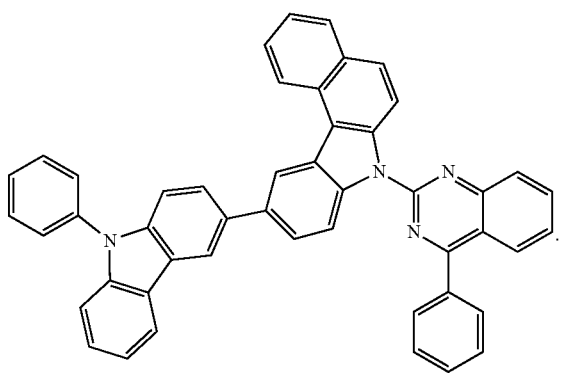

Phosphorescent Dopant

In one or more embodiments, the phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

$$M(L_{401})_{xc1}(L_{402})_{xc2}$$ Formula 401

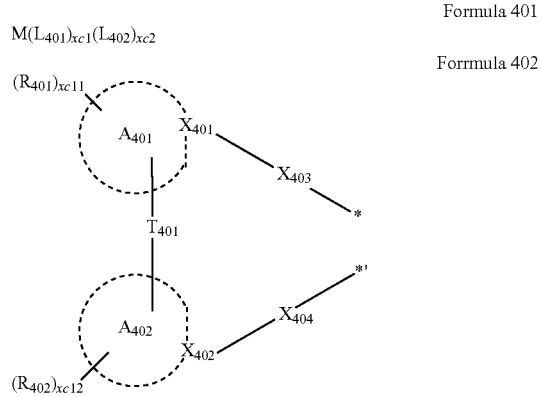

Formrmula 402 wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is two or more, two or more of $L_{401}(s)$ may be identical to or different from each other, $L_{402}$ may be an organic ligand, and xc2 may be 0, 1, 2, 3, or 4, wherein, when xc2 is 2 or more, two or more of $L_{402}(s)$ may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C=, $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may each independently be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group that is unsubstituted or substituted with at least one $R_{10a}$, a $C_1$-$C_{20}$ alkoxy group that is unsubstituted or substituted with at least one $R_{10a}$, a $C_3$-$C_{60}$ carbocyclic group that is unsubstituted or substituted with at least one $R_{10a}$, a $C_1$-$C_{60}$ heterocyclic group that is unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ may each independently be the same as described in connection with $Q_1$, xc11 and xc12 may each independently be an integer from 0 to 10, and

* and *' in Formula 402 each indicate a binding site to M in Formula 401.

In an embodiment, in Formula 402, i) $X_{401}$ may be nitrogen, and $X_{402}$ may be carbon, or ii) each of $X_{401}$ and $X_{402}$ may be nitrogen.

In an embodiment, when xc1 in Formula 401 is 2 or more, two ring $A_{401}$ in two or more of $L_{401}(s)$ may be optionally linked to each other via $T_{402}$, which is a linking group, and two ring $A_{402}$ may optionally be linked to each other via $T_{403}$, which is a linking group (see Compounds PD1 to PD4 and PD7). $T_{402}$ and $T_{403}$ may each independently be the same as described in connection with $T_{401}$.

$L_{402}$ in Formula 401 may be an organic ligand. In an embodiment, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, at least one of compounds PD1 to PD39, or any combination thereof:

PD1

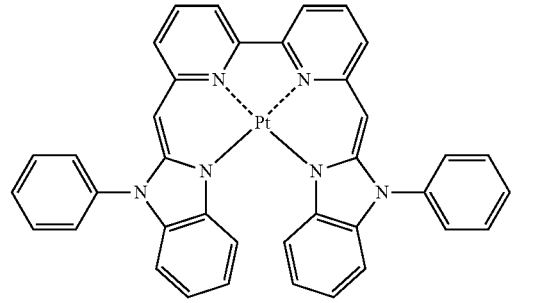

PD2

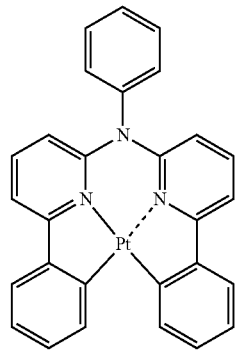

PD3

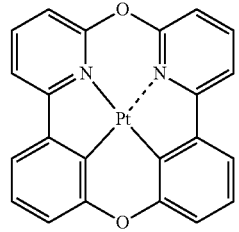

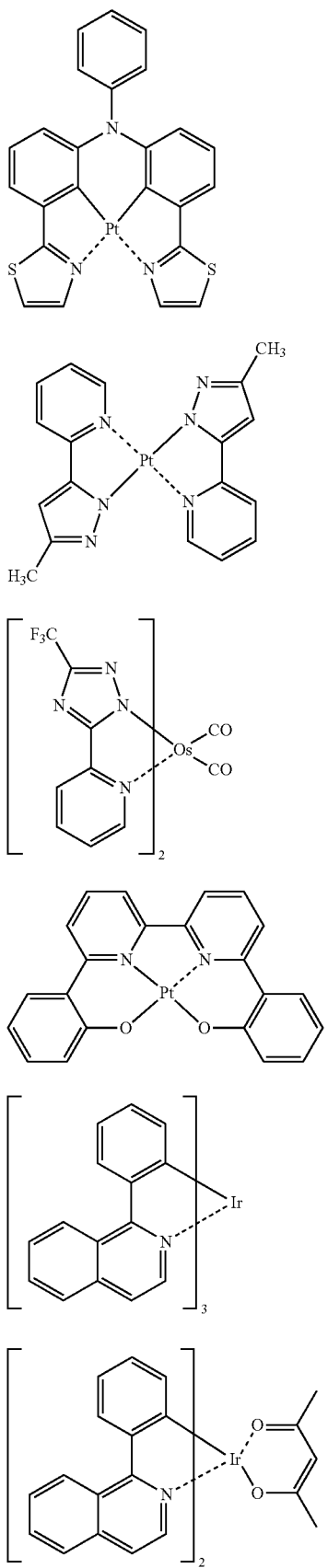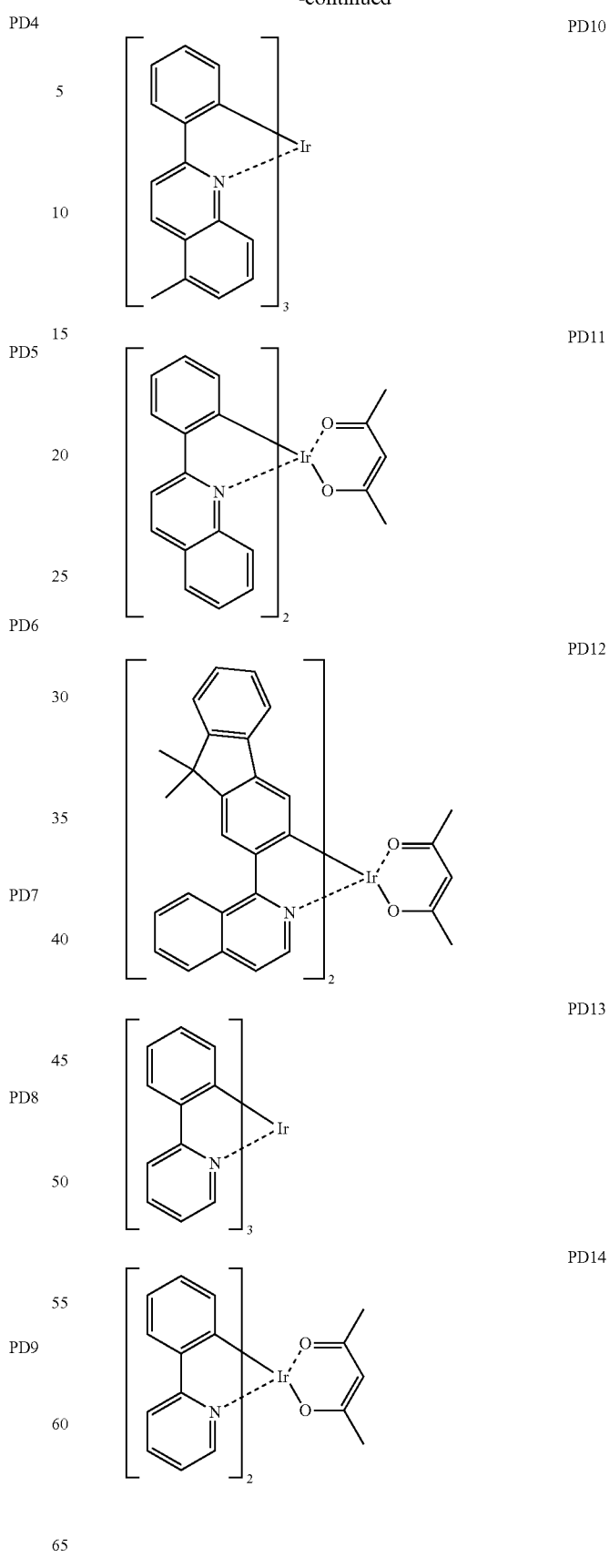

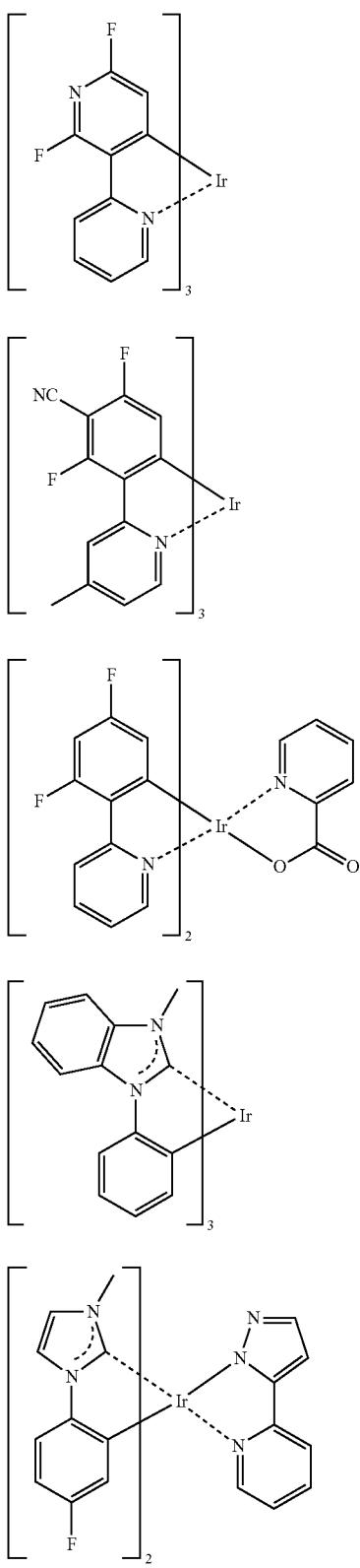
PD15
PD16
PD17
PD18
PD19
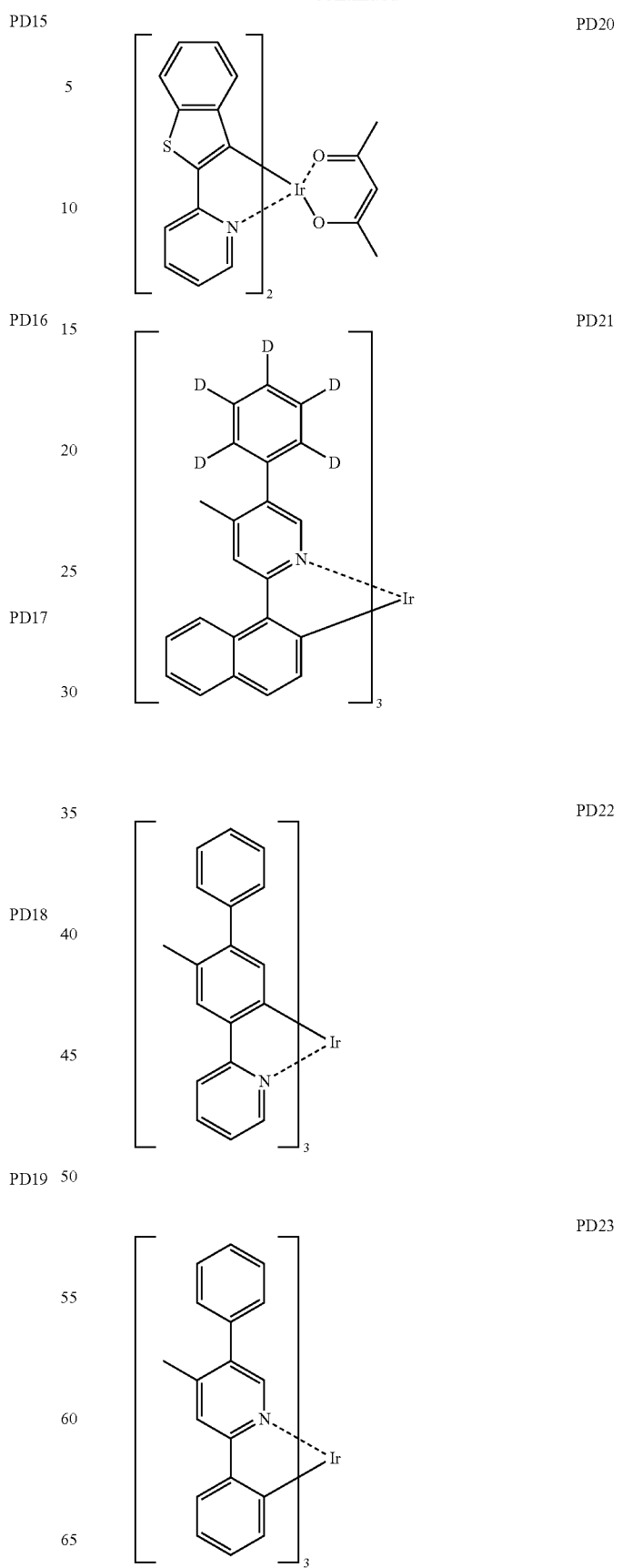
PD20
PD21
PD22
PD23

PD24
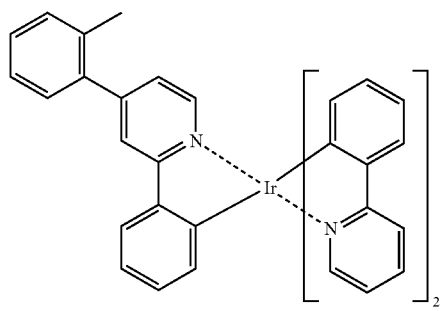
PD25
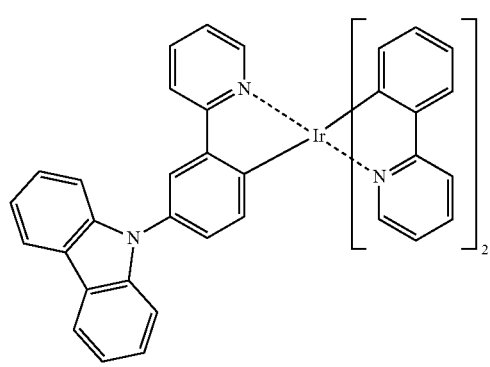
PD26
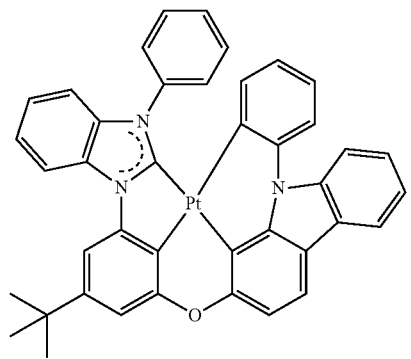
PD27
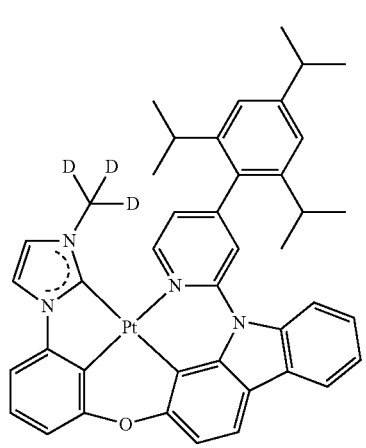
PD28
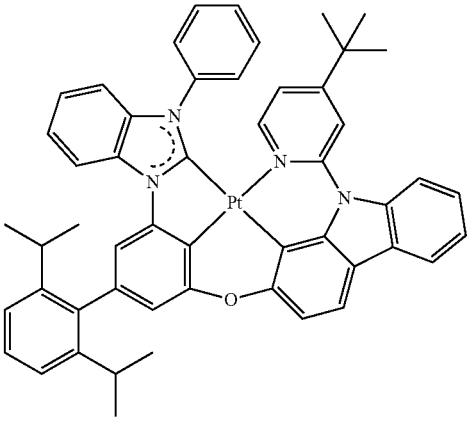
PD29
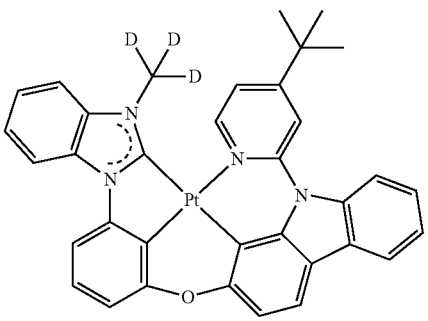
PD30
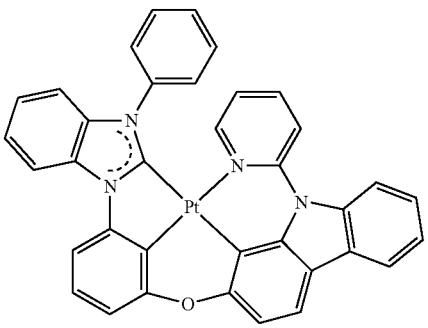
PD31
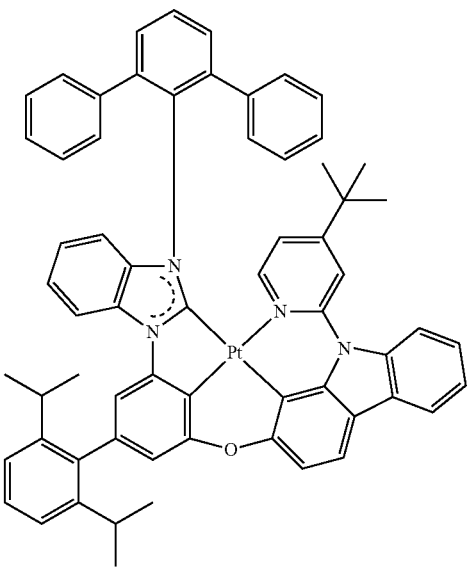

PD32
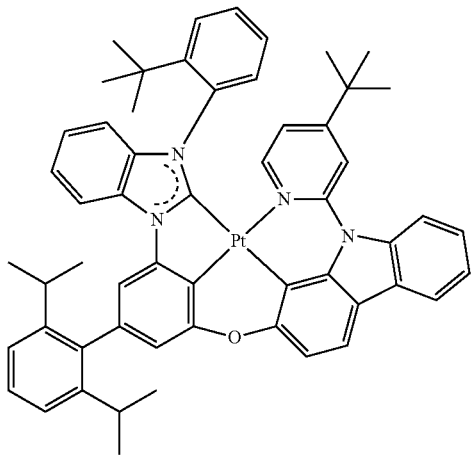
PD35
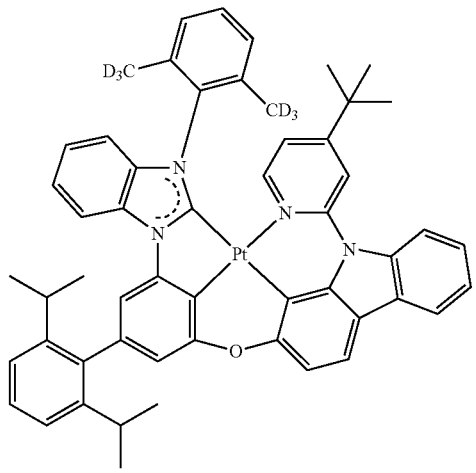
PD33
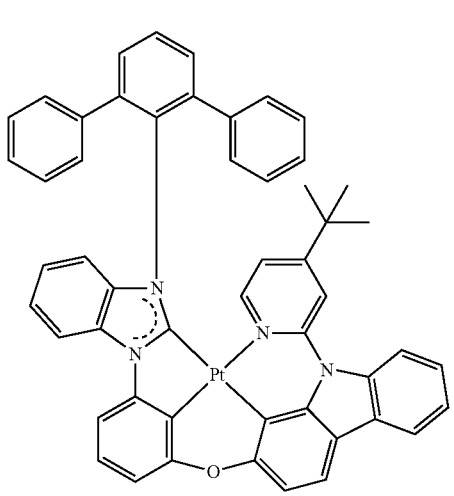
PD36
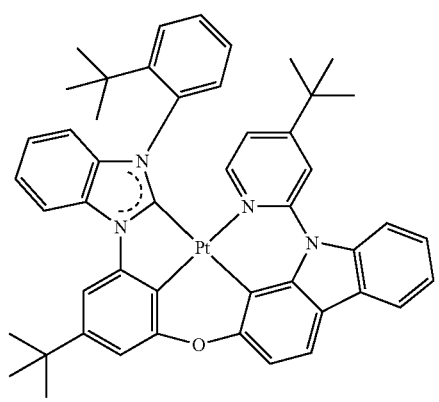
PD34
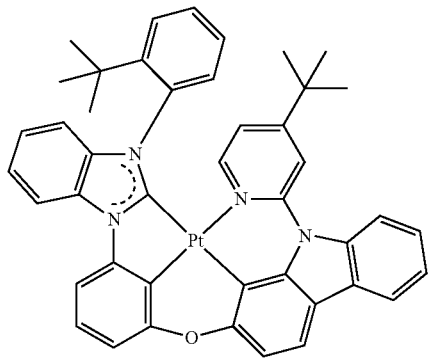
PD37
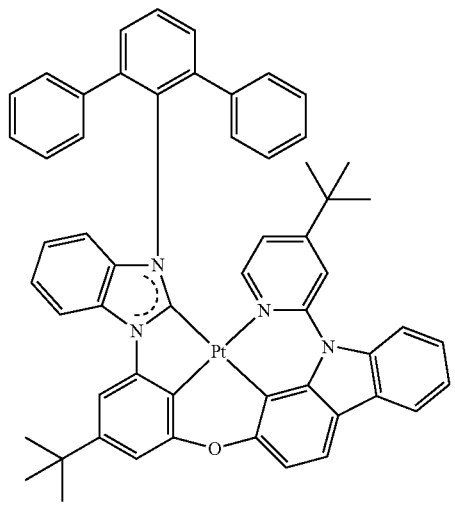

PD38

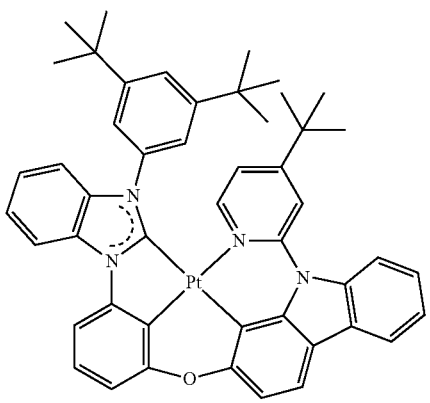

PD39

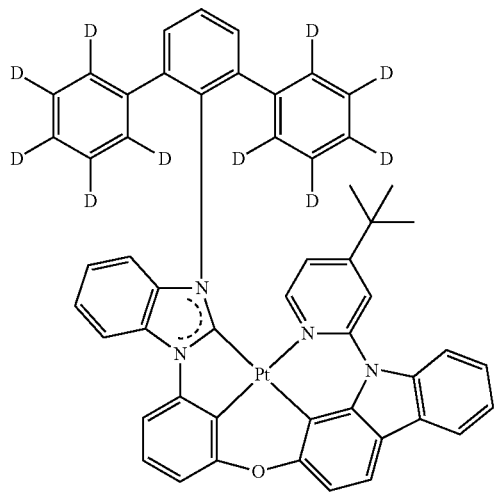

Fluorescent Dopant

The fluorescent dopant may include an amine group-containing compound, a styryl group-containing compound, or any combination thereof.

In an embodiment, the fluorescent dopant may include a compound represented by Formula 501:

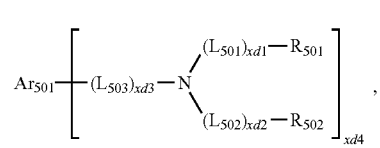

Formula 501 wherein, in Formula 501, $Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together.

In an embodiment, xd4 in Formula 501 may be 2.

In an embodiment, the fluorescent dopant may include: at least one of compounds FD1 to FD36; DPVBi; DPAVBi; or any combination thereof:

FD1

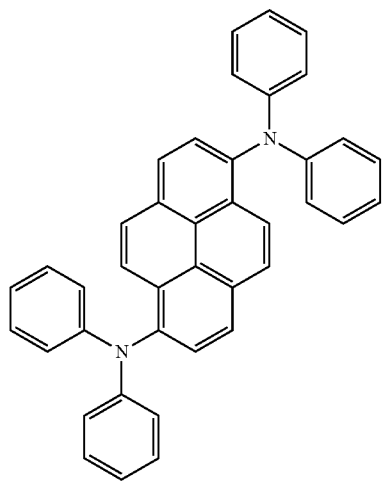

FD2

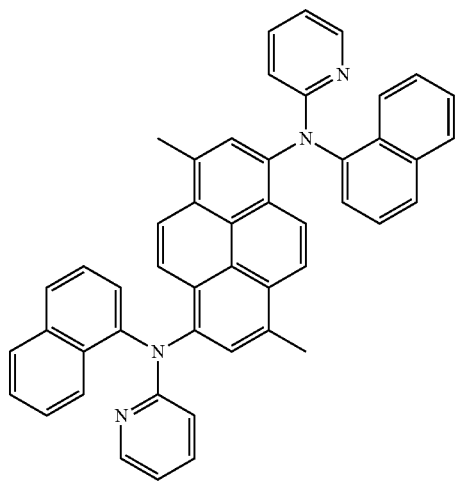

FD3 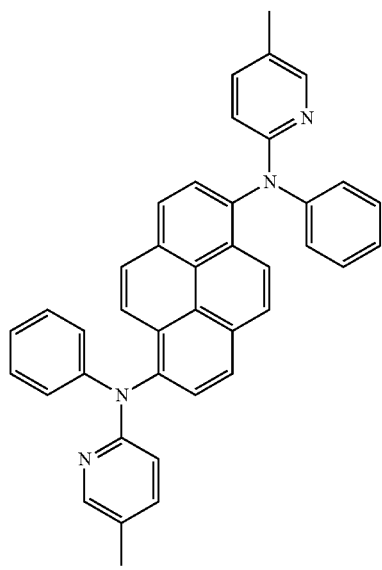
FD4 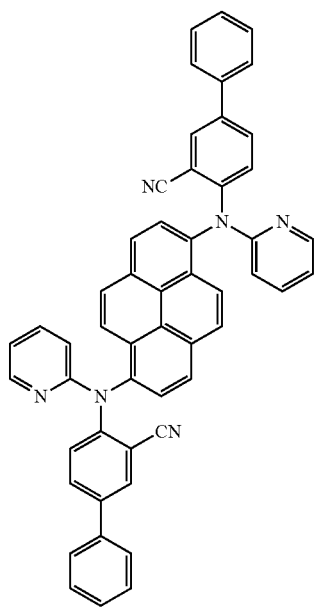
FD5 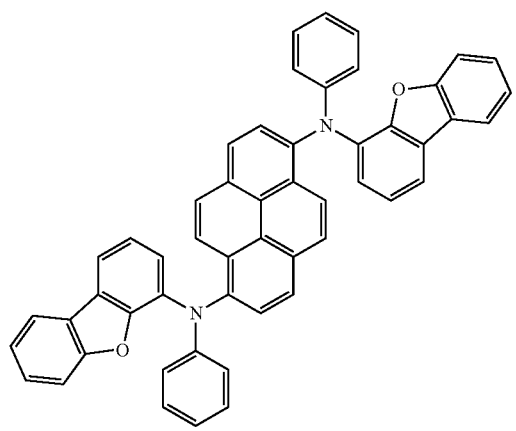
FD6 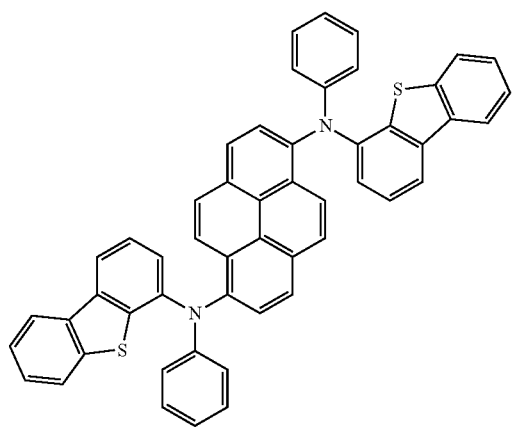
FD7 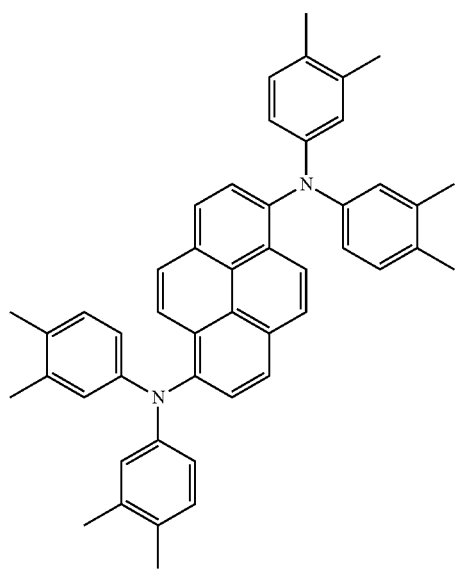
FD8 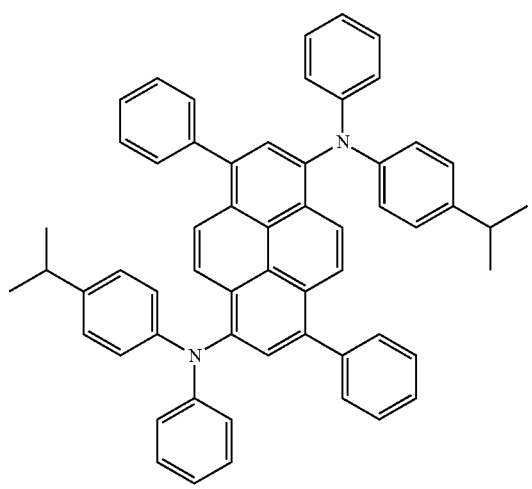

-continued
FD9
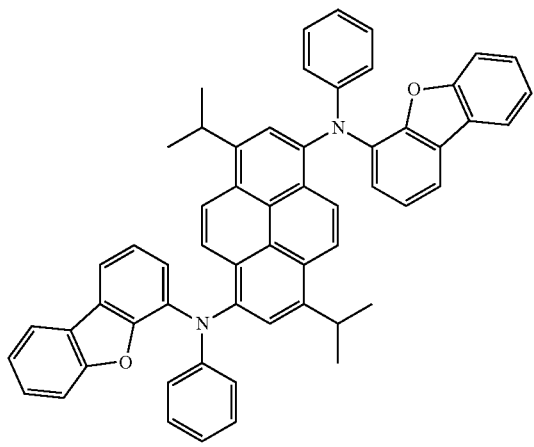
FD10
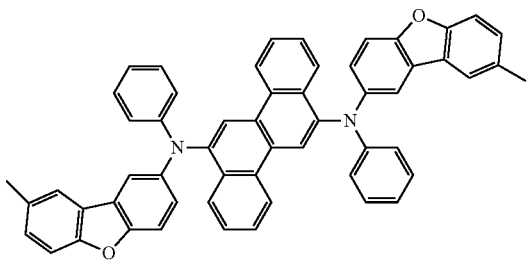
FD11
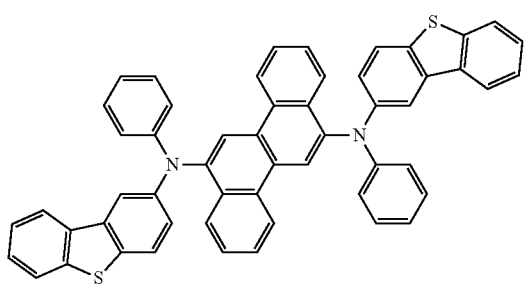
FD12
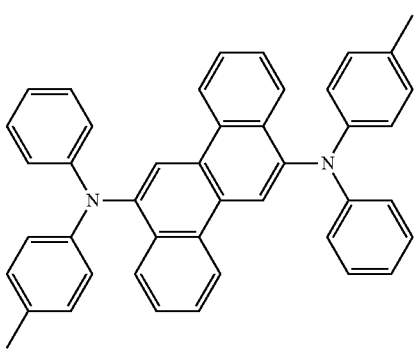
FD13
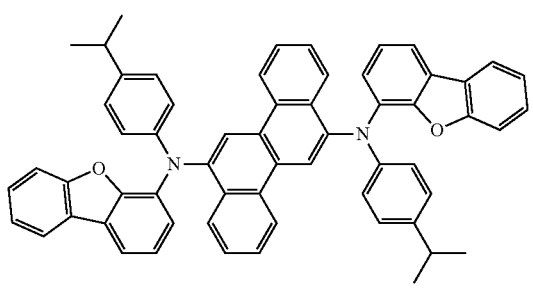
FD14
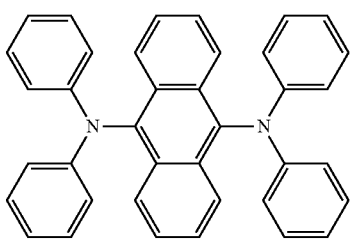
FD15
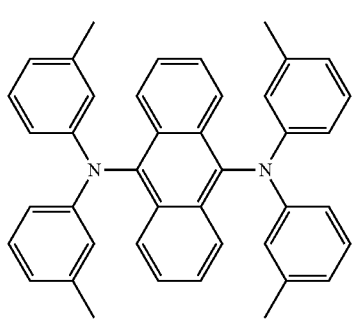
FD16
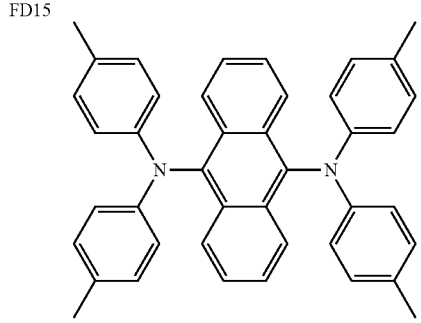

-continued
FD17
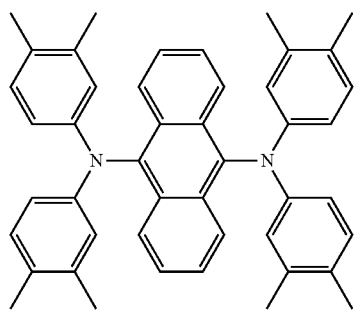
FD18
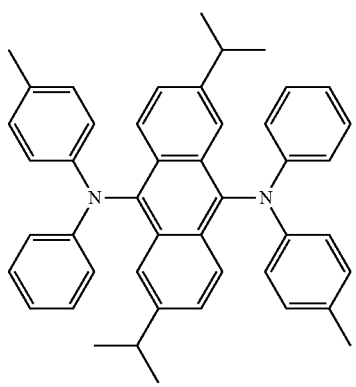
FD19
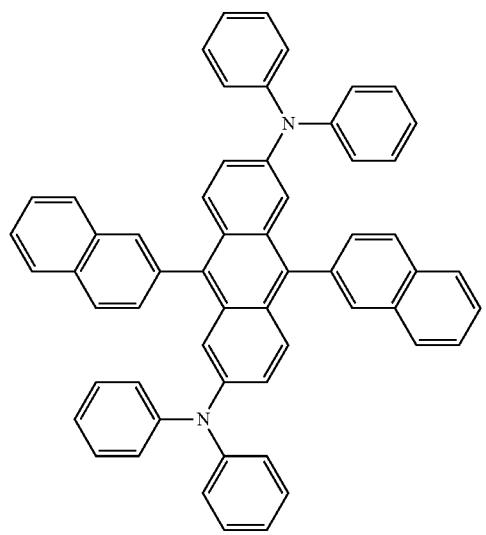
FD20
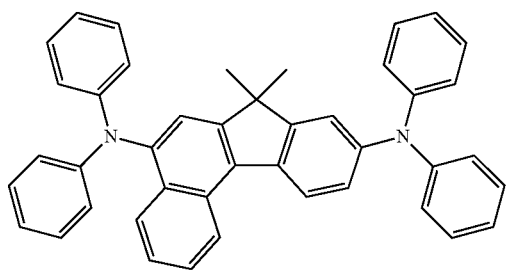
FD21
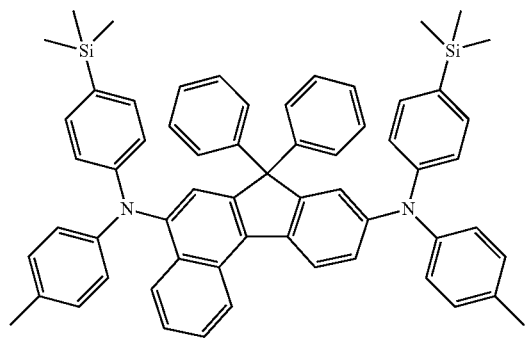
FD22
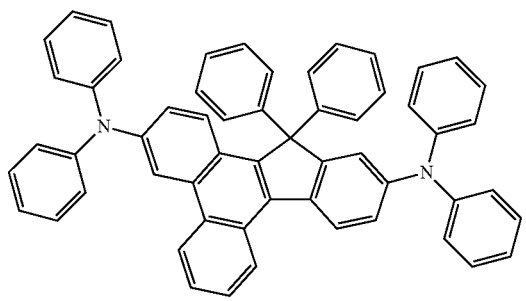
FD23
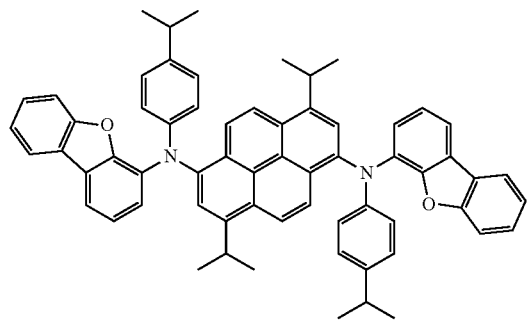
FD24
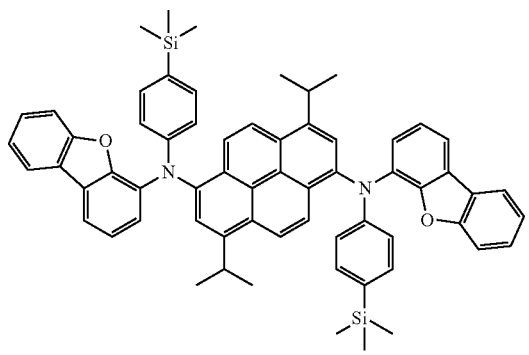

-continued
FD25
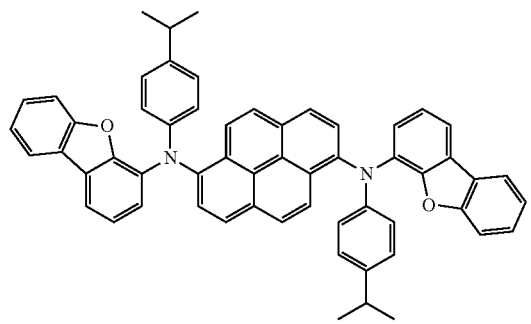
FD26
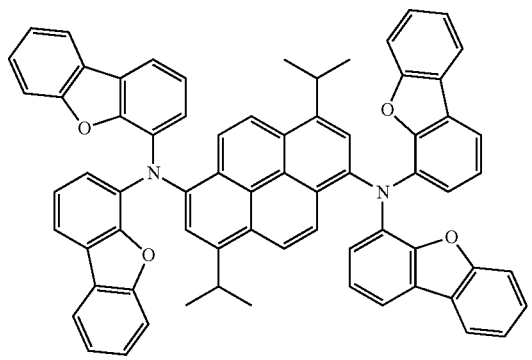
FD27
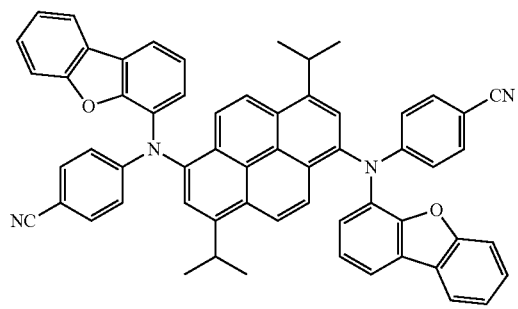
FD28
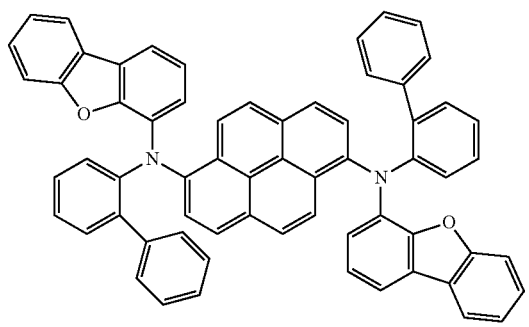
FD29
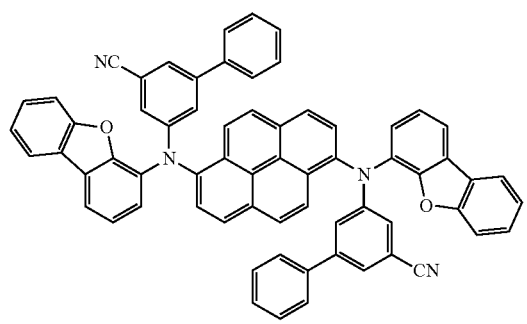
FD30
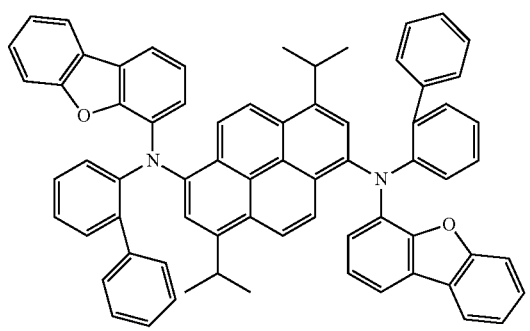
FD31
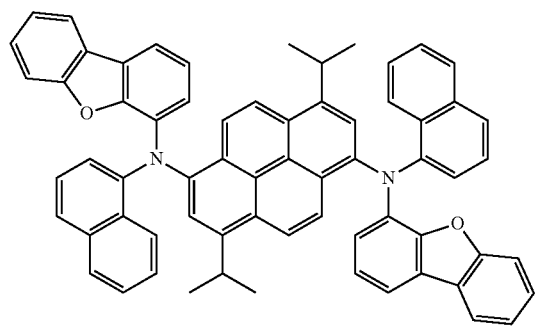
FD32
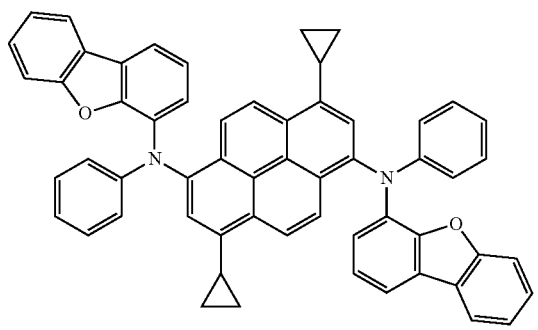

FD33
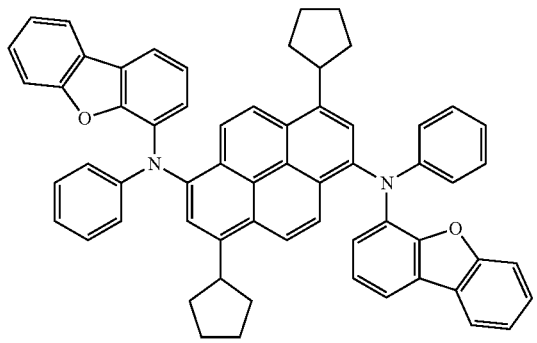

FD34
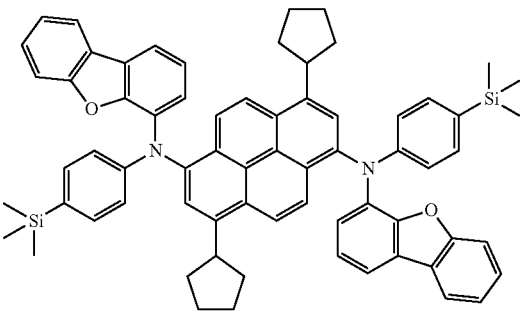

FD35
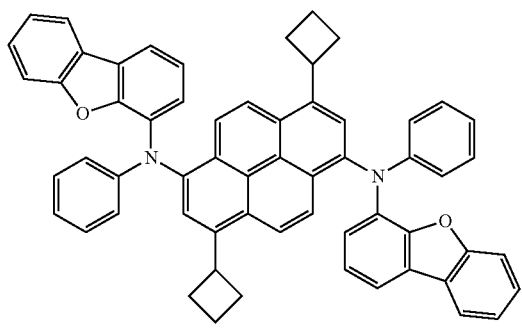

FD36
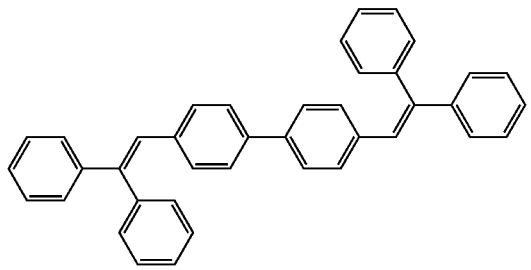

DPVBi

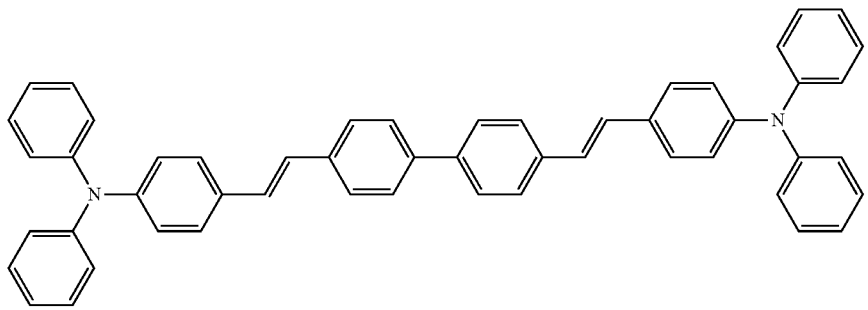

DPAVBi

Delayed Fluorescence Material

The emission layer may include a delayed fluorescence material.

In the present specification, the delayed fluorescence material may be selected from compounds capable of emitting delayed fluorescence based on a delayed fluorescence emission mechanism.

The delayed fluorescence material included in the emission layer may act (e.g., serve) as a host or a dopant depending on the type or kind of other materials included in the emission layer.

In an embodiment, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescence material and the singlet energy level (eV) of the delayed fluorescence material satisfies the above-described range, up-conversion from the triplet state to the singlet state of the delayed fluorescence materials may effectively occur, and thus, the luminescence efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, and/or a π electron-deficient nitrogen-containing $C_1$-$C_{60}$ cyclic group), and ii) a material including a $C_8$-$C_{60}$ polycyclic group in which two or more cyclic groups are condensed with each other while sharing boron (B).

Examples of the delayed fluorescence material may include at least one of the following Compounds DF1 to DF9:

DF1(DMAC-DPS)

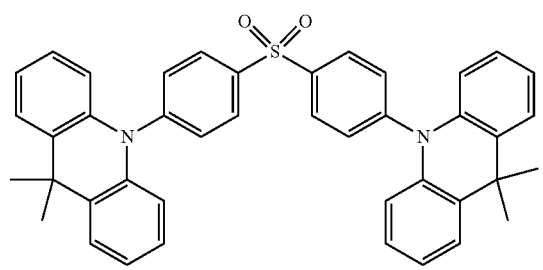

DF2(ACRFLCN)

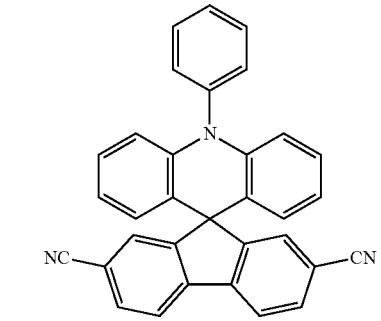

DF3(ACRSA)

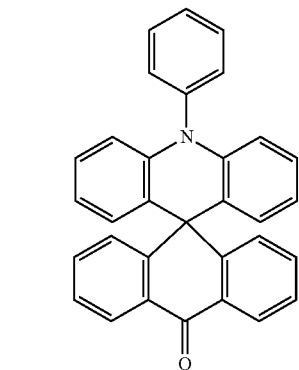

DF4(CC2TA)

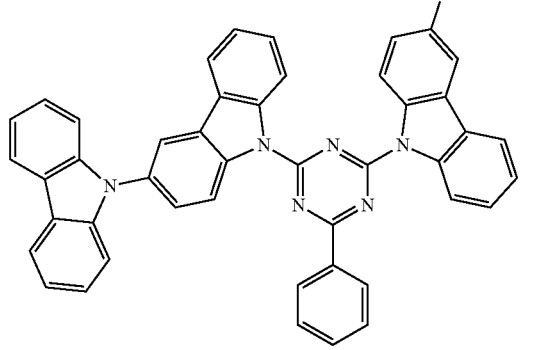

DF5(PIC-TRZ)

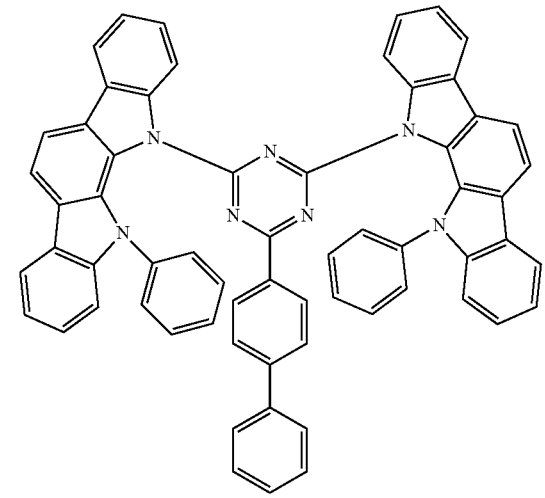

DF6(PIC-TRZ2)

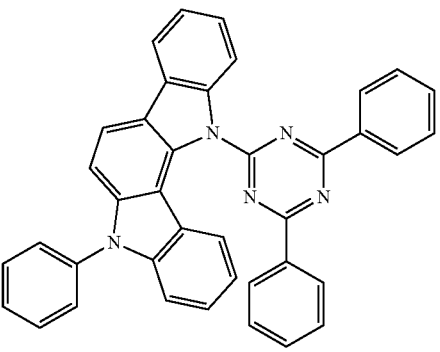

-continued

DF7(PXZ-TRZ)

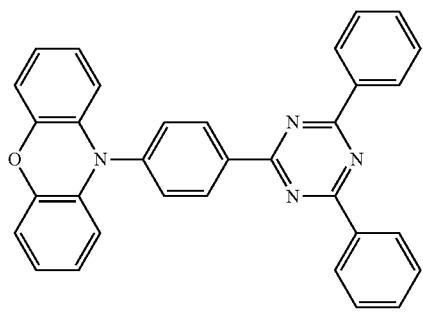

DF8(DABNA-1)

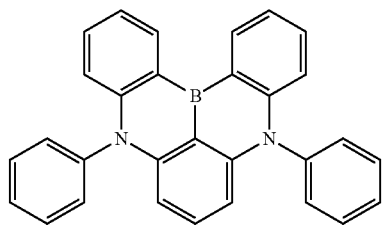

DF9(DABNA-2)

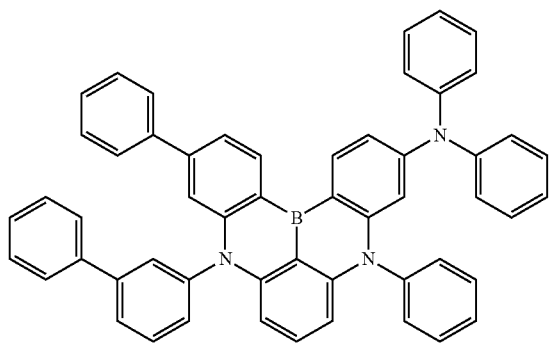

Electron Transport Region in Interlayer 130

The electron transport region may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron transport region may include a hole blocking layer, an electron transport layer, an electron injection layer, or any combination thereof.

In an embodiment, the electron transport region may have an electron transport layer/electron injection layer structure or a hole blocking layer/electron transport layer/electron injection layer structure, wherein, in each structure, constituting layers are sequentially stacked from the emission layer in the respective stated order.

The electron transport region (for example, the hole blocking layer and/or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

$$[Ar_{601}]_{xe11}-[(L_{601})_{xe11}-R_{601}]_{xe21}$$  Formula 601 wherein, in Formula 601, $Ar_{601}$ and $L_{601}$ may each independently be a $C_3$-$C_{60}$ carbocyclic group unsubstituted or substituted with at least one $R_{10a}$ or a $C_1$-$C_6$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ may each independently be the same as described in connection with $Q_1$, xe21 may be 1, 2, 3, 4, or 5, and at least one selected from $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, when xe11 in Formula 601 is 2 or more, two or more of $Ar_{601}$(s) may be linked via a single bond.

In an embodiment, $Ar_{601}$ in Formula 601 may be a substituted or unsubstituted anthracene group.

In an embodiment, the electron transport region may include a compound represented by Formula 601-1:

Formula 601-1

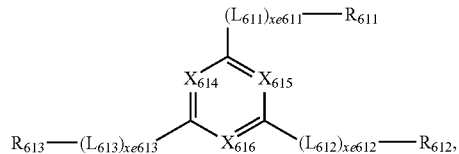

wherein, in Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ may each independently be the same as those described in connection with $L_{601}$, xe611 to xe613 may each independently be the same as those described in connection with xe1, $R_{611}$ to $R_{613}$ may each independently be the same as those described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formulae 601 and 601-1 may each independently be 0, 1, or 2.

The electron transport region may include at least one of compounds ET1 to ET45, 2,9-dimethyl-4,7-diphenyl-1,10-phenanthroline (BCP), 4,7-diphenyl-1,10-phenanthroline (Bphen), Alq3, BAlq, TAZ, NTAZ, or any combination thereof:

ET1
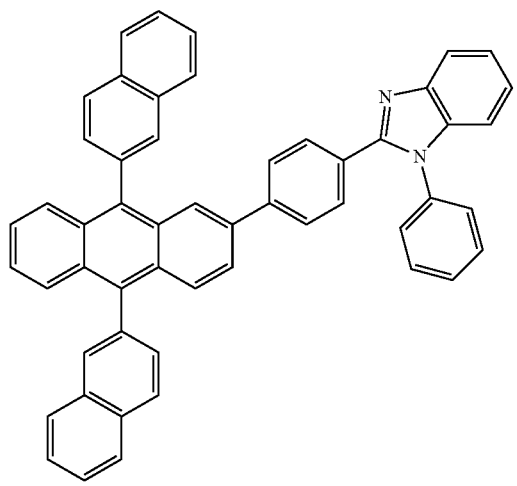
ET2
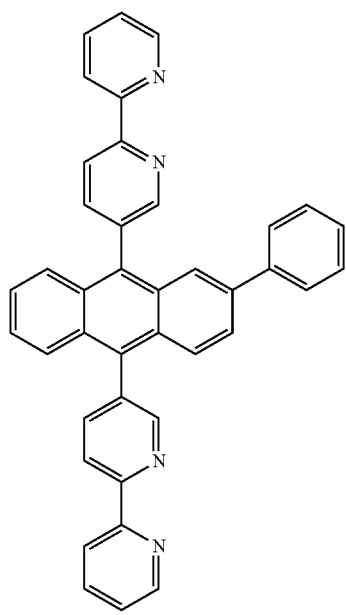
ET3
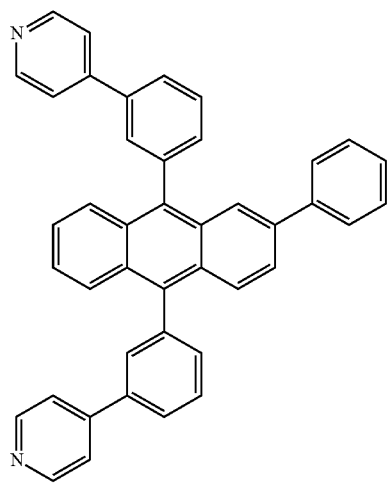
ET4
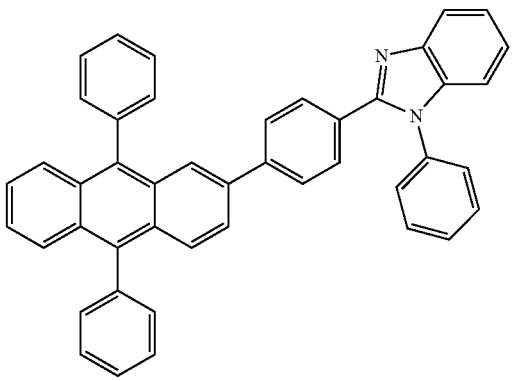
ET5
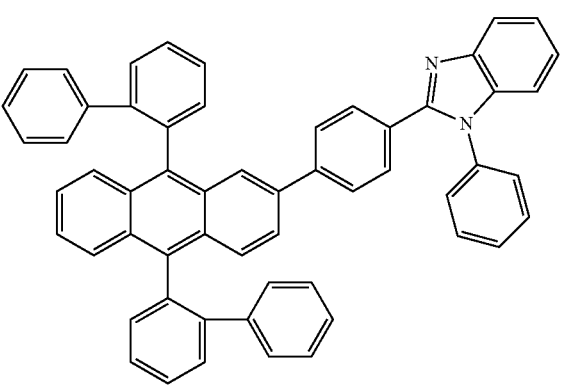
ET6
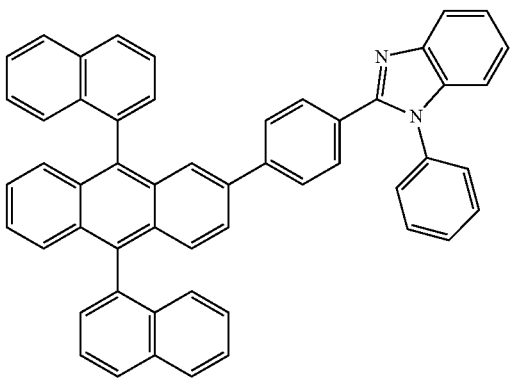

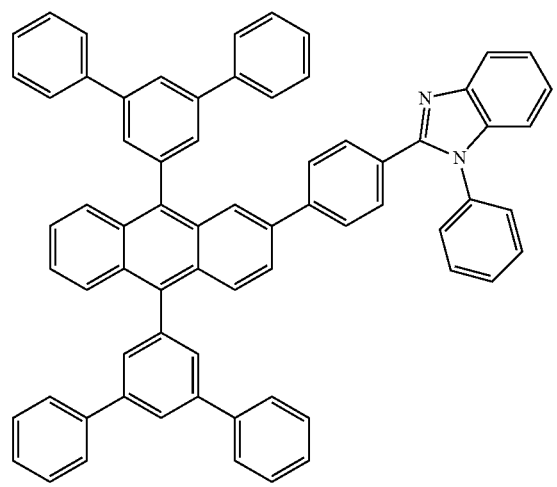
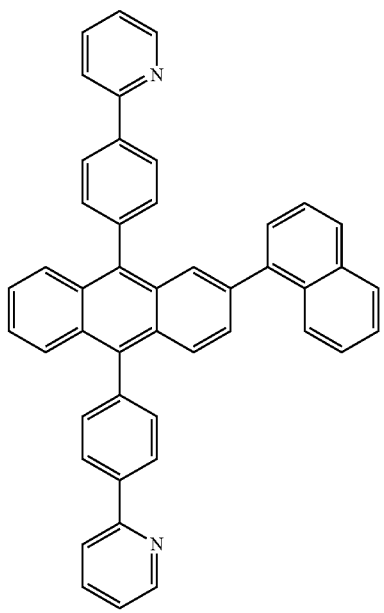
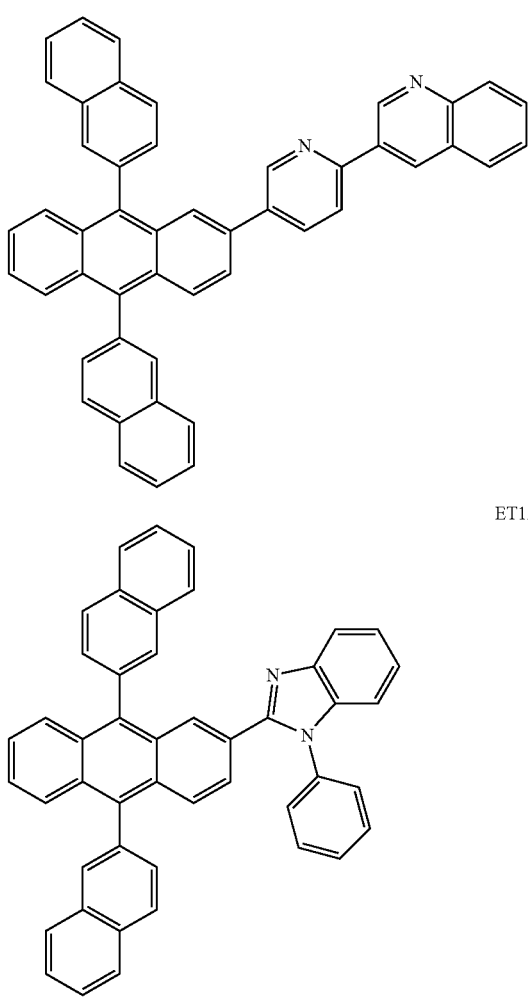

ET13
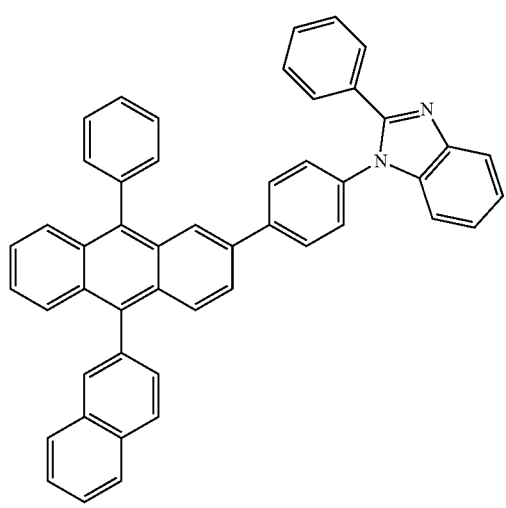
ET14
ET15
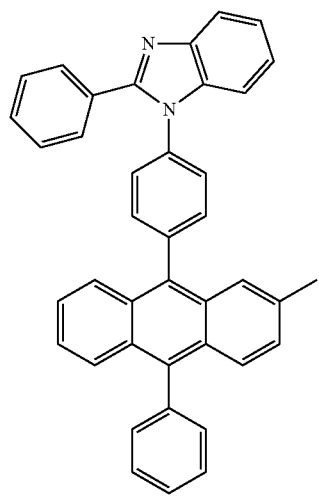
ET16
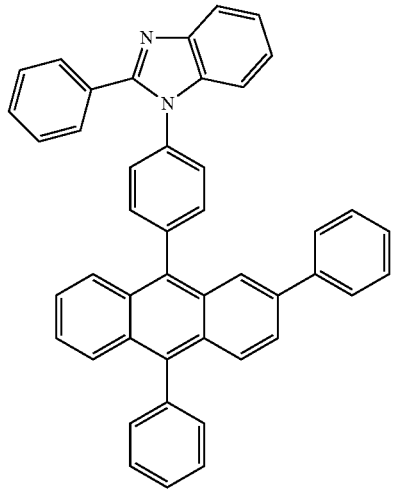
ET17
ET18
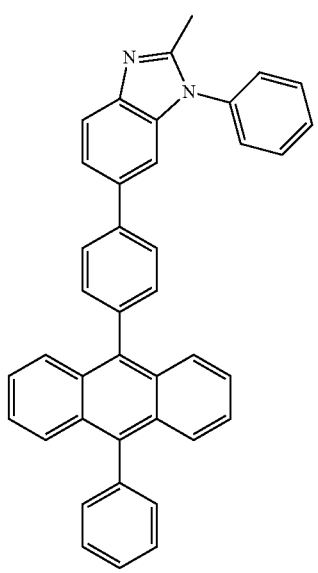

ET19
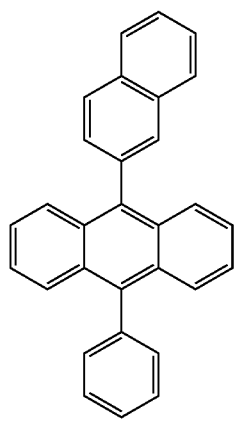
ET22
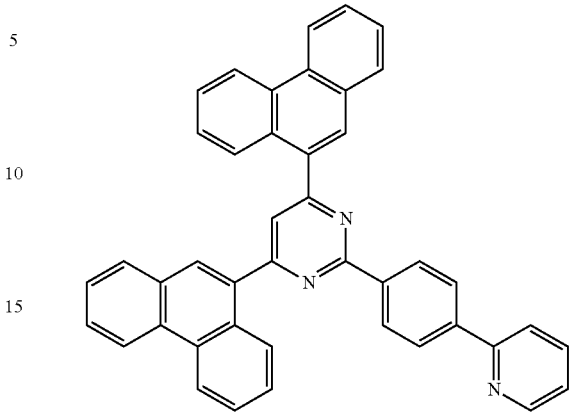
ET20
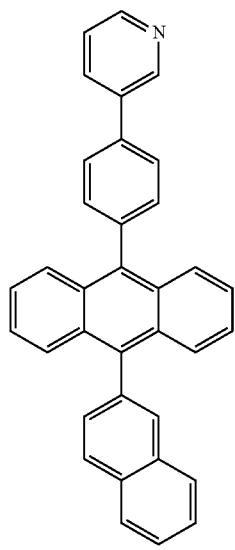
ET23
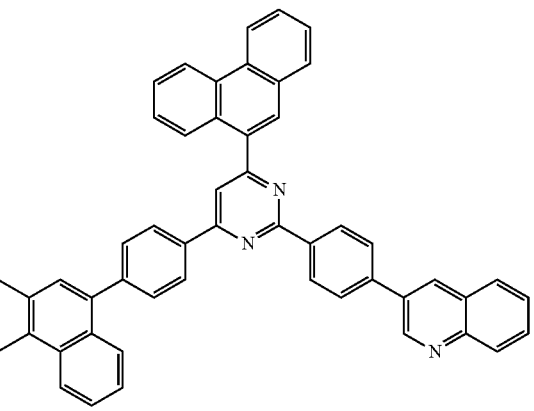
ET21
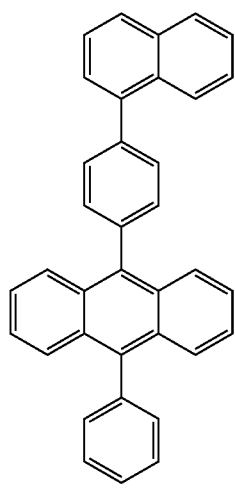
ET24
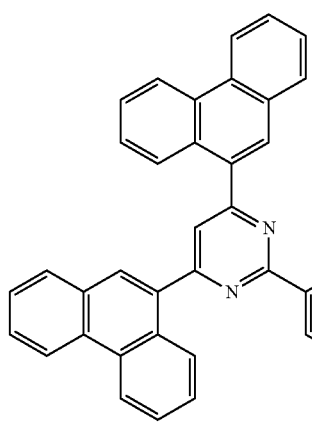

ET25
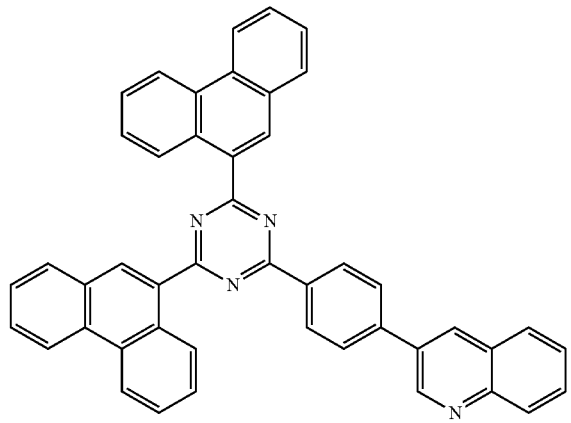
ET26
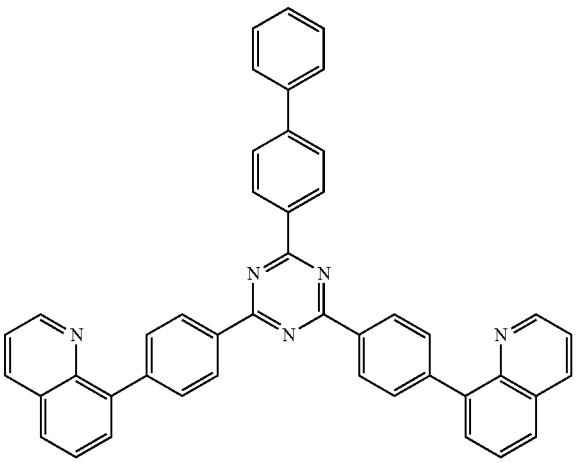
ET27
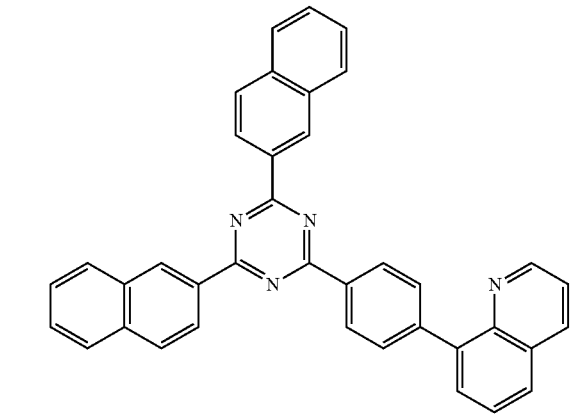
ET28
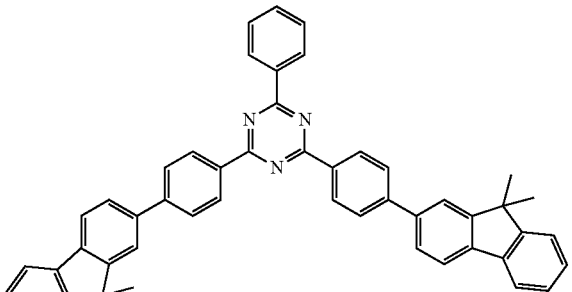
ET29
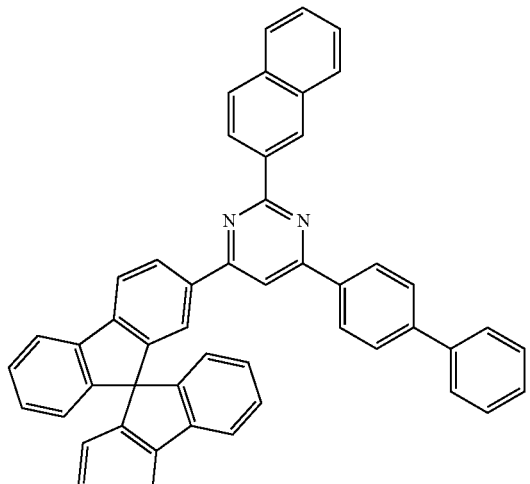
ET30
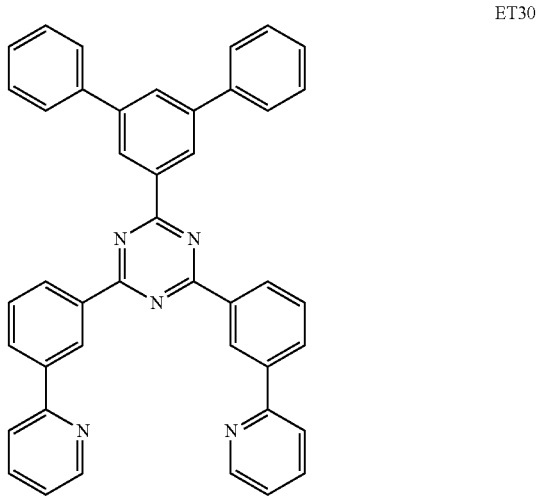

ET31
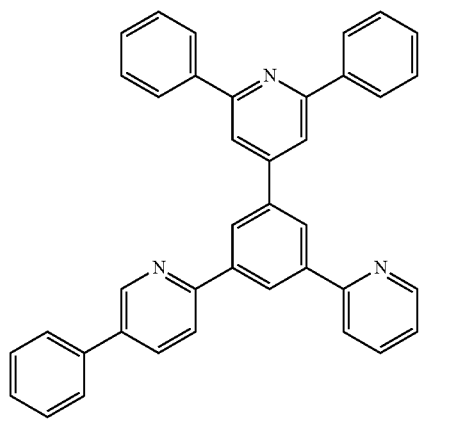
ET34
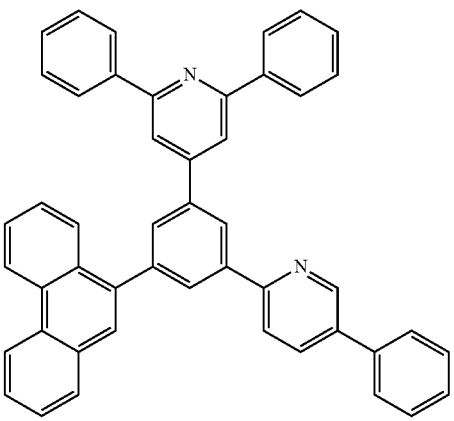
ET32
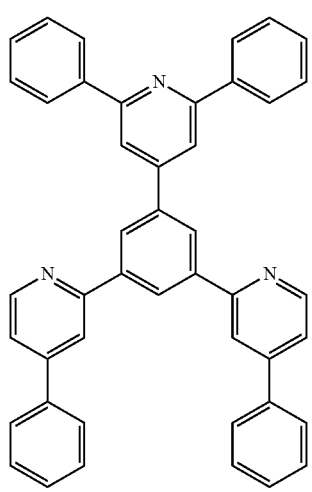
ET35
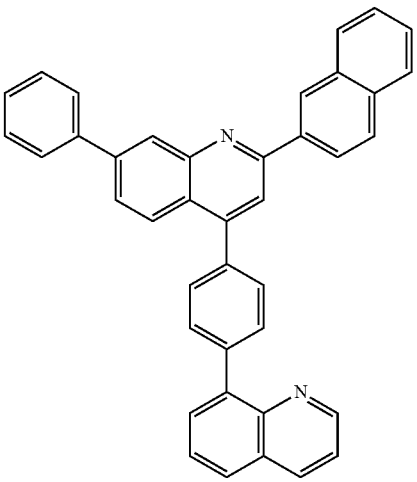
ET36
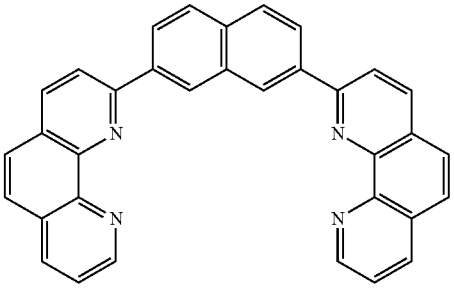
ET33
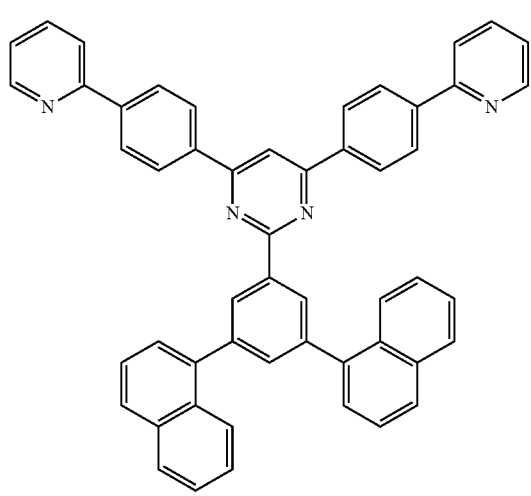
ET37
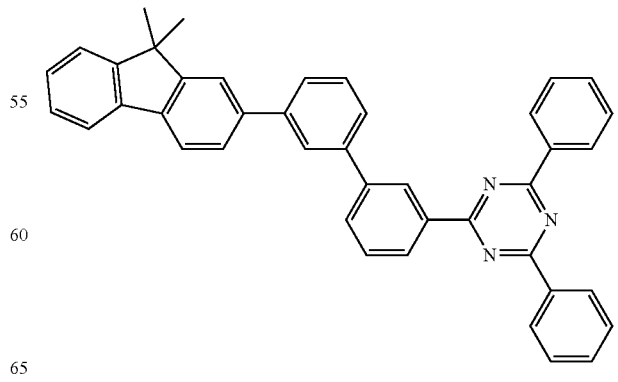

ET38
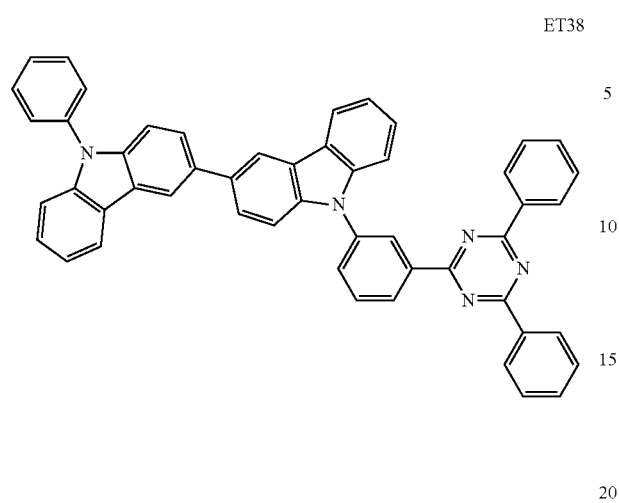
ET39
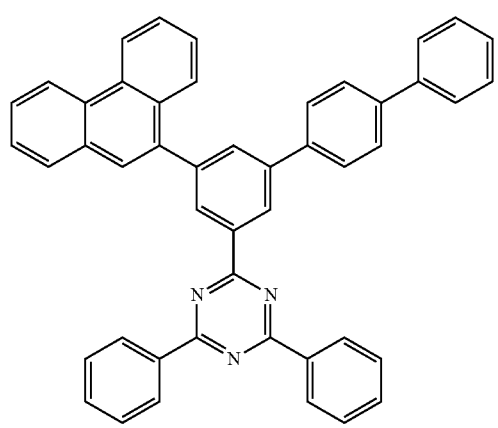
ET40
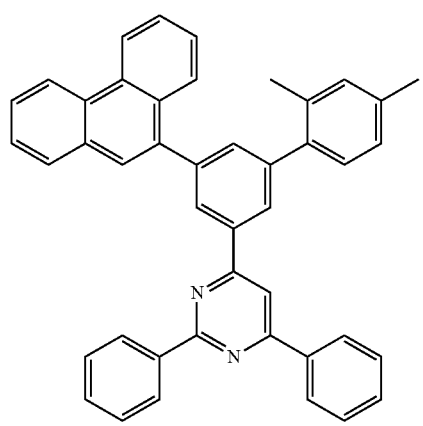
ET41
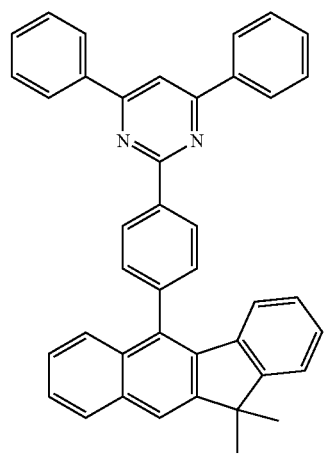
ET42
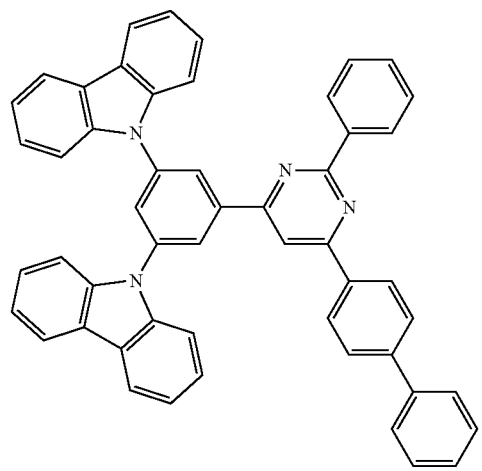
ET43
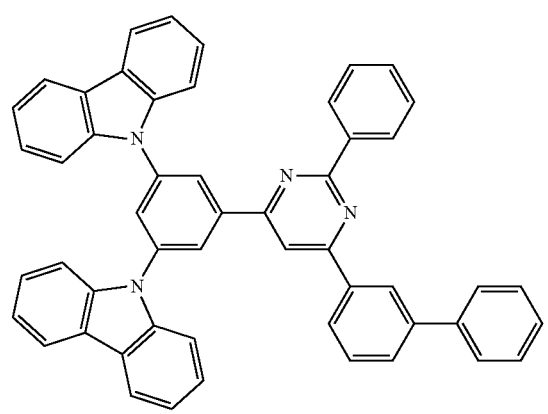

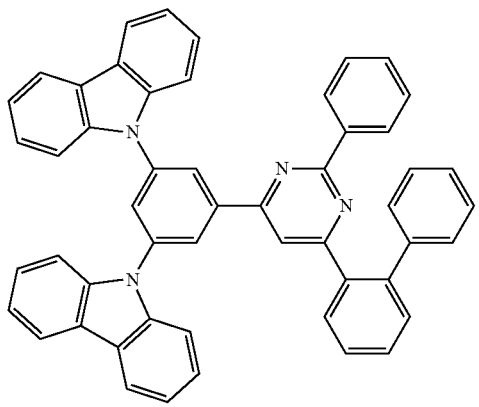
ET44

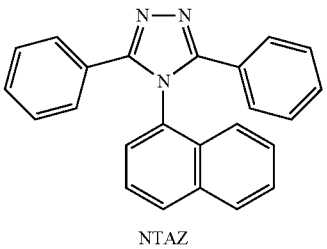
NTAZ

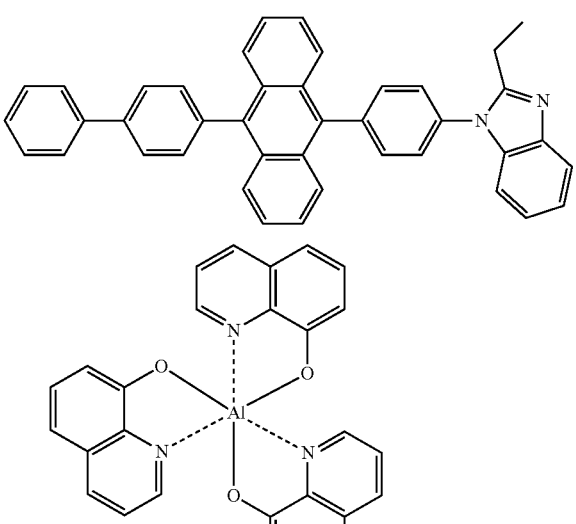
ET45

Alq₃

BAlq

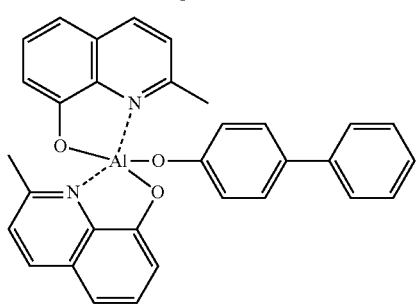
TAZ

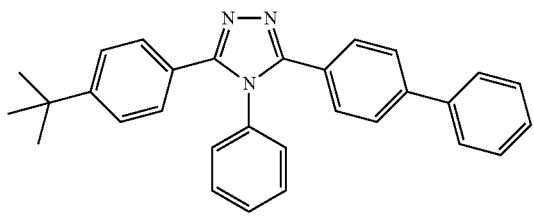

A thickness of the electron transport region may be from about 100 Å to about 5,000 Å, for example, about 160 Å to about 4,000 Å. When the electron transport region includes a hole blocking layer, an electron transport layer, or any combination thereof, thicknesses of the hole blocking layer and the electron transport layer may each independently be from about 20 Å to about 1,000 Å, for example, from about 30 Å to about 300 Å, and a thickness of the electron transport layer may be from about 100 Å to about 1,000 Å, for example, from about 150 Å to about 500 Å. When the thicknesses of the hole blocking layer and/or electron transport layer are within the ranges described above, satisfactory electron-transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, an alkaline earth metal complex, or any combination thereof. A metal ion of the alkali metal complex may be a Li ion, a Na ion, a K ion, a Rb ion, or a Cs ion, and a metal ion of the alkaline earth metal complex may be a Be ion, a Mg ion, a Ca ion, a Sr ion, or a Ba ion. A ligand coordinated with the metal ion of the alkali metal complex or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

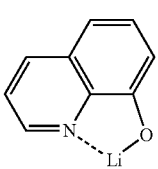
ET-D1

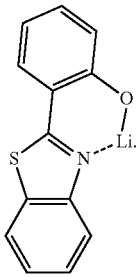

ET-D2

The electron transport region may include an electron injection layer that facilitates the injection of electrons from the second electrode 150. The electron injection layer may be in direct contact with the second electrode 150.

The electron injection layer may have: i) a single-layered structure consisting of a single layer consisting of a single material, ii) a single-layered structure consisting of a single layer including (e.g., consisting of) a plurality of different materials, or iii) a multi-layered structure including a plurality of layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may include one or more oxides, halides (for example, fluorides, chlorides, bromides, and/or iodides), and/or tellurides of the alkali metal, the alkaline earth metal, and the rare earth metal, or any combination thereof.

The alkali metal-containing compound may include one or more alkali metal oxides, such as $Li_2O$, $Cs_2O$, and/or $K_2O$, alkali metal halides, such as LiF, NaF, CsF, KF, LiI, NaI, CsI, and/or KI, or any combination thereof. The alkaline earth metal-containing compound may include an alkaline earth metal compound (e.g., oxide), such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and/or the like. The rare earth metal-containing compound (e.g., halide) may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenyl benzimidazole, a hydroxyphenylbenzothiazole, a bipyridine, a phenanthroline, a cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may include (e.g., consist of) i) an alkali metal-containing compound (for example, an alkali metal halide), or ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, and/or the like.

When the electron injection layer further includes an organic material, the alkali metal, the alkaline earth metal, the rare earth metal, the alkali metal-containing compound, the alkaline earth metal-containing compound, the rare earth metal-containing compound, the alkali metal complex, the alkaline earth-metal complex, the rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the ranges described above, satisfactory electron injection characteristics may be obtained without a substantial increase in driving voltage.

Second Electrode 150

The second electrode 150 may be located on the interlayer 130 having the above described structure. The second electrode 150 may be a cathode, which is an electron injection electrode, and as the material for the second electrode 150, a metal, an alloy, an electrically conductive compound, or any combination thereof, each having a low work function, may be utilized.

In an embodiment, the second electrode 150 may include lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 150 may be a transmissive electrode, a semi-transmissive electrode, or a reflective electrode.

The second electrode 150 may have a single-layered structure or a multi-layered structure including two or more layers.

Capping Layer

A first capping layer may be located outside the first electrode 110, and/or a second capping layer may be located outside the second electrode 150. In an embodiment, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in the emission layer of the interlayer 130 of the light-emitting device 10 may be extracted (e.g., emitted) toward the outside through the first electrode 110, which is a semi-transmissive electrode or a transmissive electrode, and the first capping layer and/or light generated in an emission layer of the interlayer 130 of the light-emitting device 10 may be extracted (e.g., emitted) toward the outside through the second electrode 150, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved.

Each of the first capping layer and second capping layer may include a material having a refractive index (at 589 nm) of 1.6 or more.

The first capping layer and the second capping layer may each independently be an organic capping layer including an organic material, an inorganic capping layer including an inorganic material, or an organic-inorganic composite capping layer including an organic material and an inorganic material.

At least one of the first capping layer or the second capping layer may each independently include one or more carbocyclic compounds, heterocyclic compounds, amine group-containing compounds, porphyrin derivatives, phthalocyanine derivatives, naphthalocyanine derivatives, alkali metal complexes, alkaline earth metal complexes, or any combination thereof. The carbocyclic compound, the heterocyclic compound, and/or the amine group-containing compound may be optionally substituted with a substituent containing O, N, S, Se, Si, F, Cl, Br, I, or any combination thereof. In an embodiment, at least one of the first capping layer or the second capping layer may each independently include an amine group-containing compound.

In an embodiment, at least one of the first capping layer or the second capping layer may each independently include a compound represented by Formula 201, a compound represented by Formula 202, or any combination thereof.

In an embodiment, at least one of the first capping layer or the second capping layer may each independently include at least one of compounds HT28 to HT33, at least one of compounds CP1 to CP6, β-NPB, or any combination thereof:

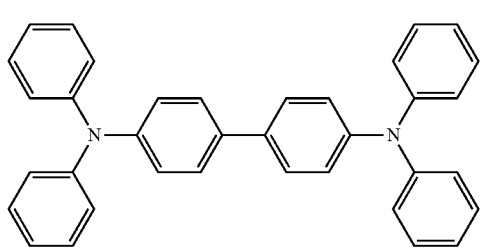

CP1

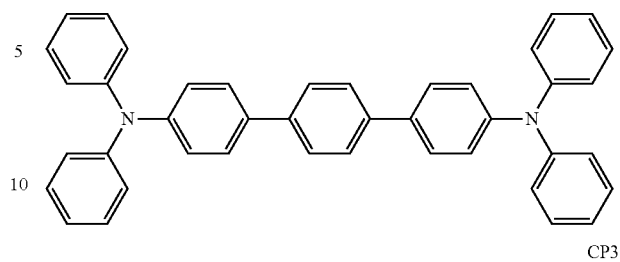

CP2

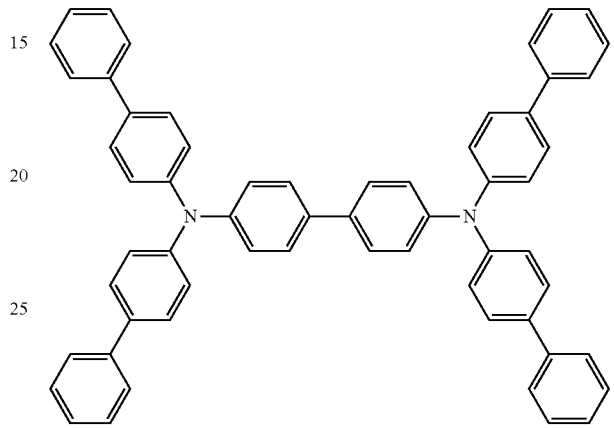

CP3

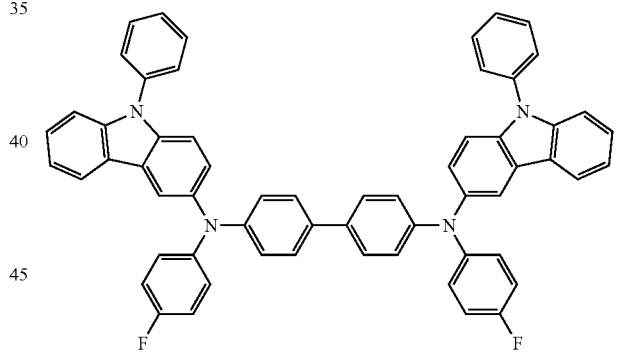

CP4

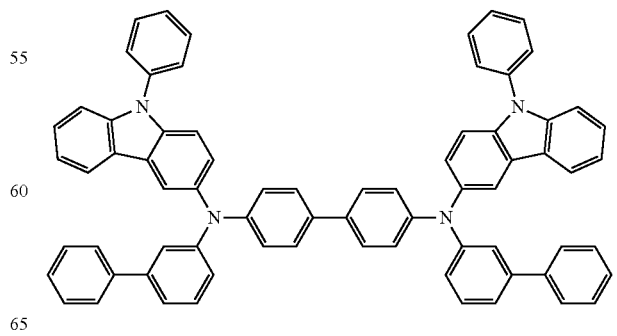

CP5

-continued

CP6

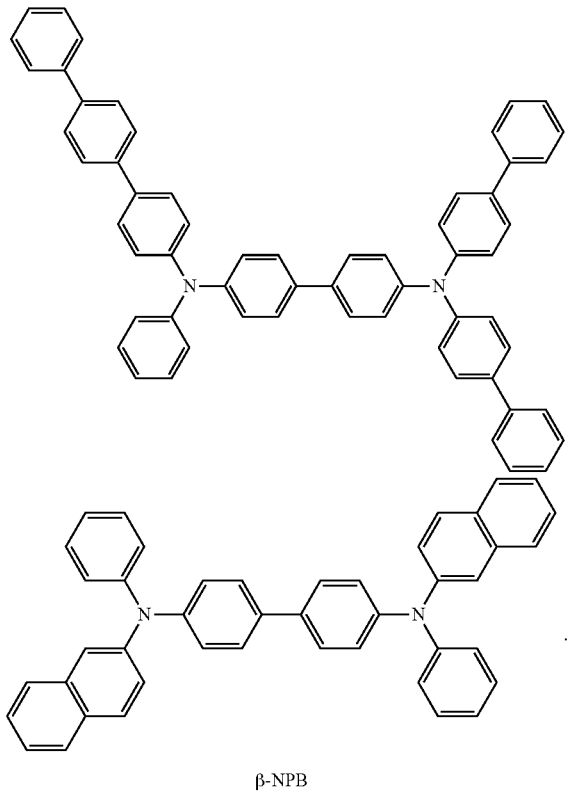

β-NPB

Electronic Apparatus

The light-emitting device may be included in one or more suitable electronic apparatuses. In an embodiment, the electronic apparatus including the light-emitting device may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. For example, the light emitted from the light-emitting device may be blue light or white light. The light-emitting device may be the same as described above. In an embodiment, the color conversion layer may include the quantum dot-containing complex according to an embodiment of the disclosure.

The electronic apparatus may include a first substrate. The first substrate may include a plurality of subpixel areas, the color filter may include a plurality of color filter areas respectively corresponding to the plurality of subpixel areas, and the color conversion layer may include a plurality of color conversion areas respectively corresponding to the plurality of subpixel areas.

A pixel-defining film may be located among (e.g., between) the plurality of subpixel areas to define each of the plurality of subpixel areas.

The color filter may further include a plurality of color filter areas and light-shielding patterns located among (e.g., between) the plurality of color filter areas, and the color conversion layer may include a plurality of color conversion areas and light-shielding patterns located among (e.g., between) the plurality of color conversion areas.

The plurality of color filter areas (or the plurality of color conversion areas) may include a first area emitting a first color light, a second area emitting a second color light, and/or a third area emitting a third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In one or more embodiments, the first area may include a red quantum dot, the second area may include a green quantum dot, and the third area may not include (e.g., may exclude) any quantum dots. The quantum dot is the same as described in the present specification. The first area, the second area, and/or the third area may each further include a scatterer.

In an embodiment, the light-emitting device may be to emit a first light, the first area may be to absorb the first light to emit a first first-color light, the second area may be to absorb the first light to emit a second first-color light, and the third area may be to absorb the first light to emit a third first-color light. In this regard, the first first-color light, the second first-color light, and the third first-color light may have different maximum emission wavelengths. In one or more embodiments, the first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an activation layer, wherein the source electrode or the drain electrode may be electrically connected to the first electrode or the second electrode of the light-emitting device.

The thin-film transistor may further include a gate electrode, a gate insulating film, etc.

The activation layer may include crystalline silicon, amorphous silicon, organic semiconductor, oxide semiconductor, and/or the like.

The electronic apparatus may further include a sealing portion for sealing the light-emitting device. The sealing portion and/or the color conversion layer may be located between the color filter and the light-emitting device. The sealing portion allows light from the light-emitting device to be extracted to the outside, while concurrently (e.g., simultaneously) preventing or reducing the penetration of ambient air and/or moisture into the light-emitting device. The sealing portion may be a sealing substrate including a transparent glass substrate and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally located on the sealing portion, in addition to the color filter and/or the color conversion layer, according to the usage of the electronic apparatus. The functional layers may include a touch screen layer, a polarizing layer, and/or the like. The touch screen layer may be a pressure-sensitive touch screen layer, a capacitive touch screen layer, or an infrared touch screen layer. The authentication apparatus may be, for example, a biometric authentication apparatus that authenticates an individual by utilizing biometric information of a living body (for example, fingertips, pupils, etc.).

The authentication apparatus may further include, in addition to the light-emitting device, a biometric information collector.

The electronic apparatus may be applied to one or more suitable displays, light sources, lighting, personal computers (for example, a mobile personal computer), mobile phones, digital cameras, electronic organizers (e.g., diaries), electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, one or more suitable measuring instruments, meters (for example, meters for a vehicle, an aircraft, and/or a vessel), projectors, and/or the like.

Figure 2:
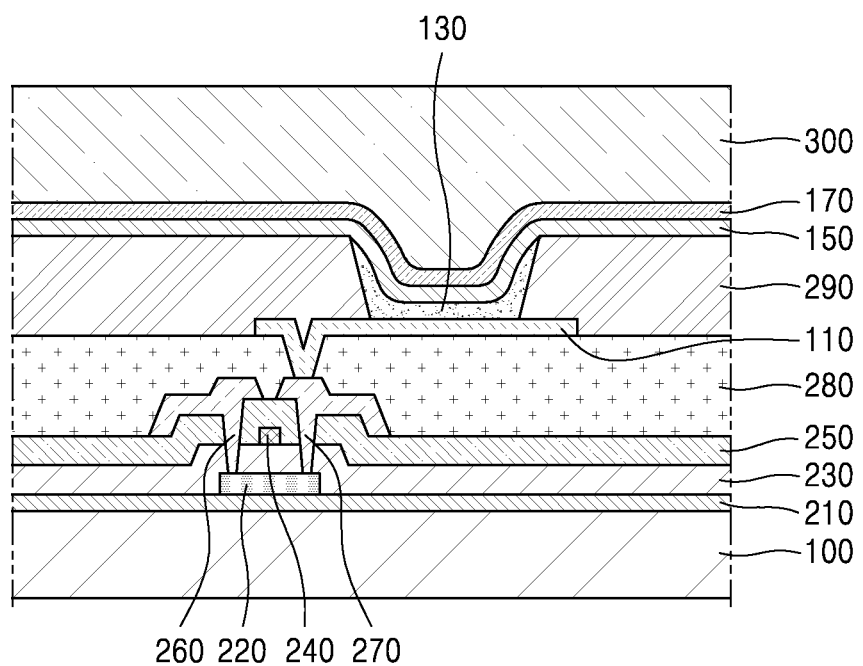
FIG. 2 is a cross-sectional view of a light-emitting apparatus according to an embodiment of the disclosure.
Figure 3:
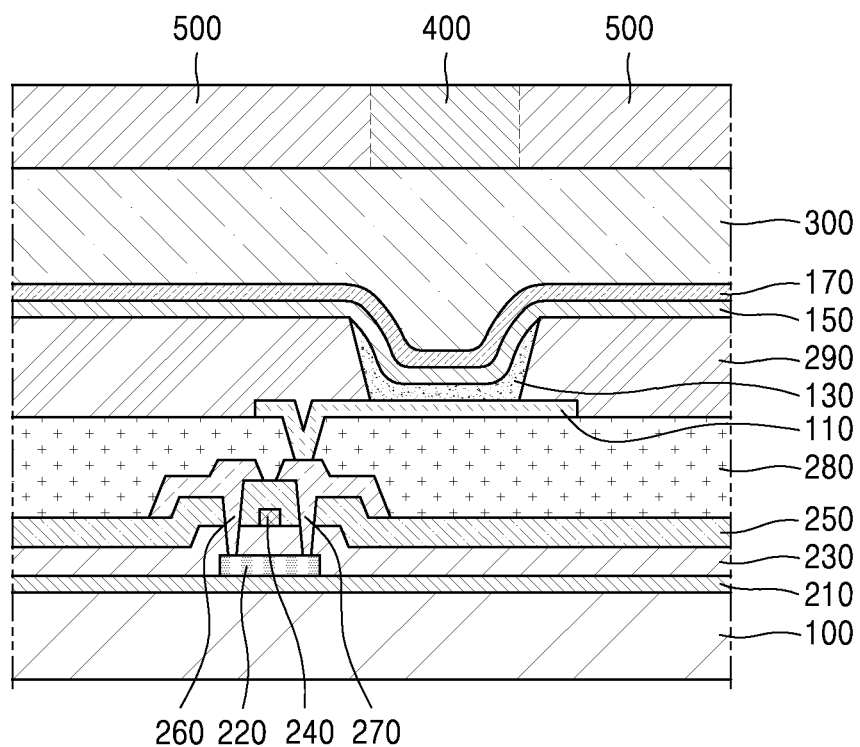
FIG. 3 is a cross-sectional view of a light-emitting apparatus according to another embodiment of the disclosure.

[Description of FIGS. 2 and 3]

FIG. 2 is a cross-sectional view of an electronic apparatus according to an embodiment of the disclosure.

The electronic apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be formed on the substrate 100. The buffer layer 210 may prevent or reduce penetration of impurities through the substrate 100 and may provide a flat surface on the substrate 100.

A TFT may be located on the buffer layer 210. The TFT may include an activation layer 220, a gate electrode 240, a source electrode 260, and a drain electrode 270.

The activation layer 220 may include an inorganic semiconductor such as silicon and/or polysilicon, an organic semiconductor, and/or an oxide semiconductor, and may include a source region, a drain region and a channel region.

A gate insulating film 230 for insulating the activation layer 220 from the gate electrode 240 may be located on the activation layer 220, and the gate electrode 240 may be located on the gate insulating film 230.

An interlayer insulating film 250 is located on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the activation layer 220, and the source electrode 260 and the drain electrode 270 may be in contact with the exposed portions of the source region and the drain region of the activation layer 220.

The TFT is electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 130, and a second electrode 150.

The first electrode 110 may be formed on the passivation layer 280. The passivation layer 280 does not completely cover the drain electrode 270 and exposes a portion of the drain electrode 270, and the first electrode 110 is connected to the exposed portion of the drain electrode 270.

A pixel-defining layer 290 containing an insulating material may be located on the first electrode 110. The pixel-defining layer 290 exposes a region of the first electrode 110, and an interlayer 130 may be formed in the exposed region of the first electrode 110. The pixel-defining layer 290 may be a polyimide and/or polyacrylic organic film. In one or more embodiments, at least some layers of the interlayer 130 may extend beyond the upper portion of the pixel-defining layer 290 to be located in the form of a common layer.

The second electrode 150 may be located on the interlayer 130, and a capping layer 170 may be additionally formed on the second electrode 150. The capping layer 170 may be formed to cover the second electrode 150.

The encapsulation portion 300 may be located on the capping layer 170. The encapsulation portion 300 may be located on a light-emitting device to protect the light-emitting device from moisture and/or oxygen. The encapsulation portion 300 may include: an inorganic film including silicon nitride (SiNx), silicon oxide (SiOx), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or a combination thereof; or a combination of the inorganic film and the organic film.

FIG. 3 is a cross-sectional view of an electronic apparatus according to an embodiment of the disclosure.

The electronic apparatus of FIG. 3 is the same as the electronic apparatus of FIG. 2, except that a light-shielding pattern 500 and a functional region 400 are additionally arranged on the encapsulation portion 300. The functional region 400 may be a combination of i) a color filter area, ii) a color conversion area, or iii) a combination of the color filter area and the color conversion area. In an embodiment, the light-emitting device included in the electronic apparatus of FIG. 3 may be a tandem light-emitting device.

Manufacture Method

Respective layers included in the hole transport region, the emission layer, and respective layers included in the electron transport region may be formed in a certain region by utilizing one or more suitable methods selected from vacuum deposition, spin coating, casting, Langmuir-Blodgett (LB) deposition, ink-jet printing, laser-printing, and laser-induced thermal imaging.

When layers constituting the hole transport region, the emission layer, and layers constituting the electron transport region are formed by vacuum deposition, the vacuum deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

When layers constituting the hole transport region, the emission layer, and layers constituting the electron transport region are formed by spin coating, the spin coating may be performed at a coating speed of about 2,000 rpm to about 5,000 rpm and at a heat treatment temperature of about 80° C. to 200° C. by taking into account a material to be included in a layer to be formed and the structure of a layer to be formed.

An ink composition according to one or more embodiments may include the quantum dot-containing complex, a monomer, a scatterer, and an initiator. An amount of the monomer may be in a range of about 70 parts by weight to about 150 parts by weight based on 100 parts by weight of the quantum dot-containing complex, an amount of the scatterer may be in a range of about 10 parts by weight to about 50 parts by weight based on 100 parts by weight of the quantum dot-containing complex, and an amount of the initiator may be in a range of about 0.1 parts by weight to about 10 parts by weight based on 100 parts by weight of the quantum dot-containing complex.

In an embodiment, the monomer may be an acrylate-based compound, and may be, for example 1,6-hexanediol diacrylate.

As the scatterer, any suitable particle that scatters light may be utilized. A size of the scatterer may be in a range of, for example, about 100 nm to about 300 nm. When the size thereof is less than about 100 nm or is greater than about 300 nm, the particle may not act (e.g., serve) as a scatterer.

The initiator may be a radical compound generally utilized for monomer polymerization.

The ink composition may be utilized in a solution process such as a spin coating method and/or an inkjet printing method, and when an amount of each component is within the ranges described above, the ink composition is suitable for the solution process.

General Definition of Substituents

The term "$C_3$-$C_{60}$ carbocyclic group" as used herein refers to a cyclic group consisting of only carbon atoms as a ring-forming atom and having three to sixty carbon atoms, and the term "$C_1$-$C_{60}$ heterocyclic group" as used herein refers to a cyclic group that has one to sixty carbon atoms and further has, in addition to carbon atoms, a heteroatom as a ring-forming atom. The $C_3$-$C_{60}$ carbocyclic group and the $C_1$-$C_{60}$ heterocyclic group may each be a monocyclic group consisting of one ring or a polycyclic group in which two or more rings are condensed with each other. In an embodiment, the $C_1$-$C_{60}$ heterocyclic group has 3 to 61 ring-forming atoms.

The term "cyclic group" as used herein may include the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π electron-deficient nitrogen-containing $C_1$-$C_{60}$ cyclic group" as used herein refers to a heterocyclic group that has one to sixty carbon atoms and includes *—N=*' as a ring-forming moiety.

In an embodiment,
the $C_3$-$C_{60}$ carbocyclic group may be i) group T1 or ii) a condensed cyclic group in which two or more groups T1 are condensed with each other (for example, the $C_3$-$C_{60}$ carbocyclic group may be a cyclopentadiene group, an adamantane group, a norbornane group, a benzene group, a pentalene group, a naphthalene group, an azulene group, an indacene group, an acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) group T2, ii) a condensed cyclic group in which two or more groups T2 are condensed with each other, or iii) a condensed cyclic group in which at least one group T2 and at least one group T1 are condensed with each other (for example, the $C_1$-$C_{60}$ heterocyclic group may be a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with each other, iii) group T3, iv) a condensed cyclic group in which two or more groups T3 are condensed with each other, or v) a condensed cyclic group in which at least one group T3 and at least one group T1 are condensed with each other (for example, the π electron-rich $C_3$-$C_{60}$ cyclic group may be the $C_3$-$C_{60}$ carbocyclic group, a 1H-pyrrole group, a silole group, a borole group, a 2H-pyrrole group, a 3H-pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more group T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with one another (for example, the π electron-deficient nitrogen-containing $C_1$-$C_{60}$ cyclic group may be a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, a tetrazine group, a pyrrolidine group, an imidazolidine group, a dihydropyrrole group, a piperidine group, a tetrahydropyridine group, a dihydropyridine group, a hexahydropyrimidine group, a tetrahydropyrimidine group, a dihydropyrimidine group, a piperazine group, a tetrahydropyrazine group, a dihydropyrazine group, a tetrahydropyridazine group, or a dihydropyridazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "cyclic group", "$C_3$-$C_{60}$ carbocyclic group", "$C_1$-$C_{60}$ heterocyclic group", "π electron-rich $C_3$-$C_{60}$ cyclic group", or "π electron-deficient nitrogen-containing $C_1$-$C_{60}$ cyclic group" as used herein may each refer to a group condensed to any cyclic group, a monovalent group, or a polyvalent group (for example, a divalent group, a trivalent group, a tetravalent group, etc.), depending on the structure of a formula in connection with which the terms are used. In an embodiment, "a benzene group" may be a benzo group, a phenyl group, a phenylene group, or the like, which may be easily understood by one of ordinary skill in the art according to the structure of a formula including the "benzene group."

In an embodiment, examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_6$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group" as used herein refers to a linear or branched aliphatic hydrocarbon saturated monovalent group that has one to sixty carbon atoms, and examples thereof may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_6$ alkyl group.

The term "$C_2$-$C_{60}$ alkenyl group" as used herein refers to a monovalent hydrocarbon group having at least one carbon-carbon double bond in the middle or at a terminal end (e.g., the terminus) of the $C_2$-$C_{60}$ alkyl group, and examples thereof may include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at a terminal end (e.g., the terminus) of the $C_2$-$C_{60}$ alkyl group, and examples thereof may include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{11}$ is the $C_1$-$C_{60}$ alkyl group), and examples thereof may include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof may include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to 1 to 10 carbon atoms, at least one heteroatom as a ring-forming atom, and examples thereof may include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has three to ten carbon atoms and at least one carbon-carbon double bond in the ring thereof and no aromaticity, and examples thereof may include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to 1 to 10 carbon atoms, at least one heteroatom as a ring-forming atom, and at least one double bond (e.g., carbon-carbon double bond) in the cyclic structure thereof. Examples of the $C_1$-$C_{10}$ heterocycloalkenyl group may include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having six to sixty carbon atoms, and the term "$C_6$-$C_{60}$ arylene group" as used herein refers to a divalent group having a carbocyclic aromatic system having six to sixty carbon atoms. Examples of the $C_6$-$C_{60}$ aryl group may include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, a fluorenyl group, and an ovalenyl group. When the $C_6$-$C_{60}$ aryl group and the $C_6$-$C_{60}$ arylene group each independently include two or more rings, the two or more rings may be condensed with each other.

The term "$C_1$-$C_{60}$ heteroaryl group" as used herein refers to a monovalent group having a heterocyclic aromatic system that has, in addition to 1 to 60 carbon atoms, at least one heteroatom as a ring-forming atom. The term "$C_1$-$C_{60}$ heteroarylene group" as used herein refers to a divalent group having a heterocyclic aromatic system that has, in addition to 1 to 60 carbon atoms, at least one heteroatom as a ring-forming atom. Examples of the $C_1$-$C_{60}$ heteroaryl group may include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, a carbazolyl group, a dibenzofuranyl group, a dibenzothiofuranyl group, and a naphthyridinyl group. When the $C_1$-$C_6$ heteroaryl group and the $C_1$-$C_{60}$ heteroarylene group each include two or more rings, the rings may be condensed with each other.

The term "monovalent non-aromatic condensed polycyclic group" as used herein refers to a monovalent group having two or more rings condensed to each other, only carbon atoms (for example, having 8 to 60 carbon atoms) as ring-forming atoms, and non-aromaticity in its molecular structure when considered as a whole. Examples of the monovalent non-aromatic condensed polycyclic group may include an indenyl group, a fluorenyl group, a spiro-bifluorenyl group, a benzofluorenyl group, an indenophenanthrenyl group, an adamantyl group, and an indeno anthracenyl group. The term "divalent non-aromatic condensed polycyclic group" as used herein refers to a divalent group having the same structure as a monovalent non-aromatic condensed polycyclic group.

The term "monovalent non-aromatic condensed heteropolycyclic group" as used herein refers to a monovalent group having two or more rings condensed to each other, at least one heteroatom other than carbon atoms (for example, having 1 to 60 carbon atoms) as ring-forming atoms, and non-aromaticity in its molecular structure when considered as a whole. Examples of the monovalent non-aromatic condensed heteropolycyclic group include a pyrrolyl group, a thiophenyl group, a furanyl group, an indolyl group, a benzoindolyl group, a naphtho indolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, an azaadamantyl group, and a benzothienodibenzothiophenyl group. The term "divalent non-aromatic condensed heteropolycyclic group" as used herein refers to a divalent group having the same structure as a monovalent non-aromatic condensed heteropolycyclic group.

The term "$C_6$-$C_{60}$ aryloxy group" as used herein refers to a monovalent group represented by —$OA_{102}$ (wherein $A_{102}$ is the $C_6$-$C_{60}$ aryl group), and the term "$C_6$-$C_{60}$ arylthio group" as used herein refers to a monovalent group represented by —SA$_{103}$ (wherein A$_{103}$ is the C$_6$-C$_{60}$ aryl group).

The term "C$_7$-C$_{60}$ aryl alkyl group" as used herein refers to a monovalent group represented by -A$_{104}$A$_{105}$ (where A$_{104}$ may be a C$_1$-C$_{54}$ alkylene group, and A$_{105}$ may be a C$_6$-C$_{59}$ aryl group), and the term "C$_2$-C$_{60}$ heteroaryl alkyl group" as used herein refers to a monovalent group represented by -A$_{106}$A$_{107}$ (where A$_{106}$ may be a C$_1$-C$_{59}$ alkylene group, and A$_{107}$ may be a C$_1$-C$_{59}$ heteroaryl group).

R$_{10a}$ may be:

deuterium, —F, —Cl, —Br, —I, a hydroxyl group, a cyano group, or a nitro group;

a C$_1$-C$_{60}$ alkyl group, a C$_2$-C$_{60}$ alkenyl group, a C$_2$-C$_{60}$ alkynyl group, or a C$_1$-C$_{60}$ alkoxy group, each unsubstituted or substituted with deuterium, —F, —Cl, —Br, —I, a hydroxyl group, a cyano group, a nitro group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, a C$_7$-C$_{60}$ aryl alkyl group, a C$_2$-C$_{60}$ heteroaryl alkyl group, —Si(Q$_{11}$)(Q$_{12}$)(Q$_{13}$), —N(Q$_{11}$)(Q$_{12}$), —B(Q$_{11}$)(Q$_{12}$), —C(=O)(Q$_{11}$), —S(=O)$_2$(Q$_{11}$), —P(=O)(Q$_{11}$)(Q$_{12}$), or any combination thereof;

a C$_3$-C$_{60}$ carbocyclic group, a C$_1$-C$_6$ heterocyclic group, a C$_6$-C$_{60}$ aryloxy group, a C$_6$-C$_{60}$ arylthio group, a C$_7$-C$_{60}$ aryl alkyl group, or a C$_2$-C$_{60}$ heteroaryl alkyl group, each unsubstituted or substituted with deuterium, —F, —Cl, —Br, —I, a hydroxyl group, a cyano group, a nitro group, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_3$-C$_{60}$ carbocyclic group, a C$_1$-C$_{60}$ heterocyclic group, a C$_6$-C$_{60}$ aryloxy group, a C$_6$-C$_{60}$ arylthio group, a C$_7$-C$_{60}$ aryl alkyl group, a C$_2$-C$_{60}$ heteroaryl alkyl group, —Si(Q$_{21}$)(Q$_{22}$)(Q$_{23}$), —N(Q$_{21}$)(Q$_{22}$), —B(Q$_{21}$)(Q$_{22}$), —C(=O)(Q$_{21}$), —S(=O)$_2$(Q$_{21}$), —P(=O)(Q$_{21}$)(Q$_{22}$), or any combination thereof; or —Si(Q$_{31}$)(Q$_{32}$)(Q$_{33}$), —N(Q$_{31}$)(Q$_{32}$), —B(Q$_{31}$)(Q$_{32}$), —C(=O)(Q$_{31}$), —S(=O)$_2$(Q$_{31}$), or —P(=O)(Q$_{31}$)(Q$_{32}$).

Q$_1$ to Q$_3$, Q$_{11}$ to Q$_{13}$, Q$_{21}$ to Q$_{23}$, and Q$_{31}$ to Q$_{33}$ may each independently be: hydrogen; deuterium; —F; —Cl; —Br; —I; a hydroxyl group; a cyano group; a nitro group; a C$_1$-C$_6$ alkyl group; a C$_2$-C$_{60}$ alkenyl group; a C$_2$-C$_{60}$ alkynyl group; a C$_1$-C$_{60}$ alkoxy group; or a C$_3$-C$_{60}$ carbocyclic group, a C$_1$-C$_{60}$ heterocyclic group, a C$_7$-C$_{60}$ aryl alkyl group, or a C$_2$-C$_{60}$ heteroaryl alkyl group, each unsubstituted or substituted with deuterium, —F, a cyano group, a C$_1$-C$_{60}$ alkyl group, a C$_1$-C$_6$ alkoxy group, a phenyl group, a biphenyl group, or any combination thereof.

The term "hetero atom" as used herein refers to any atom other than a carbon atom. Examples of the heteroatom may include O, S, N, P, Si, B, Ge, Se, or any combination thereof.

The term "the third-row transition metal" as used herein may refer to hafnium (Hf), tantalum (Ta), tungsten (W), rhenium (Re), osmium (Os), iridium (Ir), platinum (Pt), gold (Au), and/or the like.

The term "Ph" as used herein refers to a phenyl group, the term "Me" as used herein refers to a methyl group, the term "Et" as used herein refers to an ethyl group, the term "tert-Bu" or "Bu$^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a C$_6$-C$_{60}$ aryl group as a substituent.

The term "terphenyl group" as used herein refers to "a phenyl group substituted with a biphenyl group". In other words, the "terphenyl group" is a substituted phenyl group having, as a substituent, a C$_6$-C$_{60}$ aryl group substituted with a C$_6$-C$_{60}$ aryl group.

The maximum number of carbon atoms in this substituent definition section is an example only. In an embodiment, the maximum carbon number of 60 in the C$_1$-C$_{60}$ alkyl group is an example, and the definition of the alkyl group equally applies to a C$_1$-C$_{20}$ alkyl group. The same also applies to other cases.

* and *' as used herein, unless defined otherwise, each refer to a binding site to a neighboring atom in a corresponding formula.

Hereinafter, a compound and light-emitting device according to an embodiment of the disclosure will be described in more detail with reference to the following examples.

EXAMPLES

Manufacture of Light-Emitting Device
Preparation of Quantum Dot-Containing Complex
(1) Quantum Dot-Containing Complex of Ligand 2,5,8,11,14-Pentaoxaheptadecan-17-Oic Acid 3 g of InP quantum dots coordinated with oleic acid was added to 100 mL of chloroform, followed by stirring at room temperature for an hour. Next, 0.9 g of 2,5,8,11,14-pentaoxaheptadecan-17-oic acid was added thereto, followed by stirring at 70° C. for 2 hours, and the quantum dot coordination ligand was thereby exchanged from oleic acid to 2,5,8,11,14-pentaoxaheptadecan-17-oic acid.

Next, 300 mL of n-hexane was added thereto, the result was subjected to centrifugation (9,500 rpm for 3 min), and a precipitate was vacuum-dried, to thereby prepare a quantum dot-containing complex.

(2) Quantum Dot-Containing Complex of Ligands 2,5,8,11,14-Pentaoxaheptadecan-17-Oic Acid and 3-(2-(2-Methoxyethoxy)Ethoxy)Propanoic Acid (1:1 Ligands Weight Ratio)

A quantum dot-containing complex was prepared in substantially the same manner as in (1), except that two ligands including 0.45 g of 2,5,8,11,14-pentaoxaheptadecan-17-oic acid and 0.45 g of 3-(2-(2-methoxyethoxy)ethoxy)propanoic acid were utilized instead of one ligand that is 0.9 g of 2,5,8,11,14-pentaoxaheptadecan-17-oic acid.

(3) Quantum Dot-Containing Complex of Ligands 2,5,8,11,14-Pentaoxaheptadecan-17-Oic Acid and Mono-2-(Acryloyloxy)Ethyl Succinate (1:1 Ligand Weight Ratio)

A quantum dot-containing complex was prepared in substantially the same manner as in (1), except that two ligands including 0.45 g of 2,5,8,11,14-pentaoxaheptadecan-17-oic acid and 0.45 g of mono-2-(acryloyloxy)ethyl succinate were utilized instead of one ligand that is 0.9 g of 2,5,8,11,14-pentaoxaheptadecan-17-oic acid.

(4) Quantum Dot-Containing Complex of Ligands 2,5,8,11,14-Pentaoxaheptadecan-17-Oic Acid and Mono-2-(Acryloyloxy)Ethyl Succinate (1:2 Ligand Weight Ratio)

A quantum dot-containing complex was prepared in substantially the same manner as in (1), except that two ligands including 0.3 g of 2,5,8,11,14-pentaoxaheptadecan-17-oic acid and 0.6 g of mono-2-(acryloyloxy)ethyl succinate were utilized instead of one ligand that is 0.9 g of 2,5,8,11,14-pentaoxaheptadecan-17-oic acid.

(5) Quantum Dot-Containing Complex of Ligands 2,5,8,11,14-Pentaoxaheptadecan-17-Oic Acid and Mono-2-(Acryloyloxy)Ethyl Succinate (1:4 Ligand Weight Ratio)

A quantum dot-containing complex was prepared in substantially the same manner as in (1), except that two ligands including 0.18 g of 2,5,8,11,14-pentaoxaheptadecan-17-oic acid and 0.72 g of mono-2-(acryloyloxy)ethyl succinate were utilized instead of one ligand that is 0.9 g of 2,5,8,11,14-pentaoxaheptadecan-17-oic acid.

(6) Quantum Dot-Containing Complex of Ligands 2,5,8,11,14-Pentaoxaheptadecan-17-Oic Acid and Mono-2-(Acryloyloxy)Ethyl Succinate (1:8 Ligand Weight Ratio)

A quantum dot-containing complex was prepared in substantially the same manner as in (1), except that two ligands including 0.1 g of 2,5,8,11,14-pentaoxaheptadecan-17-oic acid and 0.8 g of mono-2-(acryloyloxy)ethyl succinate were utilized instead of one ligand that is 0.9 g of 2,5,8,11,14-pentaoxaheptadecan-17-oic acid.

(7) Quantum Dot-Containing Complex of Ligands 2,5,8,11,14-Pentaoxaheptadecan-17-Oic Acid and Mono-2-(Acryloyloxy)Ethyl Succinate (6:4 Ligand Weight Ratio)

A quantum dot-containing complex was prepared in substantially the same manner as in (1), except that two ligands including 0.54 g of 2,5,8,11,14-pentaoxaheptadecan-17-oic acid and 0.36 g of mono-2-(acryloyloxy)ethyl succinate were utilized instead of one ligand that is 0.9 g of 2,5,8,11,14-pentaoxaheptadecan-17-oic acid.

(8) Quantum Dot-Containing Complex of Ligands 2,5,8,11,14-Pentaoxaheptadecan-17-Oic Acid and Mono-2-(Acryloyloxy)Ethyl Succinate (1:9 Ligand Weight Ratio)

A quantum dot-containing complex was prepared in substantially the same manner as in (1), except that two ligands including 0.09 g of 2,5,8,11,14-pentaoxaheptadecan-17-oic acid and 0.81 g of mono-2-(acryloyloxy)ethyl succinate were utilized instead of one ligand that is 0.9 g of 2,5,8,11,14-pentaoxaheptadecan-17-oic acid.

The aspect ratios and HLBs of the relevant ligands are as follows:

Aspect Ratio

Aspect ratio of oleic acid=3.0
Length=19.7 Å
Width=6.57 Å
Aspect ratio of 2,5,8,11,14-pentaoxaheptadecan-17-oic acid=6.8
Length=23 Å
Width=3.4 Å
Aspect ratio of 3-(2-(2-methoxyethoxy)ethoxy)propanoic acid=4.5
Length=15.4 Å
Width=3.4 Å
Aspect ratio of mono-2-(acryloyloxy)ethyl succinate=3.2
Length=15 Å
Width=4.7 Å

HLB

HLB of oleic acid=1.0
7+2.1[—COOH]—17×0.475[1 $CH_3$—, 2 =CH—, 14 —$CH_2$—]=1.0
HLB of 2,5,8,11,14-pentaoxaheptadecan-17-oic acid=10.4
7+2.1[—COOH]+5×1.3[3 —O—]—11×0.475[1 $CH_3$—, 10 —$CH_2$—]=10.4
HLB of 3-(2-(2-methoxyethoxy)ethoxy)propanoic acid=9.7
7+2.1[—COOH]+3×1.3[3 —O—]—7×0.475[1 $CH_3$—, 6 —$CH_2$—]=9.7
HLB of mono-2-(acryloyloxy)ethyl succinate=11.4
7+2.1[—COOH]+4×1.3[2 —O—, 2=O]—6×0.475[1 $CH_2$—, 1 =CH—, 4 —$CH_2$—]=11.4

Preparation of Ink Composition

Ink Composition (9)

0.5 g of the quantum dot-containing complex of (1) and 0.5 g of a monomer, 1,6-hexanediol diacrylate, were stirred at room temperature for 12 hours, and then 0.1 g of a scatterer, $TiO_2$, and 0.01 g of an initiator (TPO) were added thereto, followed by stirring for 3 hours, thereby preparing a quantum dot ink composition.

Ink Composition (10)

A quantum dot ink composition was prepared in substantially the same manner as in (9), except that 0.5 g of the quantum dot-containing complex of (2) was utilized.

Ink Composition (11)

A quantum dot ink composition was prepared in substantially the same manner as in (9), except that 0.5 g of the quantum dot-containing complex of (3) was utilized.

Ink Composition (12)

A quantum dot ink composition was prepared in substantially the same manner as in (9), except that 0.5 g of the quantum dot-containing complex of (4) was utilized.

Ink Composition (13)

A quantum dot ink composition was prepared in substantially the same manner as in (9), except that 0.5 g of the quantum dot-containing complex of (5) was utilized.

Ink Composition (14)

A quantum dot ink composition was prepared in substantially the same manner as in (9), except that 0.5 g of the quantum dot-containing complex of (6) was utilized.

Ink Composition (15)

A quantum dot ink composition was prepared in substantially the same manner as in (9), except that 0.5 g of the quantum dot-containing complex of (7) was utilized.

Ink Composition (16)

A quantum dot ink composition was prepared in substantially the same manner as in (9), except that 0.5 g of the quantum dot-containing complex of (8) was utilized.

The HLB value of the monomer, 1,6-hexanediol diacrylate, is 7.1.

Manufacture of Electronic Apparatus

Comparative Example 1

A color conversion layer having a thickness of 10 micrometers was formed by inkjet by utilizing the quantum dot ink composition of (9) in a color conversion area which is the functional region 400 on the encapsulation portion 300 as shown in FIG. 3, thereby manufacturing an electronic apparatus.

Comparative Example 2

An electronic apparatus was manufactured in substantially the same manner as in Comparative Example 1, except that a color conversion layer was formed by inkjet by utilizing the quantum dot ink composition of (10).

Example 1

An electronic apparatus was manufactured in substantially the same manner as in Comparative Example 1, except that a color conversion layer was formed by inkjet by utilizing the quantum dot ink composition of (11).

Example 2

An electronic apparatus was manufactured in substantially the same manner as in Comparative Example 1, except that a color conversion layer was formed by inkjet by utilizing the quantum dot ink composition of (12).

Example 3

An electronic apparatus was manufactured in substantially the same manner as in Comparative Example 1, except that a color conversion layer was formed by inkjet by utilizing the quantum dot ink composition of (13).

Example 4

An electronic apparatus was manufactured in substantially the same manner as in Comparative Example 1, except that a color conversion layer was formed by inkjet by utilizing the quantum dot ink composition of (14).

Comparative Example 3

An electronic apparatus was manufactured in substantially the same manner as in Comparative Example 1, except that a color conversion layer was formed by inkjet by utilizing the quantum dot ink composition of (15).

Comparative Example 4

An electronic apparatus was manufactured in substantially the same manner as in Comparative Example 1, except that a color conversion layer was formed by inkjet by utilizing the quantum dot ink composition of (16).

To evaluate characteristics of electronic apparatuses manufactured in Comparative Examples 1 to 4 and Examples 1 to 4, absorption rates and light conversion efficiency at a current density of 10 mA/cm$^2$ were measured, and results thereof are shown in Table 1.

The absorption rates and light conversion efficiency were measured by utilizing a measurement device 09920-2-12 manufactured by Hamamatsu Photonics Inc.

TABLE 1

|  | Ligand of quantum dot-containing complex | Absorption rate[1] | Light conversion efficiency[2] |
|---|---|---|---|
| Comparative Example 1 | 2,5,8,11,14-pentaoxaheptadecan-17-oic acid | 78.4% | 32.7% |
| Comparative Example 2 | 2,5,8,11,14-pentaoxaheptadecan-17-oic acid:3-(2-(2-methoxyethoxy)ethoxy)propanoic acid = 1:1 (weight ratio) | 76.0% | 27.0% |
| Example 1 | 2,5,8,11,14-pentaoxaheptadecan-17-oic acid:mono-2-(acryloyloxy)ethyl succinate = 1:1 (weight ratio) | 83.4% | 36.8% |
| Example 2 | 2,5,8,11,14-pentaoxaheptadecan-17-oic acid:mono-2-(acryloyloxy)ethyl succinate = 1:2 (weight ratio) | 81.5% | 36.4% |
| Example 3 | 2,5,8,11,14-pentaoxaheptadecan-17-oic acid:mono-2-(acryloyloxy)ethyl succinate = 1:4 (weight ratio) | 79.4% | 36.9% |
| Example 4 | 2,5,8,11,14-pentaoxaheptadecan-17-oic acid:mono-2-(acryloyloxy)ethyl succinate = 1:8 (weight ratio) | 78.2% | 35.6% |
| Comparative Example 3 | 2,5,8,11,14-pentaoxaheptadecan-17-oic acid:mono-2-(acryloyloxy)ethyl succinate = 6:4 (weight ratio) | 72.9% | 30.0% |
| Comparative Example 4 | 2,5,8,11,14-pentaoxaheptadecan-17-oic acid:mono-2-(acryloyloxy)ethyl succinate = 1:9 (weight ratio) | 74.1% | 29.5% |

[1] ratio at which a color conversion layer absorbs light of an organic light-emitting device
[2] ratio at which absorbed light is converted into light of a different wavelength From Table 1, it was confirmed that when compared with Comparative Examples 1 to 4, Examples 1 to 4 each showed better (excellent or suitable) absorption rates and light conversion efficiency.

The quantum dot-containing complex according to an embodiment has excellent or suitable absorption rate and excellent or suitable light conversion efficiency.

The use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic apparatus, the display device, and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the device may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope as defined by the following claims and equivalents thereof.

What is claimed is:

1. A quantum dot-containing complex comprising:
   a quantum dot; and
   a first ligand and a second ligand, each coordinate a surface of the quantum dot,
   wherein the first ligand is a hydrocarbon compound comprising a hydrophilic moiety and a lipophilic moiety and has an aspect ratio of 5 or greater,
   the second ligand is a hydrocarbon compound comprising a hydrophilic moiety and a lipophilic moiety and has an aspect ratio of 4 or less, and
   a hydrophile-lipophile balance (HLB) of the first ligand and an HLB of the second ligand are each independently 7 or greater,
   wherein the aspect ratio and HLB are calculated as following:
   aspect ratio=ligand length/ligand width
   Davies' Equation:

$$HLB = 7 + \sum_{i=1}^{m} H_i - n \times 0.475$$

wherein in Davies' Equation,
   m=number of hydrophilic moieties in a ligand molecule,
   $H_i$=coefficient of $i^{th}$ hydrophilic moiety, and
   n=number of lipophilic moieties in the ligand molecule.

2. The quantum dot-containing complex of claim 1, wherein the hydrophilic moiety comprises —SO$_4^-$Na$^+$, —COO$^-$K$^+$, —COO$^-$Na$^+$, tertiary amine, —COOH, —OH, —O—, =O, or any combination thereof.

3. The quantum dot-containing complex of claim 1, wherein the lipophilic moiety comprises

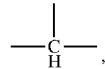

—CH$_2$—, CH$_3$—, =CH—, =CH$_2$, or any combination thereof.

4. The quantum dot-containing complex of claim 1, wherein a COOH moiety is comprised in the first ligand at a terminal end of the first ligand, and a COOH moiety is comprised in the second ligand at a terminal end of the second ligand.

5. The quantum dot-containing complex of claim 1, wherein the first ligand comprises two or more ethylene glycol moieties (OCH$_2$CH$_2$O).

6. The quantum dot-containing complex of claim 1, wherein the first ligand is 2,5,8,11,14-pentaoxaheptadecan-17-oic acid.

7. The quantum dot-containing complex of claim 1, wherein the second ligand is mono-2-(acryloyloxy)ethyl succinate.

8. The quantum dot-containing complex of claim 1, wherein a weight ratio of the first ligand to the second ligand is in a range of 5:4 to 1:8.

9. The quantum dot-containing complex of claim 1, wherein a ratio of a weight of the quantum dot to a total weight of the first ligand and the second ligand is in a range of 10:1 to 10:4.

10. The quantum dot-containing complex of claim 1, wherein
    the quantum dot has a core-shell structure or is a perovskite compound, and
    the core-shell structure comprises:
        a core comprising a crystal of a first semiconductor; and
        a shell comprising a crystal of a second semiconductor.

11. The quantum-dot containing complex of claim 10, wherein the first semiconductor and the second semiconductor each independently comprise a Group 12-Group 16-based compound, a Group 13-Group 15-based compound, a Group 14-Group 16-based compound, a Group 14-based compound, a Group 11-Group 13-Group 16-based compound, a Group 11-Group 12-Group 13-Group 16-based compound, or any combination thereof.

12. The quantum-dot containing complex of claim 10, wherein the first semiconductor and the second semiconductor each independently comprise:
    CdS, CdSe, CdTe, ZnS, ZnSe, ZnTe, ZnO, HgS, HgSe, HgTe, MgS, MgSe CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe CdZnSeS, CdZnSeTe, CdZnSTe, CdHgSeS, CdHgSeTe, CdHgSTe, HgZnSeS, HgZnSeTe, or HgZnSTe;
    GaN, GaP, GaAs, GaSb, AlN, AlP, AlAs, AlSb, InN, InP, InAs, InSb GaNP GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or InZnP;
    SnS, SnSe, SnTe, PbS, PbSe, PbTe SnSeS, SnSeTe, SnSTe, PbSeS, PbSeTe, PbSTe, SnPbS, SnPbSe, SnPbTe SnPbSSe, SnPbSeTe, or SnPbSTe;

Si, Ge, SiC, or SiGe;

AgInS, AgInS$_2$, CuInS, CuInS$_2$, CuGaO$_2$, AgGaO$_2$, or AgAlO$_2$; or any combination thereof.

13. The quantum-dot containing complex of claim 10, wherein the first semiconductor comprises GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the second semiconductor comprises CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe MgZnS, MgZnSe, CdZnSeS, CdZnSeTe, CdZnSTe, CdHgSeS, CdHgSeTe, CdHgSTe, HgZnSeS, HgZnSeTe, HgZnSTe, or any combination thereof.

14. An ink composition comprising:
the quantum dot-containing complex of claim 1,
a monomer,
a scatterer, and
an initiator.

15. The ink composition of claim 14, wherein the monomer is hydrophilic.

16. The ink composition of claim 14, wherein the monomer is an acrylate-based compound.

17. The ink composition of claim 14, wherein the monomer is 1,6-Hexanediol diacrylate.

18. A light-emitting device comprising:
a first electrode;
a second electrode facing the first electrode; and
an interlayer between the first electrode and the second electrode and comprising an emission layer,
wherein the emission layer comprises the quantum dot-containing complex of claim 1.

19. An electronic apparatus comprising the quantum dot-containing complex of claim 1.

20. The electronic apparatus of claim 19, further comprising a color filter and a color conversion layer,
wherein the color conversion layer comprises the quantum dot-containing complex.

* * * * *